US007770113B1

(12) United States Patent
Anderson et al.

(10) Patent No.: US 7,770,113 B1
(45) Date of Patent: Aug. 3, 2010

(54) SYSTEM AND METHOD FOR DYNAMICALLY GENERATING A CONFIGURATION DATASHEET

(75) Inventors: Douglas H. Anderson, Edmund, WA (US); Kenneth Y. Ogami, Bothell, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 771 days.

(21) Appl. No.: 09/994,600

(22) Filed: Nov. 19, 2001

(51) Int. Cl.
*G06N 3/00* (2006.01)

(52) U.S. Cl. ...................................................... 715/272

(58) Field of Classification Search ................. 715/500, 715/517, 513, 523, 530, 234, 235, 236, 237, 715/238, 239, 255, 272, 273; 700/121; 326/15; 716/17; 708/190
See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,810,036 A | 5/1974 | Bloedom |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Phillipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Phillipp |
| 4,475,151 A | 10/1984 | Phillipp |
| 4,497,575 A | 2/1985 | Phillipp |
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |

(Continued)

FOREIGN PATENT DOCUMENTS

DE 19710829 A1 9/1998

(Continued)

OTHER PUBLICATIONS

"New ObjectDomain R3 Beta Now Available (Build 134)!", Mar. 13, 2001, <http://web.archive.org/web/200100331202605/www.objectdomain.com/domain30/index.html>, pp. 1-2.*

(Continued)

*Primary Examiner*—Kyle R Stork

(57) ABSTRACT

A system and method for dynamically generating a project configuration datasheet. Module and device descriptions are stored in extensible markup language (XML) format. The IDE includes an XSL (extensible stylesheet language) stylesheet. The module and device descriptions are combined with parameterization information as prescribed by the XSL stylesheet to produce a project configuration report. The project configuration report may be formatted in hypertext markup language (HTML) and may be rendered as a visual datasheet by a browser.

22 Claims, 28 Drawing Sheets

U.S. PATENT DOCUMENTS

| | | |
|---|---|---|
| 4,701,907 A | 10/1987 | Collins |
| 4,727,541 A | 2/1988 | Mori et al. |
| 4,736,097 A | 4/1988 | Phillipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,809,345 A | 2/1989 | Tabata et al. |
| 4,812,684 A | 3/1989 | Yamagiwa et al. |
| 4,827,401 A | 5/1989 | Hrustich et al. |
| 4,833,418 A | 5/1989 | Quintus et al. |
| 4,868,525 A | 9/1989 | Dias |
| 4,876,534 A | 10/1989 | Mead et al. |
| 4,878,200 A | 10/1989 | Asghar et al. |
| 4,879,461 A | 11/1989 | Phillipp |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Phillipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Phillipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerphide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,336,936 A | 8/1994 | Allen et al. |
| 5,339,213 A | 8/1994 | O'Callaghan |
| 5,339,262 A | 8/1994 | Rostoker et al. |
| 5,341,267 A | 8/1994 | Whitten et al. |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Lewis et al. |
| 5,371,860 A | 12/1994 | Mura et al. |
| 5,371,878 A | 12/1994 | Coker |
| 5,374,787 A | 12/1994 | Miller et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |
| 5,426,384 A | 6/1995 | May |
| 5,428,319 A | 6/1995 | Marvin et al. |
| 5,430,395 A | 7/1995 | Ichimaru |
| 5,430,687 A | 7/1995 | Hung et al. |
| 5,430,734 A | 7/1995 | Gilson |
| 5,432,476 A | 7/1995 | Tran |
| 5,438,672 A | 8/1995 | Dey |

| | | | | | |
|---|---|---|---|---|---|
| 5,440,305 A | 8/1995 | Signore et al. | 5,642,295 A | 6/1997 | Smayling |
| 5,451,887 A | 9/1995 | El-Avat et al. | 5,646,544 A | 7/1997 | Iadanza |
| 5,455,525 A | 10/1995 | Ho et al. | 5,646,901 A | 7/1997 | Sharpe-Geisler et al. |
| 5,455,731 A | 10/1995 | Parkinson | 5,648,642 A | 7/1997 | Miller et al. |
| 5,455,927 A | 10/1995 | Huang | 5,651,035 A | 7/1997 | Tozun |
| 5,457,410 A | 10/1995 | Ting | 5,663,900 A | 9/1997 | Bhandari et al. |
| 5,457,479 A | 10/1995 | Cheng | 5,663,965 A | 9/1997 | Seymour |
| 5,463,591 A | 10/1995 | Aimoto et al. | 5,664,199 A | 9/1997 | Kuwahara |
| 5,479,603 A | 12/1995 | Stone et al. | 5,670,915 A | 9/1997 | Cooper et al. |
| 5,479,643 A | 12/1995 | Bhaskar et al. | 5,673,198 A | 9/1997 | Lawman et al. |
| 5,479,652 A | 12/1995 | Dreyer et al. | 5,675,825 A | 10/1997 | Dreyer et al. |
| 5,481,471 A | 1/1996 | Naglestad | 5,677,691 A | 10/1997 | Hosticka et al. |
| 5,488,204 A | 1/1996 | Mead et al. | 5,680,070 A | 10/1997 | Anderson et al. |
| 5,491,458 A | 2/1996 | McCune | 5,682,032 A | 10/1997 | Phillipp |
| 5,493,246 A | 2/1996 | Anderson | 5,684,434 A | 11/1997 | Mann et al. |
| 5,493,723 A | 2/1996 | Beck et al. | 5,684,952 A | 11/1997 | Stein |
| 5,495,077 A | 2/1996 | Miller et al. | 5,686,844 A | 11/1997 | Hull et al. |
| 5,495,593 A | 2/1996 | Elmer et al. | 5,689,195 A | 11/1997 | Cliff et al. |
| 5,495,594 A | 2/1996 | MacKenna et al. | 5,689,196 A | 11/1997 | Schutte |
| 5,499,192 A | 3/1996 | Knapp et al. | 5,691,664 A | 11/1997 | Anderson et al. |
| 5,517,198 A | 5/1996 | McEwan | 5,691,898 A | 11/1997 | Rosenberg et al. |
| 5,519,854 A | 5/1996 | Watt | 5,694,063 A | 12/1997 | Burlison et al. |
| 5,521,529 A | 5/1996 | Agrawal et al. | 5,696,952 A | 12/1997 | Pontarelli |
| 5,530,444 A | 6/1996 | Tice et al. | 5,699,024 A | 12/1997 | Manlove et al. |
| 5,530,673 A | 6/1996 | Tobita et al. | 5,703,871 A | 12/1997 | Pope et al. |
| 5,530,813 A | 6/1996 | Paulsen et al. | 5,706,453 A | 1/1998 | Cheng et al. |
| 5,537,057 A | 7/1996 | Leong et al. | 5,708,798 A | 1/1998 | Lynch et al. |
| 5,541,878 A | 7/1996 | LeMoncheck et al. | 5,710,906 A | 1/1998 | Ghosh et al. |
| 5,543,588 A | 8/1996 | Bisset et al. | 5,712,969 A | 1/1998 | Zimmermann et al. |
| 5,543,590 A | 8/1996 | Gillespie et al. | 5,724,009 A | 3/1998 | Collins et al. |
| 5,543,591 A | 8/1996 | Gillespie et al. | 5,727,170 A | 3/1998 | Mitchell et al. |
| 5,544,067 A | 8/1996 | Rostoker et al. | 5,729,704 A | 3/1998 | Stone et al. |
| 5,544,311 A | 8/1996 | Harenberg et al. | 5,730,165 A | 3/1998 | Phillipp |
| 5,546,433 A | 8/1996 | Tran et al. | 5,732,277 A | 3/1998 | Kodosky et al. |
| 5,546,562 A | 8/1996 | Patel | 5,734,272 A | 3/1998 | Belot et al. |
| 5,552,725 A | 9/1996 | Ray et al. | 5,734,334 A | 3/1998 | Hsieh et al. |
| 5,552,748 A | 9/1996 | O'Shaughnessy | 5,737,557 A | 4/1998 | Sullivan |
| 5,554,951 A | 9/1996 | Gough | 5,737,760 A | 4/1998 | Grimmer et al. |
| 5,555,452 A | 9/1996 | Callaway et al. | 5,745,011 A | 4/1998 | Scott |
| 5,555,907 A | 9/1996 | Phillipp | 5,748,048 A | 5/1998 | Moyal |
| 5,557,762 A | 9/1996 | Okuaki et al. | 5,748,875 A | 5/1998 | Tzori |
| 5,559,502 A | 9/1996 | Schutte | 5,752,013 A | 5/1998 | Christensen et al. |
| 5,559,996 A | 9/1996 | Fujioka et al. | 5,754,552 A | 5/1998 | Allmond et al. |
| 5,563,526 A | 10/1996 | Hastings et al. | 5,754,826 A | 5/1998 | Gamal et al. |
| 5,563,529 A | 10/1996 | Seltzer et al. | 5,757,368 A | 5/1998 | Gerpheide et al. |
| 5,564,010 A | 10/1996 | Henry et al. | 5,758,058 A | 5/1998 | Milburn |
| 5,564,108 A | 10/1996 | Hunsaker et al. | 5,761,128 A | 6/1998 | Watanabe |
| 5,565,658 A | 10/1996 | Gerpheide et al. | 5,763,909 A | 6/1998 | Mead et al. |
| 5,566,702 A | 10/1996 | Phillipp | 5,764,714 A | 6/1998 | Stansell et al. |
| 5,572,665 A | 11/1996 | Nakabayashi et al. | 5,767,457 A | 6/1998 | Gerpheide et al. |
| 5,572,719 A | 11/1996 | Biesterfeldt | 5,774,704 A | 6/1998 | Williams |
| 5,574,678 A | 11/1996 | Gorecki | 5,777,399 A | 7/1998 | Shibuya |
| 5,574,852 A | 11/1996 | Bakker et al. | 5,781,030 A | 7/1998 | Agrawal et al. |
| 5,574,892 A | 11/1996 | Christensen | 5,781,747 A | 7/1998 | Kametani |
| 5,579,353 A | 11/1996 | Parmenter et al. | 5,784,545 A | 7/1998 | Anderson et al. |
| 5,587,945 A | 12/1996 | Lin et al. | 5,790,957 A | 8/1998 | Heidari |
| 5,587,957 A | 12/1996 | Kowalczyk et al. | 5,796,183 A | 8/1998 | Hourmand |
| 5,590,354 A | 12/1996 | Klapproth et al. | 5,799,176 A | 8/1998 | Kapusta et al. |
| 5,594,388 A | 1/1997 | O'Shaughnessy et al. | 5,802,073 A | 9/1998 | Platt |
| 5,594,734 A | 1/1997 | Worsley et al. | 5,802,290 A | 9/1998 | Casselman |
| 5,594,890 A | 1/1997 | Yamaura et al. | 5,805,792 A | 9/1998 | Swobada et al. |
| 5,600,262 A | 2/1997 | Kolze | 5,805,897 A | 9/1998 | Glowny |
| 5,604,466 A | 2/1997 | Dreps et al. | 5,808,883 A | 9/1998 | Hawkes |
| 5,608,892 A | 3/1997 | Wakerly | 5,811,987 A | 9/1998 | Ashmore, Jr. et al. |
| 5,614,861 A | 3/1997 | Harada | 5,812,698 A | 9/1998 | Platt et al. |
| 5,625,316 A | 4/1997 | Chambers et al. | 5,818,254 A | 10/1998 | Agrawal et al. |
| 5,629,857 A | 5/1997 | Brennan | 5,818,444 A | 10/1998 | Alimpich et al. |
| 5,629,891 A | 5/1997 | LeMoncheck et al. | 5,819,028 A | 10/1998 | Manghirmalani et al. |
| 5,630,052 A | 5/1997 | Shah | 5,822,387 A | 10/1998 | Mar |
| 5,630,057 A | 5/1997 | Hait | 5,822,531 A | 10/1998 | Gorczyca et al. |
| 5,630,102 A | 5/1997 | Johnson et al. | 5,828,693 A | 10/1998 | Mays et al. |
| 5,631,577 A | 5/1997 | Freidin et al. | 5,838,583 A | 11/1998 | Varadarajan et al. |
| 5,633,766 A | 5/1997 | Hase et al. | 5,841,078 A | 11/1998 | Miller et al. |

| | | | | | |
|---|---|---|---|---|---|
| 5,841,996 A | 11/1998 | Nolan et al. | 5,973,368 A | 10/1999 | Pearce et al. |
| 5,844,256 A | 12/1998 | Mead et al. | 5,974,235 A | 10/1999 | Nunally et al. |
| 5,848,285 A | 12/1998 | Kapusta et al. | 5,977,791 A | 11/1999 | Veenstra |
| 5,850,156 A | 12/1998 | Wittman | 5,978,584 A | 11/1999 | Nishibata et al. |
| 5,852,733 A | 12/1998 | Chien et al. | 5,978,937 A | 11/1999 | Miyamori et al. |
| 5,854,625 A | 12/1998 | Frisch et al. | 5,982,105 A | 11/1999 | Masters |
| 5,857,109 A | 1/1999 | Taylor | 5,982,229 A | 11/1999 | Wong et al. |
| 5,861,583 A | 1/1999 | Schediwy et al. | 5,982,241 A | 11/1999 | Nguyen et al. |
| 5,861,875 A | 1/1999 | Gerpheide | 5,983,277 A | 11/1999 | Heile et al. |
| 5,864,242 A | 1/1999 | Allen et al. | 5,986,479 A | 11/1999 | Mohan |
| 5,864,392 A | 1/1999 | Winklhofer et al. | 5,987,246 A | 11/1999 | Thomsen et al. |
| 5,867,046 A | 2/1999 | Sugasawa | 5,988,902 A | 11/1999 | Holehan |
| 5,867,399 A | 2/1999 | Rostoker et al. | 5,994,939 A | 11/1999 | Johnson et al. |
| 5,869,979 A | 2/1999 | Bocchino | 5,996,032 A | 11/1999 | Baker |
| 5,870,004 A | 2/1999 | Lu | 5,999,725 A | 12/1999 | Barbier et al. |
| 5,870,309 A | 2/1999 | Lawman | 6,002,268 A | 12/1999 | Sasaki et al. |
| 5,870,345 A | 2/1999 | Stecker | 6,002,398 A | 12/1999 | Wilson |
| 5,872,464 A | 2/1999 | Gradinariu | 6,003,054 A | 12/1999 | Oshima et al. |
| 5,874,958 A | 2/1999 | Ludolph | 6,003,133 A | 12/1999 | Moughanni et al. |
| 5,875,293 A | 2/1999 | Bell et al. | 6,005,814 A | 12/1999 | Mulholland et al. |
| 5,877,656 A | 3/1999 | Mann et al. | 6,005,904 A | 12/1999 | Knapp et al. |
| 5,878,425 A | 3/1999 | Redpath | 6,008,685 A | 12/1999 | Kunst |
| 5,880,411 A | 3/1999 | Gillespie et al. | 6,008,703 A | 12/1999 | Perrott et al. |
| 5,880,598 A | 3/1999 | Duong | 6,009,270 A | 12/1999 | Mann |
| 5,883,623 A | 3/1999 | Cseri | 6,009,496 A | 12/1999 | Tsai |
| 5,886,582 A | 3/1999 | Stansell | 6,011,407 A | 1/2000 | New |
| 5,889,236 A | 3/1999 | Gillespie et al. | 6,012,835 A | 1/2000 | Thompson et al. |
| 5,889,723 A | 3/1999 | Pascucci | 6,014,135 A | 1/2000 | Fernandes |
| 5,889,936 A | 3/1999 | Chan | 6,014,509 A | 1/2000 | Furtek et al. |
| 5,889,988 A | 3/1999 | Held | 6,016,554 A | 1/2000 | Skrovan et al. |
| 5,894,226 A | 4/1999 | Koyama | 6,016,563 A | 1/2000 | Fleisher |
| 5,894,243 A | 4/1999 | Hwang | 6,018,559 A | 1/2000 | Azegami et al. |
| 5,894,565 A | 4/1999 | Furtek et al. | 6,023,422 A | 2/2000 | Allen et al. |
| 5,895,494 A | 4/1999 | Scalzi et al. | 6,023,565 A | 2/2000 | Lawman et al. |
| 5,896,068 A | 4/1999 | Moyal | 6,026,134 A | 2/2000 | Duffy et al. |
| 5,896,330 A | 4/1999 | Gibson | 6,026,501 A | 2/2000 | Hohl et al. |
| 5,898,345 A | 4/1999 | Namura et al. | 6,028,271 A | 2/2000 | Gillespie et al. |
| 5,900,780 A | 5/1999 | Hirose et al. | 6,028,959 A | 2/2000 | Wang et al. |
| 5,901,062 A | 5/1999 | Burch et al. | 6,031,365 A | 2/2000 | Sharpe-Geisler |
| 5,903,718 A | 5/1999 | Marik | 6,032,268 A | 2/2000 | Swoboda et al. |
| 5,905,398 A | 5/1999 | Todsen et al. | 6,034,538 A | 3/2000 | Abramovici |
| 5,911,059 A | 6/1999 | Profit, Jr. | 6,037,807 A | 3/2000 | Wu et al. |
| 5,914,465 A | 6/1999 | Allen et al. | 6,038,551 A | 3/2000 | Barlow et al. |
| 5,914,633 A | 6/1999 | Comino et al. | 6,041,406 A | 3/2000 | Mann |
| 5,914,708 A | 6/1999 | LaGrange et al. | 6,043,695 A | 3/2000 | O'Sullivan |
| 5,917,356 A | 6/1999 | Casal et al. | 6,043,719 A | 3/2000 | Lin et al. |
| 5,920,310 A | 7/1999 | Faggin et al. | 6,049,223 A | 4/2000 | Lytle et al. |
| 5,923,264 A | 7/1999 | Lavelle et al. | 6,049,225 A | 4/2000 | Huang et al. |
| 5,926,566 A | 7/1999 | Wang et al. | 6,051,772 A | 4/2000 | Cameron et al. |
| 5,929,710 A | 7/1999 | Bien | 6,052,035 A | 4/2000 | Nolan et al. |
| 5,930,150 A | 7/1999 | Cohen et al. | 6,052,524 A | 4/2000 | Pauna |
| 5,933,023 A | 8/1999 | Young | 6,057,705 A | 5/2000 | Wojewoda et al. |
| 5,933,356 A | 8/1999 | Rostoker et al. | 6,058,263 A | 5/2000 | Voth |
| 5,933,816 A | 8/1999 | Zeanah et al. | 6,058,452 A | 5/2000 | Rangasayee et al. |
| 5,935,266 A | 8/1999 | Thurnhofer et al. | 6,061,511 A | 5/2000 | Marantz et al. |
| 5,939,904 A | 8/1999 | Fetterman et al. | 6,066,961 A | 5/2000 | Lee et al. |
| 5,939,949 A | 8/1999 | Olgaard et al. | 6,070,003 A | 5/2000 | Gove et al. |
| 5,941,991 A | 8/1999 | Kageshima | 6,072,803 A | 6/2000 | Allmond et al. |
| 5,942,733 A | 8/1999 | Allen et al. | 6,075,941 A | 6/2000 | Itoh et al. |
| 5,943,052 A | 8/1999 | Allen et al. | 6,079,985 A | 6/2000 | Wohl et al. |
| 5,945,878 A | 8/1999 | Westwick et al. | 6,081,140 A | 6/2000 | King |
| 5,949,632 A | 9/1999 | Barreras, Sr. et al. | 6,094,730 A | 7/2000 | Lopez et al. |
| 5,952,888 A | 9/1999 | Scott | 6,097,211 A | 8/2000 | Couts-Martin et al. |
| 5,959,871 A | 9/1999 | Pierzchala et al. | 6,097,432 A | 8/2000 | Mead et al. |
| 5,963,075 A | 10/1999 | Hiiragizawa | 6,101,457 A | 8/2000 | Barch et al. |
| 5,963,105 A | 10/1999 | Nguyen | 6,101,617 A | 8/2000 | Burckhartt et al. |
| 5,963,503 A | 10/1999 | Lee | 6,104,217 A | 8/2000 | Magana |
| 5,964,893 A | 10/1999 | Circello et al. | 6,104,325 A | 8/2000 | Liaw et al. |
| 5,966,027 A | 10/1999 | Kapusta et al. | 6,107,769 A | 8/2000 | Saylor et al. |
| 5,966,532 A | 10/1999 | McDonald et al. | 6,107,826 A | 8/2000 | Young et al. |
| 5,968,135 A | 10/1999 | Teramoto et al. | 6,107,882 A | 8/2000 | Gabara et al. |
| 5,969,513 A | 10/1999 | Clark | 6,110,223 A | 8/2000 | Southgate et al. |
| 5,969,632 A | 10/1999 | Diamant et al. | 6,111,431 A | 8/2000 | Estrada |

| | | | | | | | |
|---|---|---|---|---|---|---|---|
| 6,112,264 | A | 8/2000 | Beasley et al. | 6,240,375 | B1 | 5/2001 | Sonoda |
| 6,121,791 | A | 9/2000 | Abbott | 6,246,258 | B1 | 6/2001 | Lesea |
| 6,121,805 | A | 9/2000 | Thamsirianunt et al. | 6,246,410 | B1 | 6/2001 | Bergeron et al. |
| 6,121,965 | A | 9/2000 | Kenney et al. | 6,249,167 | B1 | 6/2001 | Oguchi et al. |
| 6,125,416 | A | 9/2000 | Warren | 6,249,447 | B1 | 6/2001 | Boylan et al. |
| 6,130,548 | A | 10/2000 | Koifman | 6,253,754 | B1 | 7/2001 | Roohparvar |
| 6,130,551 | A | 10/2000 | Agrawal et al. | 6,262,717 | B1 | 7/2001 | Donohue et al. |
| 6,130,552 | A | 10/2000 | Jefferson et al. | 6,263,302 | B1 | 7/2001 | Hellestrand et al. |
| 6,133,773 | A | 10/2000 | Garlepp et al. | 6,263,339 | B1 | 7/2001 | Hirsch |
| 6,134,181 | A | 10/2000 | Landry | 6,263,484 | B1 | 7/2001 | Yang |
| 6,134,516 | A | 10/2000 | Wang et al. | 7,171,455 | B1 | 7/2001 | Gupta et al. |
| 6,137,308 | A | 10/2000 | Nayak | 6,271,679 | B1 | 8/2001 | McClintock et al. |
| 6,140,853 | A | 10/2000 | Lo | 6,272,646 | B1 | 8/2001 | Rangasayee |
| 6,141,376 | A | 10/2000 | Shaw | 6,275,117 | B1 | 8/2001 | Abugharbieh et al. |
| 6,141,764 | A | 10/2000 | Ezell | 6,278,568 | B1 | 8/2001 | Cloke et al. |
| 6,144,327 | A | 11/2000 | Distinti et al. | 6,280,391 | B1 | 8/2001 | Olson et al. |
| 6,148,104 | A | 11/2000 | Wang et al. | 6,281,753 | B1 | 8/2001 | Corsi et al. |
| 6,148,441 | A | 11/2000 | Woodward | 6,282,547 | B1 | 8/2001 | Hirsch |
| 6,149,299 | A | 11/2000 | Aslan et al. | 6,282,551 | B1 | 8/2001 | Anderson et al. |
| 6,150,866 | A | 11/2000 | Eto et al. | 6,286,127 | B1 | 9/2001 | King et al. |
| 6,154,064 | A | 11/2000 | Proebsting | 6,288,707 | B1 | 9/2001 | Philipp |
| 6,157,024 | A | 12/2000 | Chapdelaine et al. | 6,289,300 | B1 | 9/2001 | Brannick et al. |
| 6,157,270 | A | 12/2000 | Tso | 6,289,478 | B1 | 9/2001 | Kitagaki |
| 6,161,199 | A | 12/2000 | Szeto et al. | 6,289,489 | B1 | 9/2001 | Bold et al. |
| 6,166,367 | A | 12/2000 | Cho | 6,292,028 | B1 | 9/2001 | Tomita |
| 6,166,960 | A | 12/2000 | Marneweck et al. | 6,294,932 | B1 | 9/2001 | Watarai |
| 6,167,077 | A | 12/2000 | Ducaroir | 6,294,962 | B1 | 9/2001 | Mar |
| 6,167,559 | A | 12/2000 | Furtek et al. | 6,298,320 | B1 | 10/2001 | Buckmaster et al. |
| 6,169,383 | B1 | 1/2001 | Sabin et al. | 6,304,014 | B1 | 10/2001 | England et al. |
| 6,172,571 | B1 | 1/2001 | Moyal et al. | 6,304,101 | B1 | 10/2001 | Nishihara |
| 6,173,419 | B1 | 1/2001 | Barnett | 6,304,790 | B1 | 10/2001 | Nakamura et al. |
| 6,175,914 | B1 | 1/2001 | Mann | 6,307,413 | B1 | 10/2001 | Dalmia et al. |
| 6,175,949 | B1 * | 1/2001 | Gristede et al. ............... 716/11 | 6,310,521 | B1 | 10/2001 | Dalmia |
| 6,181,163 | B1 | 1/2001 | Agrawal et al. | 6,310,611 | B1 | 10/2001 | Caldwell |
| 6,183,131 | B1 | 2/2001 | Holloway et al. | 6,311,149 | B1 | 10/2001 | Ryan et al. |
| 6,185,127 | B1 | 2/2001 | Myers et al. | 7,406,674 | B1 | 10/2001 | Ogami et al. |
| 6,185,450 | B1 | 2/2001 | Seguine et al. | 6,314,530 | B1 | 11/2001 | Mann |
| 6,185,522 | B1 | 2/2001 | Bakker | 6,320,184 | B1 | 11/2001 | Winklhofer et al. |
| 6,185,703 | B1 | 2/2001 | Guddat et al. | 6,320,282 | B1 | 11/2001 | Caldwell |
| 6,185,732 | B1 | 2/2001 | Mann et al. | 6,321,369 | B1 | 11/2001 | Heile et al. |
| 6,188,228 | B1 | 2/2001 | Philipp | 6,323,846 | B1 | 11/2001 | Westerman et al. |
| 6,188,241 | B1 | 2/2001 | Gauthier et al. | 6,324,628 | B1 | 11/2001 | Chan |
| 6,188,381 | B1 | 2/2001 | van der Wal et al. | 6,326,859 | B1 | 12/2001 | Goldman et al. |
| 6,188,391 | B1 | 2/2001 | Seely et al. | 6,332,137 | B1 | 12/2001 | Hori et al. |
| 6,188,975 | B1 | 2/2001 | Gay | 6,332,201 | B1 | 12/2001 | Chin et al. |
| 6,191,603 | B1 | 2/2001 | Muradali et al. | 6,337,579 | B1 | 1/2002 | Mochida |
| 6,191,660 | B1 | 2/2001 | Mar et al. | 6,338,109 | B1 | 1/2002 | Snyder et al. |
| 6,191,998 | B1 | 2/2001 | Reddy et al. | 6,339,815 | B1 | 1/2002 | Feng et al. |
| 6,192,431 | B1 | 2/2001 | Dabral et al. | 6,342,907 | B1 | 1/2002 | Petty et al. |
| 6,198,303 | B1 | 3/2001 | Rangasayee | 6,345,383 | B1 | 2/2002 | Ueki |
| 6,201,407 | B1 | 3/2001 | Kapusta et al. | 6,347,395 | B1 | 2/2002 | Payne et al. |
| 6,201,829 | B1 | 3/2001 | Schneider | 6,351,789 | B1 | 2/2002 | Green |
| 6,202,044 | B1 | 3/2001 | Tzori | 6,353,452 | B1 | 3/2002 | Hamada et al. |
| 6,204,687 | B1 | 3/2001 | Schultz et al. | 6,355,980 | B1 | 3/2002 | Callahan |
| 6,205,574 | B1 | 3/2001 | Dellinger et al. | 6,356,862 | B2 | 3/2002 | Bailey |
| 6,208,572 | B1 | 3/2001 | Adams et al. | 6,356,958 | B1 | 3/2002 | Lin |
| 6,211,708 | B1 | 4/2001 | Kemmer | 6,356,960 | B1 | 3/2002 | Jones et al. |
| 6,211,715 | B1 | 4/2001 | Terauchi | 6,359,950 | B2 | 3/2002 | Gossmann et al. |
| 6,211,741 | B1 | 4/2001 | Dalmia | 6,362,697 | B1 | 3/2002 | Pulvirenti |
| 6,215,352 | B1 | 4/2001 | Sudo | 6,366,174 | B1 | 4/2002 | Berry et al. |
| 6,219,729 | B1 | 4/2001 | Keats et al. | 6,366,300 | B1 | 4/2002 | Ohara et al. |
| 6,222,528 | B1 | 4/2001 | Gerpheide et al. | 6,366,874 | B1 | 4/2002 | Lee et al. |
| 6,223,144 | B1 | 4/2001 | Barnett et al. | 6,366,878 | B1 | 4/2002 | Grunert |
| 6,223,147 | B1 | 4/2001 | Bowers | 6,369,660 | B1 | 4/2002 | Wei |
| 6,223,272 | B1 | 4/2001 | Coehlo et al. | 6,371,878 | B1 | 4/2002 | Bowen |
| RE37,195 | E | 5/2001 | Kean | 6,373,954 | B1 | 4/2002 | Malcolm et al. |
| 6,225,866 | B1 | 5/2001 | Kubota et al. | 6,374,370 | B1 | 4/2002 | Bockhaus et al. |
| 6,236,242 | B1 | 5/2001 | Hedberg | 6,377,009 | B1 | 4/2002 | Philipp |
| 6,236,275 | B1 | 5/2001 | Dent | 6,377,575 | B1 | 4/2002 | Mullaney et al. |
| 6,236,278 | B1 | 5/2001 | Olgaard | 6,377,646 | B1 | 4/2002 | Sha |
| 6,236,593 | B1 | 5/2001 | Hong et al. | 6,380,811 | B1 | 4/2002 | Zarubinsky et al. |
| 6,239,389 | B1 | 5/2001 | Allen et al. | 6,380,929 | B1 | 4/2002 | Platt |
| 6,239,798 | B1 | 5/2001 | Ludolph et al. | 6,380,931 | B1 | 4/2002 | Gillespie et al. |

| | | | |
|---|---|---|---|
| 6,384,947 B1 | 5/2002 | Ackerman et al. | |
| 6,385,742 B1 | 5/2002 | Kirsch et al. | |
| 6,388,109 B1 | 5/2002 | Schwarz et al. | |
| 6,388,464 B1 | 5/2002 | Lacey et al. | |
| 6,396,302 B2 | 5/2002 | New et al. | |
| 6,396,657 B1 | 5/2002 | Sun et al. | |
| 6,397,232 B1 * | 5/2002 | Cheng-Hung et al. | 715/523 |
| 6,404,204 B1 | 6/2002 | Farruggia et al. | |
| 6,404,445 B1 | 6/2002 | Galea et al. | |
| 6,407,953 B1 | 6/2002 | Cleeves | |
| 6,408,432 B1 | 6/2002 | Herrmann et al. | |
| 6,411,665 B1 | 6/2002 | Chan et al. | |
| 6,411,974 B1 | 6/2002 | Graham et al. | |
| 6,414,671 B1 | 7/2002 | Gillespie et al. | |
| 6,421,698 B1 | 7/2002 | Hong | |
| 6,425,109 B1 | 7/2002 | Choukalos et al. | |
| 6,429,882 B1 | 8/2002 | Abdelnur et al. | |
| 6,430,305 B1 | 8/2002 | Decker | |
| 6,433,645 B1 | 8/2002 | Mann et al. | |
| 6,434,187 B1 | 8/2002 | Beard | |
| 6,437,805 B1 | 8/2002 | Sojoodi et al. | |
| 6,438,565 B1 | 8/2002 | Ammirato et al. | |
| 6,438,735 B1 | 8/2002 | McElvain et al. | |
| 6,438,738 B1 | 8/2002 | Elayda | |
| 6,441,073 B1 | 8/2002 | Tanaka et al. | |
| 6,445,211 B1 | 9/2002 | Saripella | |
| 6,449,628 B1 | 9/2002 | Wasson | |
| 6,449,755 B1 | 9/2002 | Beausang et al. | |
| 6,452,437 B1 | 9/2002 | Takeuchi et al. | |
| 6,452,514 B1 | 9/2002 | Philipp | |
| 6,453,175 B2 | 9/2002 | Mizell et al. | |
| 6,453,461 B1 | 9/2002 | Chaiken | |
| 6,456,304 B1 | 9/2002 | Angiulo et al. | |
| 6,457,355 B1 | 10/2002 | Philipp | |
| 6,457,479 B1 | 10/2002 | Zhuang et al. | |
| 6,460,172 B1 | 10/2002 | Farre et al. | |
| 6,463,488 B1 | 10/2002 | San Juan | |
| 6,466,036 B1 | 10/2002 | Philipp | |
| 6,466,078 B1 | 10/2002 | Stiff | |
| 6,466,898 B1 | 10/2002 | Chan | |
| 6,473,069 B1 | 10/2002 | Gerpheide | |
| 6,477,691 B1 | 11/2002 | Bergamashi/Rab et al. | |
| 6,480,921 B1 | 11/2002 | Mansoorian et al. | |
| 6,483,343 B1 | 11/2002 | Faith et al. | |
| 6,487,700 B1 | 11/2002 | Fukushima | |
| 6,489,899 B1 | 12/2002 | Ely et al. | |
| 6,490,213 B1 | 12/2002 | Mu et al. | |
| 6,492,834 B1 | 12/2002 | Lytle et al. | |
| 6,498,720 B2 | 12/2002 | Glad | |
| 6,499,134 B1 | 12/2002 | Buffet et al. | |
| 6,499,359 B1 | 12/2002 | Washeleski et al. | |
| 6,504,403 B2 | 1/2003 | Bangs et al. | |
| 6,507,214 B1 | 1/2003 | Snyder | |
| 6,507,215 B1 | 1/2003 | Piasecki et al. | |
| 6,507,857 B1 * | 1/2003 | Yalcinalp | 715/513 |
| 6,509,758 B2 | 1/2003 | Piasecki et al. | |
| 6,512,395 B1 | 1/2003 | Lacey et al. | |
| 6,516,428 B2 | 2/2003 | Wenzel et al. | |
| 6,522,128 B1 | 2/2003 | Ely et al. | |
| 6,523,416 B2 | 2/2003 | Takagi et al. | |
| 6,525,593 B1 | 2/2003 | Mar | |
| 6,529,791 B1 | 3/2003 | Takagi | |
| 6,530,065 B1 | 3/2003 | McDonald et al. | |
| 6,534,970 B1 | 3/2003 | Ely et al. | |
| 6,535,200 B2 | 3/2003 | Philipp | |
| 6,535,946 B1 | 3/2003 | Bryant et al. | |
| 6,536,028 B1 | 3/2003 | Katsioulas et al. | |
| 6,539,534 B1 * | 3/2003 | Bennett | 716/17 |
| 6,542,025 B1 | 4/2003 | Kutz et al. | |
| 6,542,844 B1 | 4/2003 | Hanna | |
| 6,553,057 B1 | 4/2003 | Sha | |
| 6,554,469 B1 | 4/2003 | Thomson et al. | |
| 6,557,164 B1 | 4/2003 | Faustini | |
| 6,559,685 B2 | 5/2003 | Green | |
| 6,560,306 B1 | 5/2003 | Duffy et al. | |
| 6,560,699 B1 | 5/2003 | Konkle | |
| 6,563,391 B1 | 5/2003 | Mar | |
| 6,564,179 B1 | 5/2003 | Belhaj | |
| 6,566,961 B2 | 5/2003 | Dasgupta et al. | |
| 6,567,426 B1 | 5/2003 | van Hook et al. | |
| 6,567,932 B2 | 5/2003 | Edwards et al. | |
| 6,570,557 B1 | 5/2003 | Westerman et al. | |
| 6,571,331 B2 | 5/2003 | Henry et al. | |
| 6,574,590 B1 | 6/2003 | Kershaw et al. | |
| 6,574,739 B1 | 6/2003 | Kung et al. | |
| 6,575,373 B1 | 6/2003 | Nakano | |
| 6,577,258 B2 | 6/2003 | Ruha et al. | |
| 6,578,174 B2 | 6/2003 | Zizzo | |
| 6,580,329 B2 | 6/2003 | Sander | |
| 6,581,191 B1 | 6/2003 | Schubert et al. | |
| 6,587,093 B1 | 7/2003 | Shaw et al. | |
| 6,587,995 B1 | 7/2003 | Duboc et al. | |
| 6,588,004 B1 * | 7/2003 | Southgate et al. | 716/11 |
| 6,590,422 B1 | 7/2003 | Dillon | |
| 6,590,517 B1 | 7/2003 | Swanson | |
| 6,591,369 B1 | 7/2003 | Edwards et al. | |
| 6,592,626 B1 | 7/2003 | Bauchot et al. | |
| 6,594,799 B1 | 7/2003 | Robertson et al. | |
| 6,597,212 B1 | 7/2003 | Wang et al. | |
| 6,597,824 B2 | 7/2003 | Newberg et al. | |
| 6,598,178 B1 | 7/2003 | Yee et al. | |
| 6,600,346 B1 | 7/2003 | Macaluso | |
| 6,600,351 B2 | 7/2003 | Bisanti et al. | |
| 6,600,575 B1 | 7/2003 | Kohara | |
| 6,601,189 B1 | 7/2003 | Edwards et al. | |
| 6,601,236 B1 | 7/2003 | Curtis | |
| 6,603,330 B1 | 8/2003 | Snyder | |
| 6,603,348 B1 | 8/2003 | Preuss et al. | |
| 6,604,179 B2 | 8/2003 | Volk et al. | |
| 6,606,731 B1 | 8/2003 | Baum et al. | |
| 6,608,472 B1 | 8/2003 | Kutz et al. | |
| 6,611,220 B1 | 8/2003 | Snyder | |
| 6,611,276 B1 | 8/2003 | Muratori et al. | |
| 6,611,856 B1 | 8/2003 | Liao et al. | |
| 6,611,952 B1 | 8/2003 | Prakash et al. | |
| 6,610,936 B2 | 9/2003 | Gillespie et al. | |
| 6,613,098 B1 | 9/2003 | Sorge et al. | |
| 6,614,260 B1 | 9/2003 | Welch et al. | |
| 6,614,320 B1 | 9/2003 | Sullam et al. | |
| 6,614,374 B1 | 9/2003 | Gustavsson et al. | |
| 6,614,458 B1 | 9/2003 | Lambert et al. | |
| 6,617,888 B2 | 9/2003 | Volk | |
| 6,618,854 B1 | 9/2003 | Mann | |
| 6,621,356 B2 | 9/2003 | Gotz et al. | |
| 6,624,640 B2 | 9/2003 | Lund et al. | |
| 6,625,765 B1 | 9/2003 | Krishnan | |
| 6,628,163 B2 | 9/2003 | Dathe et al. | |
| 6,631,508 B1 | 10/2003 | Williams | |
| 6,634,008 B1 * | 10/2003 | Dole | 716/1 |
| 6,636,096 B2 | 10/2003 | Schaffer et al. | |
| 6,637,015 B1 | 10/2003 | Ogami et al. | |
| 6,639,586 B2 | 10/2003 | Gerpheide | |
| 6,642,857 B1 | 11/2003 | Schediwy et al. | |
| 6,643,151 B1 | 11/2003 | Nebrigic et al. | |
| 6,643,810 B2 | 11/2003 | Whetsel | |
| 6,649,924 B1 | 11/2003 | Philipp et al. | |
| 6,650,581 B2 | 11/2003 | Hong et al. | |
| 6,658,498 B1 | 12/2003 | Carney et al. | |
| 6,658,633 B2 | 12/2003 | Devins et al. | |
| 6,661,288 B2 | 12/2003 | Morgan et al. | |
| 6,661,410 B2 | 12/2003 | Casebolt et al. | |
| 6,664,978 B1 | 12/2003 | Kekic et al. | |
| 6,664,991 B1 | 12/2003 | Chew et al. | |
| 6,667,642 B1 | 12/2003 | Moyal | |
| 6,667,740 B2 | 12/2003 | Ely et al. | |
| 6,670,852 B1 | 12/2003 | Hauck | |

| Patent | Date | Inventor |
|---|---|---|
| 6,673,308 B2 | 1/2004 | Hino et al. |
| 6,677,814 B2 | 1/2004 | Low et al. |
| 6,677,932 B1 | 1/2004 | Westerman |
| 6,678,645 B1 | 1/2004 | Rajsuman et al. |
| 6,678,877 B1 | 1/2004 | Perry et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,301 B2 | 2/2004 | Bowen |
| 6,697,754 B1 | 2/2004 | Alexander |
| 6,856,433 B2 | 2/2004 | Hatano et al. |
| 6,701,340 B1 | 3/2004 | Gorecki |
| 6,701,487 B1 | 3/2004 | Ogami et al. |
| 6,701,508 B1 | 3/2004 | Bartz et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 * | 3/2004 | Bauwens et al. ............ 714/724 |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,718,533 B1 | 4/2004 | Schneider et al. |
| 6,724,220 B1 | 4/2004 | Snyder et al. |
| 6,728,900 B1 | 4/2004 | Meli |
| 6,728,902 B2 | 4/2004 | Kaiser et al. |
| 6,730,863 B1 | 5/2004 | Gerpheide |
| 6,731,552 B2 | 5/2004 | Perner |
| 6,732,347 B1 | 5/2004 | Camilleri et al. |
| 6,738,858 B1 | 5/2004 | Fernald et al. |
| 6,744,323 B1 | 6/2004 | Moyal et al. |
| 6,748,569 B1 * | 6/2004 | Brooke et al. ................ 715/523 |
| 6,750,852 B2 | 6/2004 | Gillespie |
| 6,750,889 B1 | 6/2004 | Livingston et al. |
| 6,754,765 B1 | 6/2004 | Chang et al. |
| 6,754,849 B2 | 6/2004 | Tamura |
| 6,757,882 B2 | 6/2004 | Chen et al. |
| 6,765,407 B1 | 7/2004 | Snyder |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,774,644 B2 | 8/2004 | Eberlein |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,788,116 B1 | 9/2004 | Cook et al. |
| 6,788,221 B1 | 9/2004 | Ely et al. |
| 6,788,521 B2 | 9/2004 | Nishi |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |
| 6,806,782 B2 | 10/2004 | Motoyoshi et al. |
| 6,809,275 B1 | 10/2004 | Cheng et al. |
| 6,809,566 B1 | 10/2004 | Xin-LeBlanc |
| 6,810,442 B1 | 10/2004 | Lin et al. |
| 6,815,979 B2 | 11/2004 | Ooshita |
| 6,816,544 B1 | 11/2004 | Bailey et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,850,554 B1 | 2/2005 | Sha |
| 6,853,598 B2 | 2/2005 | Chevallier |
| 6,854,067 B1 | 2/2005 | Kutz et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Latham, II et al. |
| 6,873,210 B2 | 3/2005 | Mulder et al. |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,563 B1 | 5/2005 | Ogami et al. |
| 6,903,402 B2 | 6/2005 | Miyazawa |
| 6,903,613 B1 | 6/2005 | Mitchell et al. |
| 6,904,570 B2 | 6/2005 | Foote et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Muller et al. |
| 6,934,674 B1 | 8/2005 | Douezy et al. |
| 6,937,075 B2 | 8/2005 | Lim et al. |
| 6,940,356 B2 | 9/2005 | McDonald et al. |
| 6,941,336 B1 | 9/2005 | Mar |
| 6,944,018 B2 | 9/2005 | Caldwell |
| 6,949,811 B2 | 9/2005 | Miyazawa |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,963,233 B2 | 11/2005 | Puccio et al. |
| 6,967,511 B1 | 11/2005 | Sullam |
| 6,967,960 B1 | 11/2005 | Bross et al. |
| 6,969,978 B2 | 11/2005 | Dening |
| 6,970,844 B1 | 11/2005 | Bierenbaum |
| 6,973,400 B2 | 12/2005 | Cahill-O'Brien et al. |
| 6,975,123 B1 | 12/2005 | Malang et al. |
| 6,980,060 B2 | 12/2005 | Boerstler et al. |
| 6,981,090 B1 | 12/2005 | Kutz et al. |
| 6,988,192 B2 | 1/2006 | Snider |
| 6,996,799 B1 | 2/2006 | Cismas et al. |
| 7,005,933 B1 | 2/2006 | Shutt |
| 7,009,444 B1 | 3/2006 | Scott |

| Patent | Type | Date | Inventor(s) |
|---|---|---|---|
| 7,015,735 | B2 | 3/2006 | Kimura et al. |
| 7,017,145 | B2 | 3/2006 | Taylor |
| 7,017,409 | B2 | 3/2006 | Zielinski et al. |
| 7,020,854 | B2 | 3/2006 | Killian et al. |
| 7,023,215 | B2 | 4/2006 | Steenwyk |
| 7,023,257 | B1 | 4/2006 | Sullam |
| 7,024,636 | B2 | 4/2006 | Weed |
| 7,026,861 | B2 | 4/2006 | Steenwyk |
| 7,030,513 | B2 | 4/2006 | Caldwell |
| 7,030,656 | B2 | 4/2006 | Lo et al. |
| 7,030,688 | B2 | 4/2006 | Dosho et al. |
| 7,030,782 | B2 | 4/2006 | Ely et al. |
| 7,034,603 | B2 | 4/2006 | Brady et al. |
| 7,042,301 | B2 | 5/2006 | Sutardja |
| 7,047,166 | B2 | 5/2006 | Dancea |
| 7,055,035 | B2 | 5/2006 | Allison et al. |
| 7,058,921 | B1 | 6/2006 | Hwang et al. |
| 7,073,158 | B2 | 7/2006 | McCubbrey |
| 7,076,420 | B1 | 7/2006 | Snyder et al. |
| 7,086,014 | B1 | 8/2006 | Bartz et al. |
| 7,088,166 | B1 | 8/2006 | Reinschmidt et al. |
| 7,089,175 | B1 | 8/2006 | Nemecek et al. |
| 7,091,713 | B2 | 8/2006 | Erdelyi et al. |
| 7,092,980 | B1 | 8/2006 | Mar et al. |
| 7,098,414 | B2 | 8/2006 | Caldwell |
| 7,099,818 | B1 | 8/2006 | Nemecek |
| 7,103,108 | B1 | 9/2006 | Beard |
| 7,109,978 | B2 | 9/2006 | Gillespie et al. |
| 7,117,485 | B2 | 10/2006 | Wilkinson et al. |
| 7,119,550 | B2 | 10/2006 | Kitano et al. |
| 7,119,602 | B2 | 10/2006 | Davis |
| 7,124,376 | B2 | 10/2006 | Zaidi et al. |
| 7,127,630 | B1 | 10/2006 | Snyder |
| 7,129,793 | B2 | 10/2006 | Gramegna |
| 7,129,873 | B2 | 10/2006 | Kawamura |
| 7,132,835 | B1 | 11/2006 | Arcus |
| 7,133,140 | B2 | 11/2006 | Lukacs et al. |
| 7,133,793 | B2 | 11/2006 | Ely et al. |
| 7,138,841 | B1 | 11/2006 | Li |
| 7,138,868 | B2 | 11/2006 | Sanchez et al. |
| 7,139,530 | B2 | 11/2006 | Kusbel |
| 7,141,968 | B2 | 11/2006 | Hibbs et al. |
| 7,141,987 | B2 | 11/2006 | Hibbs et al. |
| 7,149,316 | B1 | 12/2006 | Kutz et al. |
| 7,150,002 | B1 | 12/2006 | Anderson et al. |
| 7,151,528 | B2 | 12/2006 | Taylor et al. |
| 7,152,027 | B2 | 12/2006 | Andrade et al. |
| 7,154,294 | B2 | 12/2006 | Liu et al. |
| 7,161,936 | B1 | 1/2007 | Barrass et al. |
| 7,162,410 | B1 | 1/2007 | Nemecek et al. |
| 7,176,701 | B2 | 2/2007 | Wachi et al. |
| 7,180,342 | B1 | 2/2007 | Shutt et al. |
| 7,185,162 | B1 | 2/2007 | Snyder |
| 7,185,321 | B1 | 2/2007 | Roe et al. |
| 7,188,063 | B1 | 3/2007 | Snyder |
| 7,193,901 | B2 | 3/2007 | Ruby et al. |
| 7,200,507 | B2 | 4/2007 | Chen et al. |
| 7,206,733 | B1 | 4/2007 | Nemecek |
| 7,212,189 | B2 | 5/2007 | Shaw et al |
| 7,221,187 | B1 | 5/2007 | Snyder et al. |
| 7,227,389 | B2 | 6/2007 | Gong et al. |
| 7,236,921 | B1 | 6/2007 | Nemecek et al. |
| 7,250,825 | B2 | 7/2007 | Wilson et al. |
| 7,256,588 | B2 | 8/2007 | Howard et al. |
| 7,265,633 | B1 | 9/2007 | Stiff |
| 7,266,768 | B2 | 9/2007 | Ferlitsch et al. |
| 7,281,846 | B2 | 10/2007 | McLeod |
| 7,282,905 | B2 | 10/2007 | Chen et al. |
| 7,283,151 | B2 | 10/2007 | Nihei et al. |
| 7,288,977 | B2 | 10/2007 | Stanley |
| 7,295,049 | B1 | 11/2007 | Moyal et al. |
| 7,298,124 | B2 | 11/2007 | Kan et al. |
| 7,301,835 | B2 | 11/2007 | Joshi et al. |
| 7,307,485 | B1 | 12/2007 | Snyder et al. |
| 7,312,616 | B2 | 12/2007 | Snyder |
| 7,323,879 | B2 | 1/2008 | Kuo et al. |
| 7,342,405 | B2 | 3/2008 | Eldridge et al. |
| 7,358,714 | B2 | 4/2008 | Watanabe et al. |
| 7,367,017 | B2 | 4/2008 | Maddocks et al. |
| 7,376,001 | B2 | 5/2008 | Joshi et al. |
| 7,386,740 | B2 | 6/2008 | Kutz et al. |
| 7,400,183 | B1 | 7/2008 | Sivadasan et al. |
| 7,421,251 | B2 | 9/2008 | Westwick et al. |
| 7,466,307 | B2 | 12/2008 | Trent, Jr. et al. |
| 7,542,533 | B2 | 6/2009 | Jasa et al. |
| 7,554,847 | B2 | 6/2009 | Lee |
| 2001/0002129 | A1 | 5/2001 | Zimmerman et al. |
| 2001/0010083 | A1 | 7/2001 | Satoh |
| 2001/0038392 | A1 | 11/2001 | Humpleman et al. |
| 2001/0043081 | A1 | 11/2001 | Rees |
| 2001/0044927 | A1* | 11/2001 | Karniewicz .................. 716/17 |
| 2001/0045861 | A1* | 11/2001 | Bloodworth et al. ........ 327/525 |
| 2001/0047509 | A1 | 11/2001 | Mason et al. |
| 2002/0010716 | A1* | 1/2002 | McCartney et al. ......... 707/517 |
| 2002/0016706 | A1 | 2/2002 | Cooke et al. |
| 2002/0023110 | A1* | 2/2002 | Fortin et al. ................. 707/513 |
| 2002/0042696 | A1 | 4/2002 | Garcia et al. |
| 2002/0052729 | A1 | 5/2002 | Kyung et al. |
| 2002/0059543 | A1 | 5/2002 | Cheng et al. |
| 2002/0063688 | A1 | 5/2002 | Shaw et al. |
| 2002/0065646 | A1 | 5/2002 | Waldie et al. |
| 2002/0068989 | A1* | 6/2002 | Ebisawa et al. ............. 700/121 |
| 2002/0073119 | A1* | 6/2002 | Richard ...................... 707/513 |
| 2002/0073380 | A1 | 6/2002 | Cooke |
| 2002/0080186 | A1 | 6/2002 | Frederiksen |
| 2002/0085020 | A1 | 7/2002 | Carroll, Jr. |
| 2002/0109722 | A1 | 8/2002 | Rogers et al. |
| 2002/0116168 | A1 | 8/2002 | Kim |
| 2002/0122060 | A1 | 9/2002 | Markel |
| 2002/0129334 | A1 | 9/2002 | Dane et al. |
| 2002/0133771 | A1 | 9/2002 | Barnett |
| 2002/0133794 | A1 | 9/2002 | Kanapathippillai et al. |
| 2002/0138516 | A1* | 9/2002 | Igra .......................... 707/513 |
| 2002/0121679 | A1 | 10/2002 | Bazarjani et al. |
| 2002/0145433 | A1 | 10/2002 | Morrise et al. |
| 2002/0152234 | A1* | 10/2002 | Estrada et al. ........... 707/501.1 |
| 2002/0152449 | A1* | 10/2002 | Lin .............................. 716/17 |
| 2002/0156885 | A1 | 10/2002 | Thakkar |
| 2002/0156929 | A1* | 10/2002 | Hekmatpour ............... 709/310 |
| 2002/0156998 | A1 | 10/2002 | Casselman |
| 2002/0161568 | A1* | 10/2002 | Sample et al. ................ 703/25 |
| 2002/0161802 | A1* | 10/2002 | Gabrick et al. ............. 707/517 |
| 2002/0166100 | A1 | 11/2002 | Meding |
| 2002/0174134 | A1 | 11/2002 | Goykhman |
| 2002/0174411 | A1 | 11/2002 | Feng et al. |
| 2002/0191029 | A1 | 12/2002 | Gillespie et al. |
| 2003/0011639 | A1 | 1/2003 | Webb |
| 2003/0014447 | A1* | 1/2003 | White ........................ 707/530 |
| 2003/0025734 | A1 | 2/2003 | Boose et al. |
| 2003/0041235 | A1 | 2/2003 | Meyer |
| 2003/0056071 | A1 | 3/2003 | Triece et al. |
| 2003/0058469 | A1* | 3/2003 | Buis et al. .................. 358/1.15 |
| 2003/0061572 | A1 | 3/2003 | McClannahan et al. |
| 2003/0062889 | A1 | 4/2003 | Ely et al. |
| 2003/0080755 | A1 | 5/2003 | Kobayashi |
| 2003/0097640 | A1 | 5/2003 | Abrams et al. |
| 2003/0105620 | A1 | 6/2003 | Bowen |
| 2003/0126947 | A1 | 7/2003 | Moore et al. |
| 2003/0135842 | A1 | 7/2003 | Frey et al. |
| 2003/0149961 | A1 | 8/2003 | Kawai et al. |
| 2003/0229482 | A1 | 12/2003 | Cook et al. |
| 2003/0229877 | A1 | 12/2003 | Bersch et al. |
| 2004/0054821 | A1 | 3/2004 | Warren et al. |
| 2004/0153802 | A1 | 8/2004 | Kudo et al. |
| 2004/0205553 | A1* | 10/2004 | Hall et al. .................. 715/513 |
| 2004/0205617 | A1* | 10/2004 | Light ........................ 715/523 |

| | | | |
|---|---|---|---|
| 2004/0205695 | A1 | 10/2004 | Fletcher |
| 2004/0221238 | A1 | 11/2004 | Cifra et al. |
| 2005/0024341 | A1 | 2/2005 | Gillespie et al. |
| 2005/0143968 | A9 | 6/2005 | Odom et al. |
| 2005/0240917 | A1 | 10/2005 | Wu |
| 2005/0248534 | A1 | 11/2005 | Kehlstadt |
| 2005/0280453 | A1 | 12/2005 | Hsieh |
| 2006/0032680 | A1 | 2/2006 | Elias et al. |
| 2006/0097991 | A1 | 5/2006 | Hotelling et al. |
| 2006/0273804 | A1 | 12/2006 | Delorme et al. |
| 2007/0139074 | A1 | 6/2007 | Reblewski |
| 2008/0095213 | A1 | 4/2008 | Lin et al. |
| 2008/0186052 | A1 | 8/2008 | Needham et al. |
| 2008/0259998 | A1 | 10/2008 | Venkataraman et al. |

FOREIGN PATENT DOCUMENTS

| | | | |
|---|---|---|---|
| EP | 0308583A2 | A1 | 3/1989 |
| EP | 368398 | A1 | 5/1990 |
| EP | 0450863A2 | A1 | 10/1991 |
| EP | 0499383A2 | A1 | 8/1992 |
| EP | 0639816A2 | A1 | 2/1995 |
| EP | 1170671A1 | A1 | 1/2002 |
| EP | 1205848 | A1 | 5/2002 |
| EP | 1191423A2 | A1 | 2/2003 |
| JP | 404083405 | A1 | 3/1992 |
| JP | 405055842 | A1 | 3/1993 |
| JP | 06021732 | A1 | 1/1994 |
| JP | 404095408 | A1 | 3/2002 |
| WO | 9532478 | A1 | 11/1995 |
| WO | PCT/US96/17305 | A1 | 6/1996 |
| WO | PCT/US98/34376 | A1 | 8/1998 |
| WO | PCT/US99/09712 | A1 | 2/1999 |

OTHER PUBLICATIONS

"OMG XML Metadata Interchange (XMI) Specification", 2000, section 1.*

"PSoC designer: Integrated development environment, getting started 25-minute tutorial, version 1.0", Cypress Microsystems., Cypress Microsystems, Inc. CMS10006A, Jul. 3, 2001. pp. 1-25.

"PSoC technology complete changes 8-bit MCU system design", Cypress Microsystem, Inc., retrieved from <http://www.archive.org/web/20010219005250/http://cypressmicro.com-/t . . . >, Feb. 19, 2001. pp. 1-21.

Specks et al., "A Mixed Digital-Analog 16B Microccontroller with 0.5MB Flash Memory, On-Chip Power Supply, Physical Network Interface, and 40V I/O for Automotive Single-Chip Mechatronics," IEEE, Feb. 9, 2000, pp. 348-349.

Hsieh et al., "Modeling Micro-Controller Peripherals for High-Level Co-Simulation and Synthesis," IEEE, 1997, pp. 127-130.

USPTO Non-Final Rejection Dated Mar. 2, 2006 for U.S. Appl. No. 10/001,477.

USPTO Final Rejection Dated Feb. 13, 2006 for U.S. Appl. No. 09/994,600.

USPTO Final Rejection Dated May 4, 2005 for U.S. Appl. No. 09/994,600.

USPTO Final Rejection Dated Oct. 17, 2007 for U.S. Appl. No. 09/994,600.

USPTO Final Rejection Dated Dec. 8, 2006 for U.S. Appl. No. 09/994,600.

USPTO Notice of Improper Request for RCE Dated Nov. 6, 2006 for U.S. Appl. No. 09/994,600.

USPTO Non-Final Rejection Dated Jul. 17, 2006 for U.S. Appl. No. 09/994,600.

USPTO Non-Final Rejection Dated May 15, 2007 for U.S. Appl. No. 09/994,600.

USPTO Non-Final Rejection Dated Aug. 23, 2005 for U.S. Appl. No. 09/994,600.

USPTO Non-Final Rejection Dated Oct. 21, 2004 for U.S. Appl. No. 09/994,600.

USPTO Non-Final Rejection Dated May 14, 2008 for U.S. Appl. No. 09/994,600.

USPTO Non-Final Rejection Dated Nov. 12, 2008 for U.S. Appl. No. 09/994,600.

USPTO Final Rejection Dated Jun. 30, 2008 for U.S. Appl. No. 10/001,477.

USPTO Final Rejection Dated Jul. 23, 2007 for U.S. Appl. No. 10/001,477.

USPTO Final Rejection Dated Aug. 24, 2006 for U.S. Appl. No. 10/001,477.

USPTO Final Rejection Dated Oct. 24, 2005 for U.S. Appl. No. 10/001,477.

USPTO Non-Final Rejection Dated Jan. 22, 2007 for U.S. Appl. No. 10/001,477.

USPTO Non-Final Rejection Dated May 16, 2005 for U.S. Appl. No. 10/001,478.

USPTO Non-Final Rejection Dated Oct. 20, 2008 for U.S. Appl. No. 10/001,478.

USPTO Non-Final Rejection Dated Dec. 14, 2007 for U.S. Appl. No. 09/989,782.

USPTO Final Rejection Dated Feb. 10, 2005 for U.S. Appl. No. 10/008,096.

USPTO Final Rejection Dated Jun. 16, 2008 for U.S. Appl. No. 10/008,096.

USPTO Final Rejection Dated Sep. 4, 2007 for U.S. Appl. No. 10/008,096.

USPTO Final Rejection Dated Oct. 13, 2006 for U.S. Appl. No. 10/008,096.

USPTO Final Rejection Dated Nov. 25, 2005 for U.S. Appl. No. 10/008,096.

USPTO Non-Final Rejection Dated Mar. 7, 2007 for U.S. Appl. No. 10/008,096.

USPTO Non-Final Rejection Dated Apr. 17, 2006 for U.S. Appl. No. 10/008,096.

USPTO Non-Final Rejection Dated Jun. 14, 2004 for U.S. Appl. No. 10/008,096.

USPTO Non-Final Rejection Dated Jun. 24, 2005 for U.S. Appl. No. 10/008,096.

USPTO Non-Final Rejection Dated Dec. 12, 2007 for U.S. Appl. No. 10/008,096.

USPTO Notice of Allowance Dated Dec. 22, 2008 for U.S. Appl. No. 10/008,096.

USPTO Final Rejection Dated Jun. 4, 2008 for U.S. Appl. No. 10/001,478.

USPTO Final Rejection Dated Sep. 5, 2006 for U.S. Appl. No. 10/001,478.

USPTO Final Rejection Dated Sep. 17, 2007 for U.S. Appl. No. 10/001,478.

USPTO Final Rejection Dated Oct. 24, 2005 for U.S. Appl. No. 10/001,478.

USPTO Non-Final Rejection Dated Jan. 30, 2008 for U.S. Appl. No. 10001478.

USPTO Non-Final Rejection Dated Mar. 15, 2006 for U.S. Appl. No. 10/001,478.

USPTO Non-Final Rejection Dated Apr. 2, 2007 for U.S. Appl. No. 10/001,478.

USPTO Non-Final Rejection Dated Aug. 23, 2006 for U.S. Appl. No. 09/989,771.

USPTO Non-Final Rejection Dated Sep. 12, 2005 for U.S. Appl. No. 09/989,771.

USPTO Non-Final Rejection Dated Sep. 22, 2004 for U.S. Appl. No. 09/989,771.

USPTO Final Rejection Dated Apr. 3, 2007 for U.S. Appl. No. 09/989,765.

USPTO Final Rejection Dated Apr. 4, 2008 for U.S. Appl. No. 09/989,765.

USPTO Final Rejection Dated Apr. 17, 2006 for U.S. Appl. No. 09/989,765.

USPTO Non-Final Rejection Dated Sep. 19, 2007 for U.S. Appl. No. 09/989,765.

USPTO Non-Final Rejection Dated Sep. 26, 2008 for U.S. Appl. No. 09/989,765.

USPTO Non-Final Rejection Dated Oct. 2, 2006 for U.S. Appl. No. 09/989,765.

USPTO Non-Final Rejection Dated Oct. 5, 2005 for U.S. Appl. No. 09/989,765.
USPTO Final Rejection Dated Jul. 9, 2008 for U.S. Appl. No. 09/989,782.
USPTO Final Rejection Dated Jul. 24, 2007 for U.S. Appl. No. 09/989,782.
USPTO Final Rejection Dated Sep. 21, 2006 for U.S. Appl. No. 09/989,782.
USPTO Final Rejection Dated Nov. 3, 2005 for U.S. Appl. No. 09/989,782.
USPTO Non-Final Rejection Dated Jan. 29, 2007 for U.S. Appl. No. 09/989,782.
USPTO Non-Final Rejection Dated Mar. 28, 2006 for U.S. Appl. No. 09/989,782.
USPTO Non-Final Rejection Dated Apr. 29, 2005 for U.S. Appl. No. 09/989,782.
USPTO Non-Final Rejection Dated Oct. 6, 2004 for U.S. Appl. No. 09/989,782.
USPTO Non-Final Rejection Dated Nov. 26, 2008 for U.S. Appl. No. 09/989,782.
USPTO Non-Final Rejection Dated Jan. 29, 2007 for U.S. Appl. No. 09/998,848.
USPTO Non-Final Rejection Dated Feb. 22, 2008 for U.S. Appl. No. 09/998,848.
USPTO Non-Final Rejection Dated Dec. 21, 2004 for U.S. Appl. No. 09/998,848.
USPTO Final Rejection Dated Jan. 11, 2007 for U.S. Appl. No. 09/989,767.
USPTO Final Rejection Dated Jan. 15, 2009 for U.S. Appl. No. 09/989,767.
USPTO Final Rejection Dated Mar. 6, 2006 for U.S. Appl. No. 09/989,767.
USPTO Final Rejection Dated Apr. 6, 2005 for U.S. Appl. No. 09/989,767.
USPTO Final Rejection Dated Dec. 27, 2007 for U.S. Appl. No. 09/989,767.
USPTO Non-Final Rejection Dated Jul. 17, 2006 for U.S. Appl. No. 09/989,767.
USPTO Non-Final Rejection Dated Jul. 2, 2007 for U.S. Appl. No. 09/989,767.
USPTO Non-Final Rejection Dated Jul. 24, 2008 for U.S. Appl. No. 09/989,767.
USPTO Non-Final Rejection Dated Oct. 6, 2004 for U.S. Appl. No. 09/989,767.
USPTO Final Rejection Dated Feb. 27, 2007 for U.S. Appl. No. 09/989,771.
USPTO Final Rejection Dated Mar. 28, 2006 for U.S. Appl. No. 09/989,771.
USPTO Final Rejection Dated Apr. 6, 2005 for U.S. Appl. No. 09/989,771.
USPTO Final Rejection Dated Dec. 10, 2008 for U.S. Appl. No. 09/989,771.
USPTO Final Rejection Dated Dec. 27, 2007 for U.S. Appl. No. 09/989,771.
USPTO Non-Final Rejection Dated May 28, 2008 for U.S. Appl. No. 09/989,771.
USPTO Non-Final Rejection Dated Jul. 16, 2007 for U.S. Appl. No. 09/989,771.
USPTO Non-Final Rejection Dated Sep. 21, 2005 for U.S. Appl. No. 09/994,601.
USPTO Non-Final Rejection Dated Oct. 4, 2007 for U.S. Appl. No. 09/994,601.
USPTO Non-Final Rejection Dated Nov. 14, 2006 for U.S. Appl. No. 09/994,601.
USPTO Notice of Allowance Dated Dec. 22, 2008 for U.S. Appl. No. 09/994,601.
USPTO Advisory Action Dated May 15, 2006 for U.S. Appl. No. 09/989,778.
USPTO Final Rejection Dated Jan. 8, 2009 for U.S. Appl. No. 09/989,778.
USPTO Final Rejection Dated Feb. 5, 2007 for U.S. Appl. No. 09/989,778.
USPTO Final Rejection Dated Feb. 15, 2006 for U.S. Appl. No. 09/989,778.
USPTO Final Rejection Dated Dec. 20, 2007 for U.S. Appl. No. 09/989,778.
USPTO Non-Final Rejection Dated Mar. 29, 2005 for U.S. Appl. No. 09/989,778.
USPTO Non-Final Rejection Dated Jul. 14, 2008 for U.S. Appl. No. 09/989,778.
USPTO Non-Final Rejection Dated Jul. 19, 2007 for U.S. Appl. No. 09/989,778.
USPTO Non-Final Rejection Dated Sep. 1, 2005 for U.S. Appl. No. 09/989,778.
USPTO Non-Final Rejection Dated Sep. 18, 2006 for U.S. Appl. No. 09/989,778.
USPTO Final Rejection Dated Jun. 14, 2005 for U.S. Appl. No. 09/998,848.
USPTO Final Rejection Dated Jul. 25, 2006 for U.S. Appl. No. 09/998,848.
USPTO Final Rejection Dated Aug. 10, 2007 for U.S. Appl. No. 09/998,848.
USPTO Final Rejection Dated Nov. 24, 2008 for U.S. Appl. No. 09/998,848.
USPTO Non-Final Rejection Dated Jan. 26, 2006 for U.S. Appl. No. 09/998,848.
USPTO Advisory Action Dated May 23, 2006 for U.S. Appl. No. 09/994,601.
USPTO Final Rejection Dated Mar. 8, 2006 for U.S. Appl. No. 09/994,601.
USPTO Final Rejection Dated Mar. 24, 2005 for U.S. Appl. No. 09/994,601.
USPTO Final Rejection Dated Apr. 17, 2008 for U.S. Appl. No. 09/994,601.
USPTO Final Rejection Dated May 18, 2007 for U.S. Appl. No. 09/994,601.
USPTO Non-Final Rejection Dated Jul. 29, 2004 for U.S. Appl. No. 09/994,601.
USPTO Notice of Allowance Dated Jul. 7, 2008 for U.S. Appl. No. 09/989,777.
USPTO Notice of Allowance Dated Sep. 15, 2008 for U.S. Appl. No. 09/989,777.
USPTO Notice of Allowance Dated Nov. 4, 2008 for U.S. Appl. No. 09/989,777.
USPTO Ex Parte Qualyle Dated Jun. 18, 2007 for U.S. Appl. No. 09/992,076.
USPTO Final Rejection Dated Jan. 30, 2007 for U.S. Appl. No. 09/992,076.
USPTO Final Rejection Dated Mar. 17, 2006 for U.S. Appl. No. 09/992,076.
USPTO Non-Final Rejection Dated Jun. 1, 2005 for U.S. Appl. No. 09/992,076.
USPTO Non-Final Rejection Dated Aug. 10, 2006 for U.S. Appl. No. 09/992,076.
USPTO Non-Final Rejection Dated Nov. 21, 2005 for U.S. Appl. No. 09/992,076.
USPTO Notice of Allowance Dated Mar. 26, 2008 for U.S. Appl. No. 09/992,076.
USPTO Notice of Allowance Dated Jul. 29, 2008 for U.S. Appl. No. 09/992,076.
USPTO Notice of Allowance Dated Nov. 13, 2008 for U.S. Appl. No. 09/992,076.
USPTO Notice of Allowance Dated Nov. 29, 2007 for U.S. Appl. No. 09/992,076.
USPTO Non-Final Office Action Dated May 11, 2005 for U.S. Appl. No. 10/001,477.
USPTO Non-Final Office Action Dated Dec. 6, 2007 for U.S. Appl. No. 10/001,477.
USPTO Notice of Allowance Dated Nov. 10, 2008 for U.S. Appl. No. 10/001,477.
USPTO Final Office Action Dated Feb. 6, 2006 for U.S. Appl. No. 10/002,217.
USPTO Final Office Action Dated Mar. 7, 2007 for U.S. Appl. No. 10/002,217.

USPTO Final Office Action Dated Nov. 17, 2005 for U.S. Appl. No. 10/002,217.
USPTO Non-Final Office Action Dated Apr. 3, 2006 for U.S. Appl. No. 10/002,217.
USPTO Non-Final Office Action Dated May 19, 2005 for U.S. Appl. No. 10/002,217.
USPTO Non-Final Office Action Dated Aug. 3, 2007 for U.S. Appl. No. 10/002,217.
USPTO Non-Final Office Action Dated Oct. 2, 2006 for U.S. Appl. No. 10/002,217.
USPTO Notice of Allowance Dated Jun. 6, 2008 for U.S. Appl. No. 10/002,217.
USPTO Notice of Allowance Dated Oct. 14, 2008 for U.S. Appl. No. 10/002,217.
USPTO Final Office Action Dated Jan. 30, 2008 for U.S. Appl. No. 09/989,777.
USPTO Final Office Action Dated Mar. 13, 2007 for U.S. Appl. No. 09/989,777.
USPTO Final Office Action Dated Dec. 21, 2005 for U.S. Appl. No. 09/989,777.
USPTO Non-Final Office Action Dated Apr. 11, 2006 for U.S. Appl. No. 09/989,777.
USPTO Non-Final Office Action Dated Jul. 5, 2005 for U.S. Appl. No. 09/989,777.
USPTO Non-Final Office Action Dated Sep. 11, 2007 for U.S. Appl. No. 09/989,777.
USPTO Non-Final Office Action Dated Sep. 13, 2006 for U.S. Appl. No. 09/989,777.
U.S. Appl. No. 09/964,991: "A Novel Band-Gap Circuit for Providing an Accurate Reference Voltage Compensated for Process State, Process Variations and Temperature," Kutz et al.; 25 pages.
U.S. Appl. No. 09/842,966: "Precision Crystal Oscillator Circuit Used in Microcontroller," Mar; 28 pages.
"An Analog PPL-Based Clock and Data Recovery Circuit with High Input Jitter Tolerance;" Sun, Reprinted from IEEE Journal of Solid-State Circuits, 1989; 4 pages.
"WP 3.5: An Integrated Time Reference;" Blauschild, Digest of Technical Papers, 1994; 4 pages.
"Micropower CMOS Temperature Sensor with Digital Output;" Bakker et al., IEEE Journal of Solid-States Circuits, 1996; 3 pages.
USPTO Advisory Action for U.S. Appl. No. 10/001,477 dated Oct. 10, 2008; 3 pages.
USPTO Notice of Allowance for U.S. Appl. No. 10/002,217 dated Jan. 28, 2009; 4 pages.
U.S. Appl. No. 09/207,912: "Circuit(s), Architecture and Method(s) for Operating and/or Tuning a Ring Oscillator," Mar, 23 pages.
U.S. Appl. No. 09/943,062: "Apparatus and Method for Programmable Power Management in a Programmable Analog Circuit Block;" Mar; 46 pages.
U.S. Appl. No. 10/238,966: "Method for Parameterizing a User Module;" Perrin; 41 pages.
From U.S. Appl. No. 10/033,027: Goodenough, F. "Analog Counterparts of FPGAS Ease System Design" Electronic Design, Penton Publishing, Cleveland, OH, US vol. 42, No. 21, Oct. 14, 1994; 10 pages.
From U.S. Appl. No. 10/033,027: Harbaum, T. et al. "Design of a Flexible Coprocessor Unit" Proceedings of the Euromicro Conference, XX XX, Sep. 1999; 10 pages.
From U.S. Appl. No. 10/033,027; "Programmable Microcontroller (PSoC) Architecture (Mixed Analog/ Digital)"; Aug. 7, 2001; U.S. Appl. No. 09/924,734 Snyder et al.; 28 pages.
From U.S. Appl. No. 10/033,027; "Digital Configurable Macro Architecture"; Jul. 18, 2001; U.S. Appl. No. 09/909,045; Snyder; 37 pages.
From U.S. Appl. No. 10/033,027; "Configuring Digital Functions in a Digital Configurable Macro Architecture"; Jul. 18, 2001; U.S. Appl. No. 09/909,109; Snyder; 38 pages.
From U.S. Appl. No. 10/033,027; "A Programmable Analog System Architecture (As Amended)"; Jul. 18, 2001; U.S. Appl. No. 09/909,047; Mar; 60 pages.
From U.S. Appl. No. 10/033,027; "Programmable Methodology and Architecture for a Programmable Analog System (As Amended)"; Aug. 14, 2001; U.S. Appl. No. 09/930,021; Mar et al.; 87 pages.

From U.S. Appl. No. 10/033,027; "Method for Synchronizing and Resetting Clock Signals Supplied to Multiple Programmable Analog Blocks (As Amended)"; Oct. 1, 2001; U.S. Appl. No. 09/969;311; Sullam; 57 pages.
From U.S. Appl. No. 10/033,027; "Method and Apparatus for Programming a Flash Memory"; Jun. 5, 2001; U.S. Appl. No. 09/875,599; Snyder; 23 pages.
From U.S. Appl. No. 10/033,027; "In-System Chip Emulator Architecture"; Oct. 10, 2001; U.S. Appl. No. 09/975,115; Snyder et al.; 38 pages.
From U.S. Appl. No. 10/033,027; "A Configurable Input/Output Interface for a Microcontroller"; Sep. 14, 2001; U.S. Appl. No. 09/953,423; Kutz et al.; 28 pages.
From U.S. Appl. No. 10/033,027; "Multiple Use of Microcontroller Pad"; Jun. 26, 2001; U.S. Appl. No. 09/893,050; Kutz et al.; 21 pages.
From U.S. Appl. No. 10/033,027; "Programming Architecture for a Programmable Analog System"; Aug. 14, 2001; U.S. Appl. No. 09/929,891; Mar et al.; 82 pages.
From U.S. Appl. No. 10/033,027: "Architecture for Synchronizing and Resetting Clock Signals Supplied to Multiple Analog Programmable Analog Blocks"; Oct. 1, 2001; U.S. Appl. No. 09/969,313; Sullam; 50 pages.
U.S. Appl. No. 10/011,214: "Method and Circuit for Synchronizing a Write Operation between an On-Chip Microprocessor and an On-Chip Programmable Analog Device Operating at Different Frequencies;" Sullam; 49 pages.
U.S. Appl. No. 09/935,454: "Method and Apparatus for Local and Global Power Management in a Programmable Analog Circuit;" Mar; 51 pages.
U.S. Appl. No. 09/923,461: "Non-Interfering Multiply-Mac (Multiply Accumulate) Circuit;" Snyder; 25 pages.
U.S. Appl. No. 09/922,579: "A Method for a Efficient Supply to a Microcontroller;" Kutz; 37 pages.
Hintz et al.; "Microcontrollers", 1992, McGraw-Hill; 11 pages.
Ganapathy, Gopi, and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, Jun. 3-7, 1996; 4 pages.
U.S. Appl. No. 60/243,708 "Advanced Programmable Microcontroller Device"; 277 pages.
"Webster's Third New International Dictionary", 1996, G. & C. Merriam Company; 3 pages.
U.S. Appl. No. 09/957,084; "A Crystal-Less Oscillator with Trimmable Analog Current Control for Increased Stability;" Mar; 28 pages.
U.S. Appl. No. 09/969,313: "Architecture for Synchronizing and Resetting Clock Signals Supplied to Multiple Analog Programmable System on a Chip Block;" Sullam; 50 pages.
U.S. Appl. No. 09/972,319: "Method for Applying Instructions to Microprocessor in Test Mode:" Snyder; 31 pages.
U.S. Appl. No. 09/972,003: "Test Architecture for Microcontroller Providing for a Serial Communication Interface;" Snyder; 32 pages.
U.S. Appl. No. 09/972,133: "Method for Entering Circuit Test Mode;" Snyder; 30 pages.
U.S. Appl. No. 09/973,535: "Architecture for Decimation Algorithm:" Snyder; 26 pages.
U.S. Appl. No. 09/977,111: A Frequency Doubler Circuit with Trimmable Current Control; Shutt; 35 pages.
U.S. Appl. No. 10/272,231: "Digital Configurable Macro Architecture;" Snyder; 36 pages.
U.S. Appl. No. 11/125,554: "A Method for a Efficient Supply to a Microcontroller;" Kutz; 1 page.
U.S. Appl. No. 09/855,868: "Protecting Access to Microcontroller Memory Blocks;" Snyder; 28 pages.
U.S. Appl. No. 09/887,923: "Novel Method and System for Interacting between a Processor and a Power on Reset to Dynamically Control Power States in a Microcontroller;" Kutz; 44 pages.
U.S. Appl. No. 10/000,383; "System and Method of Providing a Programmable Clock Architecture for and Advanced Microcontroller;" Sullam; 34 pages.
U.S. Appl. No. 10/001,477: "Breakpoint Control in an In-Circuit Emulation System;" Roe; 43 pages.

U.S. Appl. No. 10/004,197: "In-Circuit Emulator with Gatekeeper Based Halt Control;" Nemecek; 47 pages.
U.S. Appl. No. 10/004,039: "In-Circuit Emulator with Gatekeeper for Watchdog Timer;" Nemecek; 46 pages.
U.S. Appl. No. 10/002,217: "Conditional Branching in an in-Circuit Emulation System," Nemecek; 43 pages.
U.S. Appl. No. 10/001,568: "Combined In-Circuit Emulator and Programmer;" Nemecek; 47 pages.
U.S. Appl. No. 10/001,478: "In-Circuit Emulator and POD Synchronized Boot;" Nemecek; 44 pages.
U.S. Appl. No. 09/887,955: "Novel Power on Reset Circuit for Microcontroller;" Kutz; 42 pages.
U.S. Appl. No. 09/826,397: "Method and Circuit for Allowing a Microprocessor to Change its Operating Frequency on-the-fly;" Sullam; 24 pages.
U.S. Appl. No. 09/893,048: "A Microcontroller having an On-Chip High Gain Amplifier;" Kutz; 22 pages.
U.S. Appl. No. 09/912,768: "A Microcontroller having a Dual Mode Relax Oscillator that is Trimmable;" Shutt; 33 pages.
U.S. Appl. No. 09/922,419; "A Power Supply Pump Circuit for a Microcontroller;" Kutz; 38 pages.
Bursky, "FPGA Combines Multiple interfaces and Logic," Electronic Design, vol. 48 No. 20, pp. 74-78 (Oct. 2, 2000); 5 pages.
Anonymous, "F/Port: Fast Parallel Port for the PC Installation Manual" Release 7.1, circa 1997, available for download from http://www.fapo.com/fport.htm; 25 pages.
Nam et al,; "Fast Development of Source-Level Debugging System Using Hardware Emulation"; IEEE 2000; 4 pages.
Huang at al.; "Iceberg: An Embedded In-Cicuit Emulator Synthesizer for Microcontrollers"; ACM 1999; 6 pages.
Khan at al.; "FPGA Architectures for Asic Hardware Emulators"; IEEE 1993; 5 pages.
Oh et al.; Emulator Environment Based on an FPGA Prototyping Board; IEEE Jun. 21-23, 2000; 6 pages.
Hong et al.; "An FPGA-Based Hardware Emulator for Fast Fault Emulation"; IEEE 1997; 4 pages.
Ching et al.; "An In-Curcuit-Emulator for TMS320C25"; IEEE 1994; 6 pages.
Pasternak; "In-Circuit-Emulation in ASIC Architecture Cor Designs"; IEEE 1989; 4 pages.
Melear; "Using Background Modes for Testing, Debugging and Emulation of Microcontrollers"; IEEE 1997; 8 pages.
Walters, Stephen; "Computer-Aided Prototyping for ASIC-Based Systems", 1991, IEEE Design & Test of Computers; vol. 8, Issue 2; 8 pages.
Anonymous; "JEEN JTAG Embedded Ice Ethernet Interface"; Aug. 1999; Embedded Performance, Inc.; 3 pages.
Sedory; "A Guide to Debug"; 2004; retrieved on May 20, 2005; 7 pages.
"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.
Xerox; "Mesa Debugger Documentation"; Apr. 1979; Xerox Systems Development Department; Version 5.0; 33 pages.
Stallman et al.; "Debugging with the GNU Source-Level Debugger"; Jan. 1994; retrieved on May 2, 2005 from http://www.cs.utah.edu; 4 pages.
Wikipedia.org; "Von Neumann architecture"; retrieved from http://en.wikipedia.org/wiki/Von_Neumann_architecture on Jan. 22, 2007; 4 pages.
Stan Augarten; "The Chip Collection - Introduction - Smithsonian Institute"; "State of the Art"; "The First 256-Bit Static RAM"; retrieved on November 14, 2005 from http://smithsonianchips.si.edu/augarten/p24.htm; 2 pages.
"POD - Piece of Data, Plain Old Documentation, Plain Old Dos . . . "; retrieved on November 14, 2005 from http://www.auditmypc.com/acronym/POD.asp; 2 pages.
"Pod-Wikipedia, the free encyclopedia"; retrieved on Nov. 14, 2005 from http://en.wikipedia.org/wiki/Pod; 3 pages.
"pod-defintion by dict.die.net"; retrieved on Nov. 14, 2005 from http://dict.die.net/pod; 2 pages.

"In-Curcuit Emulators - descriptions of the major ICEs around"; retrieved on Nov. 14, 2005 from http://www.algonet.se/~staffann/developer/emulator.htm; 6 pages.
"Capturing Test/Emulation and Enabling Real-Time Debugging Using FPGA for In-Circuit Emulation;" Oct. 10, 2001; U.S. Appl. No. 09/975,104; Snyder; 35 pages.
"Host to FPGA Interface in an In-Circuit Emulation System;" Oct. 10, 2001; U.S. Appl. No. 09/975,105; Nemecek; 44 pages.
Anonymous; "Using Debug"; 1999; Prentice-Hall Publishing; 20 pages.
Harrison et al.; "Xilinx FPGA Design in a Group Environment Using VHDS and Synthesis Tools"; Colloquium on Digital System Design Using Synthesis Techniques; Feb. 15, 1996; 4 pages.
Microsoft Press Computer User's Dictionary; 1998; 3 pages.
Sreeram Duvvuru and Siamak Arya, "Evaluation of a Branch Target Address Cache," 1995; IEEE; 8 pages.
Andrew S. Tanenbaum with contributions from James R. Goodman, "Structured Computer Organization," 1999, Prentice Hall, Fourth Edition; 32 pages.
"Method for Breaking Execution of a Test Code in DUT and Emulator Chip Essentially Simultaneously and Handling Complex Breakpoint Events;" Oct. 10, 2001; U.S. Appl. No. 09/975,338; Nemecek et al.; 34 pages.
"Emulator Chip-Board Architecture for Interface;" Oct. 10, 2001; U.S. Appl. No. 09/975,030; Snyder et al.; 37 pages.
Wikipedia - Main p., retrieved on Mar. 8, 2006 from http://en.wikipedia.org/wiki/Main_Page and http://en,wikipedia.org/wiki/Wikipedia:Introduction; 5 pages.
Wikipedia - Processor register, retrieved on Mar. 7, 2006 from http://en.wikipedia.org/wiki/Processor_register; 4 pages.
Jonathan B. Rosenburg, "How Debuggers Work" John Wiley & Sons, Inc. 1996; 259 pages.
Dahl, et al.; "Emulation of the Sparcle Microprocessor with the MIT Virtual Wires Emulation System"; 1994; IEEE; 9 pages.
Bauer et al.; "A Reconfigurable Logic Machine for Fast Event-Driven Simulation"; 1998; Design Automation Conference Proceedings; 8 pages.
U.S. Appl. No. 10/803,030: "Programmable Microcontrollable Architecture (Mixed Analog/Digital);" Snyder; 13 pages.
U.S. Appl. No. 10/033,027: "Microcontrollable Programmable System on a Chip;" Snyder; 117 pages.
Robinson, Gordon D; "Why 1149.1 (JTAG) Really Works", May 1994, Conference Proceedings Electro/94 International, May 10-12, 1994, Combined Volumes; 6 pages.
Monte Mar, Bert Sullam, Eric Blom; "An architecture for a configurable Mixed-signal device", 2003, IEEE Journal of Solid-State Circuits, vol. 3; 4 pages.
Julio Faura et al.; "A Novel Mixed Signal Programmable Device With On-Chip Microprocessor", 1997, IEEE 1997 Custom Integrated Circuits Conference; 4 pages.
Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, Sep. 18-24, 2000; 6 pages.
"New Object Domain R3 Beta Now Available (Build 134)!" Mar. 13, 2001; <http://web.archive.org/web/200100331202605/www.objectdomain.com/domain30/index,html>; 2 pages.
"OMG XML Metadata Interchange (XMl) Specifications" 2000; 17 pages.
Electronic Tools Company; E-Studio User Manuel; 2000; retrieved from http://web.archive.org for site http://e-tools.com on Mar. 23, 2005; 77 pages.
Cover Pages Technology Reports; XML and Electronic Design Automation (EDA); Aug. 2000; retrieved from http://xml.coverpages.org on Mar. 23, 2005; 5 pages.
Microsoft Computer Dictionary "ActiveX" 2002; Microsoft Press; 5th Edition; 3 pages.
Wikipedia "XLM" retrieved on Jan. 29, 2007 from http://en.wikipedia.org/wiki/XML; 16 pages.
"VHDL Samples" retrieved on Jan. 29, 2007 from http://www.csee.umbc.edu/help/VHDL/samples/samples.shtml; 10 pages.

Anonymous, "Lotus Notes FAQ—How do you generate unique document numbers?" Sep. 19, 1999; retrieved from www.keysolutions.com on Jul. 9, 2008; 1 page.
Ashok Bindra, "Programmable SoC Delivers A New Level Of System Flexibility"; Electronic Design; Nov. 6, 2000; 11 pages.
Cypress MicroSystem, Inc. "Cypres Customer Forums" retrieved from <http://www.cypress.com/forums/messageview>; messageview; 1 page.
Cypress MicroSystem, Inc. "PsoC Designer: Integrated Development Environment User Guide"; Rev. 1.18; Sep. 8, 2003; 193 pages.
Hamblen, "Rapid Prototyping Using Field-Programmable Logic Devices" Jun. 2000, IEEE; 9 pages.
Snyder et al., "Xilinx's A-to-Z Systems Platform" Cahners Microprocessor, The Insider's Guide to Microprocessor Hardware, Feb. 6, 2001; 6 pages.
"PSoC Technology Completely Changes 8-bit MCU System Design" Cypress MicroSystem, Inc. Feb. 19, 2001; 21 pages.
"PSoC Designer: Integrated Development Environment" User Guide; Revision 1.11; Last Revised Jul. 17, 2001; 109 pages.
Cypress Microsystems, "Cypress Microsystems Unveils Programmable System-on-a-Chip for Embedded Internet, Communications and Consumer Systems;" 2000, <http://www.cypressmicro.com/corporate/CY_Announces_nov_13_2000.html>; 3 pages.
Huang et al., Iceberg, An Embedded In-Circuit Emulator Synthesizer for Microcontrollers, Proceedings of the 36th Design Automation Conference 1999; 6 pages.
Yoo et al., "Fast Hardware-Software Co-verification by Optimistic Execution of Real Processor," Proceedings of Design, Automation and Test in Europe Conference and Exhibition 2000; 6 pages.
U.S. Appl. No. 10/113,064: "Method and System for Debugging through Supervisory Operating Codes and Self Modifying Codes," Roe et al.; 36 pages.
Hong et al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE, 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.
Atmel Corporation: AT9OSC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled," Derwent Information LTD; 2002; 2 pages.
Morrison, "IBM Eyes Merchant Packaging Services," Jul. 13, 1998; Electronic News <http://www.findarticles.com>; 4 pages.
Charles, Jr. et al., "Wirebonding: Reinventing the Process for MCMs," Apr. 1998; IEEE 7th International Conference on Multichip Modules and High Density Packaging; 3 pages.
Tran et al., "Fine Pitch and Wirebonding and Reliability of Aluminum Capped Copper Bond Pads," May 2000, IEEE Electronic Components and Technology Conference; 8 pages.

Song et al., "A 50% Power Reduction Scheme for CMOS Relaxation Oscillator," IEEE, 1999: 4 pages.
"Electronic Circuit Protector-Circuit Breaker;" IBM Technical Disclosure Bulletin; vol. 36, Issue 8, Aug. 1, 1993; 1 page.
U.S. Appl. No. 09/989,815: "A Data Driven Method and System for Monitoring Hardware Resource Usage for Programming an Electric Device;" Bartz et al.; 36 pages.
U.S. Appl. No. 09/275,336: "Programmable Oscillator Scheme;" Mar et al.; 25 pages.
U.S. Appl. No. 09/721,316: "Programmable Oscillator Scheme;" Mar et al.; 26 pages.
U.S. Appl. No. 10/324,455: "Programmable Oscillator Scheme;" Mar et al.; 23 pages.
U.S. Appl. No. 09/998,859: "A System and a Method for Checking Lock Step Consistency between in Circuit Emulation and a Microcontroller while Debugging Process is in Progress;" Nemecek; 33 pages.
U.S. Appl. No. 09/998,834: "A System and a Method for Communication between and Ice and a Production Microcontroller while in a Halt State;" Nemecek; 33 pages.
U.S. Appl. No. 10/113,065: "System and Method for Automatically Matching Components in a Debugging System:" Nemecek et al.; 32 pages.
U.S. Appl. No. 09/989,574: "Method and System for using a Graphics user Interface for Programming an Electronic Device;" Bartz et al.; 43 pages.
U.S. Appl. No. 09/989,816: "Datasheet Browsing and Creation with Data-Driven Datasheet Tabs within a Microcontroller Design Tool;" Bartz et al.; 55 pages.
U.S. Appl. No. 11/322,044, filed Dec. 28, 2005, Stiff.
U.S. Appl. No. 11/850,260: "Circuit and Method for Improving the Accuracy of a Crystal-less Oscillator Having Dual-Frequency Modes;" Wright et al.; 33 pages.
U.S. Appl. No. 11/644,100: "Differential-to-single ended signal converter circuit and method," Stiff; 33 pages.
U.S. Appl. No. 11/415,588: "Voltage Controlled Oscillator Delay Cell and Method," Sivadasan; 24 pages.
U.S. Appl. No. 12/218,404: "Voltage Controlled Oscillator Delay Cell and Method," Sivadasan; 23 pages.
U.S. Appl. No. 11/132,894: "Open Loop Bandwidth Test Architecture and Method for Phase Locked Loop (PLL)," Stiff; 38 pages.
U.S. Appl. No. 11/322,044: "Split charge pump PLL architecture," Stiff, 19 pages.
U.S. Appl. No. 10/305,589: "Current Controlled Delay Circuit," Stiff; 18 pages.
U.S. Appl. No. 09/849,164: "Reduced Static Phase Error CMOS PLL Charge Pump," Stiff; 30 pages.
Maneatis, "Low-Jitter Process-Independent DLL and PLL Based on Self-Biased Techniques," IEEE Journal of Solid-State Circuits, vol. 31, No. 11, Nov. 1996; 10 pages.
Larsson, "A 2-1600-MHz CMOS Clock Recovery PLL with Low-V dd Capability," IEEE Journal of Solid-State Circuits, vol. 34, No. 12, Dec. 1999; 10 pages.
U.S. Appl. No. 10/871,582: "LVDS Input Circuit with Extended Common Mode Range," Reinschmidt et al.; 25 pages.
U.S. Appl. No. 09/404,891: "Method, Architecture and Circuitry for Controlling Pulse Width in a Phase and/or Frequency Detector," Scott et al.; 17 pages.
U.S. Appl. No. 10/226,911: "Calibration of Integrated Circuit Time Constants," Gehring et al.; 32 pages.
U.S. Appl. No. 09/943,149: "Method for Phase Locking in a Phase Lock Loop," Moyal et al.; 21 pages.
Durham et al., "Integrated Continuous-Time Balanced Filters for 16-bit DSP Interfaces," IEEE, 1993; 6 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
U.S. Appl. No. 09/047,595: "Roving Range Control to Limit Receive PLL Frequency of Operation," Scott; 35 pages.
U.S. Appl. No. 09/216,460: "Circuit and Method for Controlling an Output of a Ring Oscillator," Abugharbieh et al.; 21 pages.

U.S. Appl. No. 09/471,914: "Reference-Free Clock Generator and Data Recovery PLL," Dalmia et al.; 32 pages.
U.S. Appl. No. 09/471,576: "Reference-Free Clock Generation and Data Recovery PLL," Dalmia; 30 pages.
U.S. Appl. No. 10/083,442: "Method/Architecture for a Low Gain PLL with Wide Frequency Range," Meyers et al.; 28 pages.
U.S. Appl. No. 09/470,665: "Digital Phase/Frequency Detector, and Clock Generator and Data Recovery PLL Containing the Same," Dalmia; 26 pages —.
U.S. Appl. No. 09/893,161: "Architecture of a PLL with Dynamic Frequency Control on a PLD," Moore; 32 pages.
U.S. Appl. No. 09/608,753: "PLL Lockout Watchdog," Wilson et al.; 24 pages.
U.S. Appl. No. 09/398,956: "Frequency Acquisition Rate Control in Phase Lock Loop Circuits," Moyal et at; 35 pages.
U.S. Appl. No. 09/747,262: "Linearized Digital Phase-Locked Loop," Williams et al.; 9 pages.
U.S. Appl. No. 09/981,448: "Oscillator Tuning Method," Hauck; 28 pages.
U.S. Appl. No. 09/538,989: "Memory Based Phase Locked Loop," Krishnan; 27 pages.
U.S. Appl. No. 09/048,905: "Programmable Clock Generator," Mann et al.; 42 pages.
U.S. Appl. No. 08/865,342: "Programmable Clock Generator," Mann et al.; 41 pages.
U.S. Appl. No. 10/293,392: "Low Voltage Receiver Circuit and Method for Shifting the Differential Input Signals of the Receiver Depending on a Common Mode Voltage of the Input Signals," Maher et al.; 20 pages.
U.S. Appl. No. 10/288,003: "Low Voltage Differential Signal Driver Circuit and Method," Roper et al.; 30 pages.
U.S. Appl. No. 11/200,619: "Providing hardware independence to automate code generation of processing device firmware," Snyder et al.; 41 pages.
U.S. Appl. No. 11/201,922: "Design model for a hardware device-independent method of efining embedded firmware for programmable systems," McDonald et al.; 31 pages.
U.S. Appl. No. 11/201,627: "Method and an apparatus to design a processing system using a graphical user interface," Ogami et al.; 37 pages.
U.S. Appl. No. 09/989,808: "Automatic generation of application program interfaces, source code, interrupts, and data sheets for microcontroller programming," Bartz et al.; 67 pages.
U.S. Appl. No. 10/109,979: "Graphical user interface with logic unifying functions," Anderson et al. 100 pages.
U.S. Appl. No. 09/979,781: "System and method for decoupling and iterating resources associated with a module," Ogami at al.; 40 pages.
U.S. Appl. No. 09/989,775: "User defined names for registers in memory banks derived from configurations," Ogami et al.; 29 pages.
U.S. Appl. No. 09/989,819: "System and method for creating a boot file utilizing a boot template," Ogami et al.; 43 pages.
U.S. Appl. No. 09/989,761: "Storing of global parameter defaults and using them over two or more design projects," Ogami et al.; 37 pages.
Wang, et al. "Synthesizing Operating System Based Device Drivers in Embedded Systems," 2003, ACM; 8 pages.
Lutovac et al. "Symbolic Computation of Digital Filter Transfer Function Using MATLAB," Proceedings of 23rd International Conference on Microelectronics (MIEL 2002), vol. 2 NIS, Yugoslavia; 4 pages.
Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Xilinx, Virtex-II Pro Platform FPGA Developer's Kit, "How Data2BRAM Fits in with Hardware and Software Flows," Chapter 2: Using Data2BRAM; Jan. 2003 Release; 2 pages.
PCT Preliminary Report on Patentability (Chapter 1 of the Patent Cooperation Treaty), PCT/US/2005/028793, filed Aug. 12, 2005, mailed Dec. 21, 2007; 2 pages.
PCT Written Opinion of the International Searching Authority for PCT/US2005/028793, filed Aug. 12, 2005, mailed Nov. 19, 2007; 7 pages.

PCT International Search Report of the International Searching Authority for PCT/US05/28793, filed Aug. 12, 2005. mailed Nov. 19, 2007; 5 pages.
International Search Report and Written Opinion of the International Searching Authority for PCT/US05/28898, filed Aug. 12, 2005, mailed Mar. 6, 2007; 6 pages.
Burogs et al., "Power Converter Analysis and Design using Matlab: A Transfer Function Approach," Proceedings of IEEE International Symposium on Industrial Electronics 1998, vol, 2; 6 pages.
Efstathiou, "Analog Electronics: Basic Circuits of Operational Amplifiers," <http://web.archive.org/web/20021231045232> Dec. 31, 2002, version, retrieved from the Internet Archives; 10 pages.
PCT International Search Report for PCT/US05/28791, filed Aug. 12, 2005, mailed Mar. 31, 2008; 4 pages.
PCT International Written Opinion for PCT/US05/28791, filed Aug. 12, 2005, mailed Mar. 31, 2008; 8 pages.
Kory Hopkins, "Definition;" Jan. 16, 1997; <http://www.cs.sfu.ca/cs/people/GradStudent.html>; 1 page.
Ebeling et al., "Validating VLSI Circuit Layout by Wirelist Comparison;" Sep. 1983; in proceedings of the IEEE International Conference on Computer Aided Design (ICCAD-83); 2 pages.
"The Gemini Netlist Comparison Project;" <http://www.cs.washington.edu/research/projects/lis/www/gemini/gemini.html> larry@cs.washington.edu; 2 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Ebling, "Gemini II: A Second Generation Layout Validation Program;" 1988; in proceedings of the IEEE International Conference on Computer Aided Design (ICCAD-88); 4 pages.
U.S. Appl. No. 12/132,527: "System and Method for Performing Next Placements and Pruning of Disallowed Placements for Programming an Integrated Circuit;" Ogami et al.; 44 pages.
U.S. Appl. No. 12/356,468: "System and Method for Dynamically Generating a Configuration Datasheet," Anderson et al.; filed on Jan. 20, 2009; 27 pages.
U.S. Appl. No. 11/273,708: "Capacitance Sensor Using Relaxation Oscillators," Snyder et al.; 33 pages.
U.S. Appl. No. 11/337,272: "Successive Approximate Capacitance Measurement Circuit;" Snyder; 29 pages.
U.S. Appl. No. 11/983,291: "Successive Approximate Capacitance Measurement Circuit," Snyder; 26 pages.
U.S. Appl. No. 11/698,660: "Configurable Bus," Kutz et al.; 35 pages.
U.S. Appl. No. 11/709,866: "Input/Output Multiplexer Bus," Dennis Sequine; 33 pages.
Sedra et al., "Microelectronic Circuits," 3rd Edition, Oxford University Press; 20 pages.
Van Ess, David; "Simulating a 555 Timer with PSoC," Cypress Semiconductor Corporation, Application Note AN2286, May 19, 2005; 10 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "CY8C22x34 Data Sheet," CSR User Module, CSR V.10.0; Oct. 6, 2005; 36 pages.
Chapweske, Adam; "The PS/2 Mouse Interface," PS/2 Mouse Interfacing, 2001; 11 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Seguine, Ryan; "Layout Guidelines for PSoC CapSense," Cypress Semiconductor Corporation, Application Note AN2292; Jul. 22, 2005; 13 pages.
Lee, Mark; "EMC Design Considerations for PSoC CapSense Applications," Cypress Semiconductor Corporation, Application Note AN2318; Sep. 16, 2005; 6 pages.
Cypress Semiconductor Corporation, "Release Notes srn017," Jan. 24, 2007; 3 pages.

Cypress Semiconductor Corporation, "PSoC CY8C20x34 Technical Reference Manual (TRM)," PSoC CY8C20x34 TRM, Version 1.0, 2006; 220 pages.

USPTO Notice of Allowance for U.S. Appl. No. 10/238,966 dated Jan. 27, 2009; 4 pages.

USPTO Non-Final Rejection for U.S. Appl. No. 10/238,966 dated Jun. 30, 2008; 12 pages.

USPTO Non-Final Rejection for U.S. Appl. No. 10/238,966 dated Dec. 26, 2007; 12 pages.

USPTO Final Rejection for U.S. Appl. No. 10/238,966 dated Sep. 27, 2007; 9 pages.

USPTO Non-Final Rejection for U.S. Appl. No. 10/238,966 dated Apr. 19, 2007; 7 pages.

USPTO Non-Final Rejection for U.S. Appl. No. 10/238,966 dated Oct. 20, 2006; 8 pages.

USPTO Non-Final Rejection for U.S. Appl. No. 10/238,966 dated Apr. 6, 2006; 8 pages.

USPTO Notice of Allowance for U.S. Appl. No. 10/033,027 dated Mar. 31, 2009; 7 pages.

USPTO Non-Final Rejection for U.S. Appl. No. 10/033,027 dated Dec. 18, 2008; 5 pages.

USPTO Final Rejection for U.S. Appl. No. 10/033,027 dated Jun. 8, 2007; 8 pages.

USPTO Non-Final Rejection for U.S. Appl. No. 10/033,027 dated Dec. 21, 2006; 31 pages.

USPTO Final Rejection for U.S. Appl. No. 10/033,027 dated Aug. 9, 2006; 6 pages.

USPTO Non-Final Rejection for U.S. Appl. No. 10/033,027 dated Apr. 26, 2006; 26 pages.

USPTO Final Rejection for U.S. Appl. No. 10/033,027 dated Oct. 31, 2005; 24 pages.

USPTO Non-Final Rejection for U.S. Appl. No. 10/033,027 dated Apr. 20, 2005; 20 pages.

USPTO Non-Final Rejection for U.S. Appl. No. 10/033,027 dated Oct. 18, 2004; 17 pages.

USPTO Non-Final Rejection for U.S. Appl. No. 09/975,115 dated Oct. 9, 2008; 34 pages.

USPTO Final Rejection for U.S. Appl. No. 09/975,115 dated May 12, 2008; 33 pages.

USPTO Non-Final Rejection for U.S. Appl. No. 09/975,115 dated Jan. 7, 2008; 30 pages.

USPTO Non-Final Rejection for U.S. Appl. No. 09/975,115 dated Jul. 31, 2007; 28 pages.

USPTO Final Rejection for U.S. Appl. No. 09/975,115 dated Feb. 21, 2007; 25 pages.

USPTO Non-Final Rejection for U.S. Appl. No. 09/975,115 dated Oct. 31, 2006; 19 pages.

USPTO Final Rejection for U.S. Appl. No. 09/975,115 dated Jun. 23, 2006; 20 pages.

USPTO Non-Final Rejection for U.S. Appl. No. 09/975,115 dated Jan. 11, 2006; 15 pages.

USPTO Non-Final Rejection for U.S. Appl. No. 09/975,115 dated Jul. 27, 2005; 11 pages.

USPTO Non-Final Rejection for U.S. Appl. No. 09/975,115 dated Feb. 11, 2005; 86 pages.

USPTO Final Rejection for U.S. Appl. No. 09/975,338 dated Jan. 31, 2008; 21 pages.

USPTO Non-Final Rejection for U.S. Appl. No. 09/975,338 dated Aug. 14, 2007; 19 pages.

USPTO Final Rejection for U.S. Appl. No. 09/975,338 dated Feb. 27, 2007; 23 pages.

USPTO Non-Final Rejection for U.S. Appl. No. 09/975,338 dated Sep. 6, 2006; 11 pages.

USPTO Advisory Action for U.S. Appl. No. 09/975,338 dated May 15, 2006; 4 pages.

USPTO Final Rejection for U.S. Appl. No. 09/975,338 dated Jan. 18, 2006; 12 pages.

USPTO Non-Final Rejection for U.S. Appl. No. 09/975,338 dated Apr. 5, 2005; 13 pages.

USPTO Final Rejection for U.S. Appl. No. 10/113,065 dated Oct. 26, 2005; 17 pages.

USPTO Notice of Allowance for U.S. Appl. No. 10/113,065 dated Apr. 6, 2006; 8 pages.

USPTO Non-Final Rejection for U.S. Appl. No. 10/113,065 dated May 20, 2005; 14 pages.

USPTO Notice of Allowance for U.S. Appl. No. 09/998,834 dated May 19, 2005; 7 pages.

USPTO Non-Final Rejection for U.S. Appl. No. 09/998,834 dated Sep. 20, 2004; 11 pages.

USPTO Non-Final Rejection for U.S. Appl. No. 09/998,859 dated May 28, 2003; 6 pages.

USPTO Final Rejection for U.S. Appl. No. 09/998,859 dated Nov. 19, 2003; 5 pages.

USPTO Non-Final Rejection for U.S. Appl. No. 09/998,859 dated Nov. 4, 2004; 6 pages.

USPTO Notice of Allowance for U.S. Appl. No. 09/998,859 dated Mar. 14, 2005; 6 pages.

USPTO Non-Final Rejection for U.S. Appl. No. 09/998,859 dated May 15, 2003; 6 pages.

USPTO Non-Final Rejection for U.S. Appl. No. 10/324,455 dated Nov. 6, 2003; 4 pages.

USPTO Notice of Allowance for U.S. Appl. No. 09/975,105 dated Dec. 4, 2006; 4 pages.

USPTO Final Rejection for U.S. Appl. No. 09/975,105 dated Jul. 13, 2006; 7 pages.

USPTO Non-Final Rejection for U.S. Appl. No. 09/975,105 dated Jan. 19, 2006; 5 pages.

USPTO Non-Final Rejection for U.S. Appl. No. 09/975,105 dated Apr. 19, 2005; 9 pages.

USPTO Notice of Allowance for U.S. Appl. No. 10/001,477 dated May 8, 2009; 6 pages.

USPTO Non-Final Rejection for U.S. Appl. No. 10/324,455 dated Aug. 21, 2003; 4 pages.

USPTO Notice of Allowance for U.S. Appl. No. 10/324,455 dated Feb. 12, 2004; 4 pages.

USPTO Advisory Action for U.S. Appl. No. 09/998,848 dated Sep. 7, 2005; 3 pages.

Anonymous, "Warp Nine Engineering - The IEEE 1284 Experts-F/Port Product Sheet," undated web page found at http://www.fapo.com/fport.htm; printed on Apr. 12, 2005; 2 pages.

USPTO Final Rejection for U.S. Appl. No. 09/989,778 dated Mar. 16, 2009; 26 pages.

USPTO Final Rejection for U.S. Appl. No. 09/989,765 dated Mar. 31, 2009; 18 pages.

USPTO U.S. Appl. No. 09/975,105: "Host to FPGA Interface in an In-Circuit Emulation System," Craig Nernecek, filed on Oct. 10, 2001; 44 pages.

USPTO Non-Final Rejection for U.S. Appl. No. 09/989,767 dated Jul. 2, 2007; 22 pages.

USPTO Requirement for Restriction/Election for U.S. Appl. No. 11/818,005 dated Jul. 14, 2009; 5 pages.

USPTO U.S. Appl. No. 11/818,005: "Techniques for Generating Microcontroller Configuration Information," Ogami et al., filed on Jun. 12, 2007; 61 pages.

USPTO Non-Final Rejection for U.S. Appl. No. 10/002,726 dated Dec. 13, 2004; 7 pages.

USPTO Non-Final Rejection for U.S. Appl. No. 10/002,726 dated Jun. 10, 2005; 10 pages.

USPTO Final Rejection for U.S. Appl. No. 10/002,726 dated Nov. 30, 2005; 10 pages.

USPTO Final Rejection for U.S. Appl. No. 10/002,726 dated Mar. 27, 2006; 8 pages.

USPTO Non-Final Rejection for U.S. Appl. No. 10/002,726 dated Aug. 28, 2006; 10 pages.

USPTO Notice of Allowance for U.S. Appl. No. 10/002,726 dated Feb. 6, 2007; 7 pages.

USPTO U.S. Appl. No. 10/002,726: "Method and Apparatus for Generating Microcontroller Configuration Information," Ogami et al., filed on Oct. 24, 2001; 54 pages.

USPTO Non-Final Rejection for U.S. Appl. No. 10/113,064 dated Apr. 25, 2005; 15 pages.

USPTO Final Rejection for U.S. Appl. No. 10/113,064 dated Oct. 18, 2005; 22 pages.

USPTO Non-Final Rejection for U.S. Appl. No. 10/113,064 dated Apr. 6, 2006; 19 pages.

USPTO Final Rejection for U.S. Appl. No. 09/943,062 dated Apr. 30, 2004; 9 pages.
USPTO Notice of Allowance for U.S. Appl. No. 10/113,064 dated Sep. 21, 2006; 7 pages.
USPTO Miscellaneous Action for U.S. Appl. No. 09/943,062 dated Jan. 30, 2006; 2 pages.
USPTO Non-Final Rejection for U.S. Appl. No. 09/943,062 dated Dec. 8, 2003; 9 pages.
USPTO Advisory Action for U.S. Appl. No. 09/943,062 dated Sep. 25, 2003; 3 pages.
USPTO Final Rejection for U.S. Appl. No. 09/943,062 dated Jun. 27, 2003; 8 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Sep. 11, 2002; 9 pages.
USPTO Non-Final Rejection for U.S. Appl. No. 09/943,062 dated Jun. 22, 2007; 12 pages.
USPTO Final Rejection for U.S. Appl. No. 09/943,062 dated Jan. 18, 2008; 8 pages.
USPTO Advisory Action for U.S. Appl. No. 09/943,062 dated Mar. 27, 2008; 3 pages.
USPTO Notice of Allowance for U.S. Appl. No. 09/930,021 dated Nov. 26, 2004; 4 pages.
USPTO Final Rejection for U.S. Appl. No. 09/930,021 dated Aug. 31, 2004; 8 pages.
USPTO Non-Final Rejection for U.S. Appl. No. 09/930,021 dated Apr. 26, 2004; 6 pages.
USPTO Miscellaneous Action with SSP for U.S. Appl. No. 09/930,021 dated Oct. 1, 2001; 1 page.
USPTO Notice of Allowance for U.S. Appl. No. 09/953,423 dated Jul. 12, 2004; 6 pages.
USPTO Non-Final Rejection for U.S. App. No. 09/953,423 dated Feb. 6, 2004; 5 pages.
USPTO Notice of Allowance for U.S. Appl. No. 09/957,084 dated May 18, 2004; 5 pages.
USPTO Final Rejection for U.S. Appl. No. 09/957,084 dated Jan. 29, 2004; 8 pages.
USPTO Non-Final Rejection for U.S. Appl. No. 09/957,084 dated Aug. 27, 2003; 8 pages.
USPTO Final Rejection for U.S. Appl. No. 09/957,084 dated Apr. 23, 2003; 8 pages.
USPTO Non-Final Rejection for U.S. Appl. No. 09/957,084 dated Aug. 23, 2002; 6 pages.
USPTO Notice of Allowance for U.S. Appl. No. 09/969,313 dated Oct. 4, 2005; 6 pages.
USPTO Non-Final Rejection for U.S. Appl. No. 09/969,313 dated May 6, 2005; 9 pages.
USPTO Requirement for Restriction/Election for U.S. Appl. No. 09/969,313 dated Mar. 18, 2005; 6 pages.
USPTO Notice of Allowance for U.S. Appl. No. 09/969,311 dated Mar. 1, 2005; 4 pages.
USPTO Non-Final Rejection for U.S. Appl. No. 09/969,311 dated Sep. 21, 2004; 4 pages.
USPTO Advisory Action for U.S. Appl. No. 09/969,311 dated Jul. 21, 2003; 2 pages.
USPTO Final Rejection for U.S. Appl. No. 09/969,311 dated Apr. 7, 2003; 7 pages.
USPTO Non-Final Rejection for U.S. Appl. No. 09/969,311 dated Nov. 6, 2002; 8 pages.
USPTO Notice of Allowance for U.S. Appl. No. 09/972,319 dated Dec. 30, 2004; 4 pages.
USPTO Non-Final Rejection for U.S. Appl. No. 09/972,319 dated Sep. 16, 2004; 9 pages.
USPTO Notice of Allowance for U.S. Appl. No. 09/972,003 dated Jul. 14, 2004; 4 pages.
USPTO Requirement for Restriction/Election for U.S. Appl. No. 09/972,003 dated May 6, 2004; 4 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Notice of Allowance for U.S. Appl. No. 09/972,133 dated Jun. 9, 2006; 6 pages.
USPTO Final Rejection for U.S. Appl. No. 09/972,133 dated Mar. 30, 2006; 8 pages.
USPTO Non-Final Rejection for U.S. Appl. No. 09/972,133 dated Nov. 25, 2005; 9 pages.
USPTO Advisory Action for U.S. Appl. No. 09/972,133 dated Aug. 31, 2005; 3 pages.
USPTO Final Rejection for U.S. Appl. No. 09/972,133 dated Jun. 29, 2005; 10 pages.
USPTO Non-Final Rejection for U.S. Appl. No. 09/972,133 dated Mar. 8, 2005; 9 pages.
USPTO Notice of Allowance for U.S. Appl. No. 09/975,104 dated Oct. 19, 2006; 6 pages.
USPTO Non-Final Rejection for U.S. Appl. No. 09/975,104 dated Jun. 16, 2006; 8 pages.
USPTO Final Rejection for U.S. Appl. No. 09/975,104 dated Feb. 15, 2006; 7 pages.
USPTO Non-Final Rejection for U.S. Appl. No. 09/975,104 dated Aug. 16, 2005; 6 pages.
USPTO Non-Final Rejection for U.S. Appl. No. 09/975,104 dated Mar. 21, 2005; 7 pages.
USPTO Notice of Allowance for U.S. Appl. No. 09/975,030 dated Feb. 6, 2006; 7 pages.
USPTO Non-Final Rejection for U.S. Appl. No. 09/975,030 dated Oct. 20, 2005; 7 pages.
USPTO Non-Final Rejection for U.S. Appl. No. 09/975,030 dated Mar. 29, 2005; 13 pages.
USPTO Notice of Allowance for U.S. Appl. No. 09/977,111 dated Sep. 28, 2006; 6 pages.
USPTO Notice of Allowance for U.S. Appl. No. 10/272,231 dated Mar. 8, 2004; 6 pages.
USPTO Final Rejection for U.S. Appl. No. 10/272,231 dated Nov. 5, 2003; 5 pages.
USPTO Non-Final Rejection for U.S. Appl. No. 10/272,231 dated Jul. 14, 2003; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007; 7 pages.
USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004; 7 pages.
USPTO Notice of Allowance for U.S. Appl. No. 09/875,599 dated Oct. 17, 2006; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006; 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.

USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001,568 dated Mar. 17, 2006; 9 pages.
USPTO Final Rejection for U.S. Appl. No. 10/001,568 dated Oct. 26, 2005; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Adham et al., "Preliminary Outline of the IEEE P1500 Scalable Architecture for Testing Embedded Cores," IEEE, Aug. 2002; 6 pages.
USPTO Non-Final Rejection for U.S. Appl. No. 09/989,762 dated Jul. 27, 2005; 15 pages.
USPTO Final Rejection for U.S. Appl. No. 09/989,762 dated Mar. 14, 2006; 19 pages.
USPTO Non-Final Rejection for U.S. Appl. No. 09/989,762 dated Aug. 10, 2006; 18 pages.
USPTO Final Rejection for U.S. Appl. No. 09/989,762 dated Jan. 26, 2007; 13 pages.
USPTO Non-Final Rejection for U.S. Appl. No. 09/989,762 dated Jul. 23, 2007; 15 pages.
USPTO Notice of Allowance for U.S. Appl. No. 09/989,762 dated Jan. 2, 2008; 6 pages.
USPTO Notice of Allowance for U.S. Appl. No. 09/989,762 dated Jun. 2, 2008; 6 pages.
USPTO Notice of Allowance for U.S. Appl. No. 09/989,762 dated Oct. 24, 2008; 7 pages.
USPTO Notice of Allowance for U.S. Appl. No. 09/989,762 dated Mar. 25, 2009; 7 pages.
USPTO Non-Final Rejection for U.S. Appl. No. 09/989,771 dated Apr. 30, 2009; 11 pages.
USPTO Notice of Allowance for U.S. Appl. No. 09/992,076 dated Feb. 27, 2009; 6 pages.
USPTO Notice of Allowance for U.S. Appl. No. 09/989,777 dated Mar. 9, 2009; 7 pages.
USPTO Notice of Allowance for U.S. Appl. No. 09/994,600 dated Apr. 3, 2009; 5 pages.
USPTO Final Rejection for U.S. Appl. No. 10/001,478 dated Apr. 20, 2009; 16 pages.
USPTO Non-Final Rejection for U.S. Appl. No. 10/226,911 dated Mar. 19, 2004; 6 pages.
USPTO Non-Final Rejection for U.S. Appl. No. 11/850,260 dated Mar. 6, 2009; 7 pages.
USPTO Non-Final Rejection for U.S. Appl. No. 11/644,100 dated Mar. 9, 2009; 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for U.S. Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 8 pages.
USPTO Notice of Allowance for U.S. Appl. No. 12/218,404 dated Mar. 19, 2009; 7 pages.
USPTO Non-Final Rejection for U.S. Appl. No. 12/218,404 dated Sep. 30, 2008; 8 pages.
USPTO Notice of Allowance for U.S. Appl. No. 10/226,911 dated Aug. 20, 2004; 4 pages.
USPTO Non-Final Rejection for U.S. Appl. No. 09/404,891 dated Oct. 11, 2002; 5 pages.
USPTO Non-Final Rejection for U.S. Appl. No. 09/404,891 dated Mar. 5, 2003; 6 pages.

USPTO Notice of Allowance for U.S. Appl. No. 11/132,894 dated Apr. 26, 2007; 4 pages.
USPTO Non-Final Rejection for U.S. Appl. No. 11/132,894 dated Dec. 19, 2006; 12 pages.
USPTO Non-Final Rejection for U.S. Appl. No. 09/404,891 dated Jul. 10, 2003; 6 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
USPTO Non-Final Rejection for U.S. Appl. No. 09/404,891 dated Jan. 5, 2004; 5 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.
USPTO Non-Final Rejection for U.S. Appl. No. 10/305,589 dated Oct. 7, 2003; 6 pages.
USPTO Non-Final Rejection for U.S. Appl. No. 09/404,891 dated Jun. 25, 2004; 6 pages.
USPTO Final Rejection for U.S. Appl. No. 09/404,891 dated Dec. 8, 2004; 7 pages.
USPTO Notice of Allowance for U.S. Appl. No. 09/404,891 dated Mar. 4, 2005; 6 pages.
USPTO Non-Final Rejection for U.S. Appl. No. 10/871,582 dated Sep. 7, 2005; 7 pages.
USPTO Notice of Allowance for U.S. Appl. No. 10/327,217 dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 page.
USPTO Final Rejection for U.S. Appl. No. 10/871,582 dated Feb. 1, 2006; 5 pages.
USPTO Notice of Allowance for U.S. Appl. No. 10/871,582 dated Mar. 30, 2006; 6 pages.
USPTO Notice of Allowance for U.S. Appl. No. 09/943,149 dated Jan. 12, 2004; 7 pages.
USPTO Non-Final Rejection for U.S. Appl. No. 09/943,149 dated Aug. 28, 2003; 9 pages.
USPTO Final Rejection for U.S. Appl. No. 09/943,149 dated May 7, 2003; 10 pages.
USPTO Non-Final Rejection for U.S. Appl. No. 09/943,149 dated Nov. 20, 2002; 7 pages.
USPTO Non-Final Rejection for U.S. Appl. No. 10/288,003 dated Apr. 7, 2004; 9 pages.
USPTO Final Rejection for U.S. Appl. No. 10/288,003 dated Oct. 6, 2004; 6 pages.
USPTO Notice of Allowance for U.S. Appl. No. 10/288,003 dated Jan. 14, 2005; 6 pages.
USPTO Non-Final Rejection for U.S. Appl. No. 10/293,392 dated Oct. 16, 2003; 6 pages.
USPTO Notice of Allowance for U.S. Appl. No. 10/293,392 dated Mar. 10, 2004; 6 pages.
USPTO Advisory Action for U.S. Appl. No. 11/200,619 dated May 11, 2009; 3 pages.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
USPTO Non-Final Rejection for U.S. Appl. No. 09/989,761 dated Apr. 18, 2003; 5 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
USPTO Final Rejection for U.S. Appl. No. 09/989,761 dated Oct. 3, 2003; 7 pages.
USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
USPTO Non-Final Rejection for U.S. Appl. No. 09/989,761 dated Mar. 10, 2004; 6 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
USPTO Final Rejection for U.S. Appl. No. 09/989,761 dated Aug. 26, 2004; 7 pages.
USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
USPTO Notice of Allowance for U.S. Appl. No. 09/989,761 dated Jan. 14, 2005; 6 pages.
USPTO Miscellaneous Action for U.S. Appl. No. 09/989,819 dated Dec. 14, 2001; 1 page.
USPTO Non-Final Rejection for U.S. Appl. No. 09/989,819 dated Jul. 13, 2004; 4 pages.
USPTO Notice of Allowance for U.S. Appl. No. 09/989,819 dated Jan. 11, 2005; 7 pages.
USPTO Notice of Allowance for U.S. Appl. No. 11/986,338 dated May 7, 2009; 1 page.
USPTO U.S. Appl. No. 11/965,291: "Universal Digital Block Interconnection and Channel Routing," Snyder et al., filed on Dec. 27, 2007; 31 pages.
USPTO Non-Final Rejection for U.S. Appl. No. 11/965,291 dated Dec. 17, 2008; 8 pages.
USPTO Notice of Allowance for U.S. Appl. No. 11/965,291 dated May 5, 2009; 7 pages.
USPTO U.S. Appl. No. 11/986,338: Reconfigurable Testing System and Method, Pleis et al., filed on Nov. 20, 2007; 41 pages.
USPTO U.S. Appl. No. 10/172,670: "Method and System for Programming a Memory Device," Snyder et al.; filed on Jun. 13, 2002; 66 pages.
USPTO Notice of Allowance for U.S. Appl. No. 10/653,050 dated Jul. 29, 2004; 3 pages.
Written Opinion of the International Search Authority for International Application No. PCT/US08/60680 dated Aug. 15, 2008; 4 pages.
USPTO Notice of Allowance for U.S. Appl. No. 09/475,879 dated Oct. 22, 2004; 7 pages.
USPTO Advisory Action for U.S. Appl. No. 09/475,879 dated Mar. 4, 2002; 3 pages.
USPTO Advisory Action for U.S. Appl. No. 09/475,879 dated Dec. 31, 2001; 3 pages.
USPTO Final Rejection for U.S. Appl. No. 09/475,879 dated Oct. 11, 2001; 10 pages.
USPTO Non-Final Rejection for U.S. Appl. No. 09/475,879 dated Mar. 8, 2001; 6 pages.
USPTO U.S. Appl. No. 09/475,879: "Programmable Logic Device," Lacey et al.; filed on Dec. 30, 1999; 50 pages.
USPTO U.S. Appl. No. 09/475,808: "Configurable Memory for Programmable Logic Circuits," Lacey et al, filed on Dec. 30, 1999; 24 pages.
USPTO Non-Final Rejection for U.S. Appl. No. 09/475,808 dated Jun. 6, 2001; 8 pages.

USPTO Notice of Allowance for U.S. Appl. No. 09/475,808 dated Nov. 6, 2001; 8 pages.
USPTO U.S. Appl. No. 10/137,497: "Reconfigurable Testing System and Method," Pleis et al.; filed on May 1, 2002; 40 pages.
USPTO Non-Final Rejection for U.S. Appl. No. 10/137,497 dated Nov 5, 2004; 17 pages.
USPTO Final Rejection for U.S. Appl. No. 10/137,497 dated May 5, 2005; 13 pages.
USPTO Non-Final Rejection for U.S. Appl. No. 10/137,497 dated Sep. 22, 2005; 21 pages.
USPTO Final Rejection for U.S. Appl. No. 10/137,497 dated Mar. 13, 2006; 15 pages.
USPTO Non-Final Rejection for U.S. Appl. No. 10/137,497 dated Aug. 2, 2006; 21 pages.
USPTO Notice of Allowance for U.S. Appl. No. 10/137,497 dated Jan. 24, 2007; 12 pages.
USPTO Notice of Allowance for U.S. Appl. No. 10/137,497 dated Jul. 20, 2007; 4 pages.
USPTO U.S. Appl. No. 10/653,050: "Method and System for Programming a Memory Device," Snyder et al.; filed on Aug. 29, 2003; 69 pages.
USPTO Non-Final Rejection for U.S. Appl. No. 10/653,050 dated Apr. 6, 2004; 7 pages.
USPTO Notice of Allowance for U.S. Appl. No. 11/273,708 dated Aug. 9, 2007; 4 pages.
USPTO Non-Final Rejection for U.S. Appl. No. 11/273,708 dated Mar. 19, 2007; 16 pages.
USPTO Final Rejection for U.S. Appl. No. 11/273,708 dated Jul. 5, 2007; 8 pages.
USPTO Notice of Allowance for U.S. Appl. No. 11/985,340 dated Jun. 2, 2009; 7 pages.
USPTO Requirement for Restriction for U.S. Appl. No. 11/985,340 dated Mar. 16, 2009; 7 pages.
USPTO Requirement for Restriction/Election for U.S. Appl. No. 11/337,272 dated Sep. 11, 2006; 5 pages.
USPTO Non-Final Rejection for U.S. Appl. No. 11/337,272 dated Oct. 24, 2006; 9 pages.
USPTO Final Rejection for U.S. Appl. No. 11/337,272 dated Feb. 2, 2007; 11 pages.
USPTO Advisory Action for U.S. Appl. No. 11/337,272 dated Apr. 3, 2007; 3 pages.
USPTO Non-Final Rejection for U.S. Appl. No. 11/337,272 dated May 17, 2007; 11 pages.
USPTO Notice of Allowance for U.S. Appl. No. 11/337,272 dated Aug. 15, 2007; 9 pages.
USPTO U.S. Appl. No. 11/985,340: "Method and Circuit for Rapid Alignment of Signals," Moyal et al., filed on Nov. 13, 2007; 34 pages.
USPTO Non-Final Rejection for U.S. Appl. No. 11/983,291 dated Mar. 9, 2009; 9 pages.
USPTO U.S. Appl. No. 11/698,660: "Configurable Bus," Kutz et al., filed on Jan. 25, 2007; 35 pages.
USPTO Non-Final Rejection for U.S. Appl. No. 11/698,660 dated Dec. 2, 2008; 12 pages.
USPTO Final Rejection for U.S. Appl. No. 11/698,660 dated May 28, 2009; 12 pages.
USPTO Non-Final Rejection for U.S. Appl. No. 11/088,028 dated Jun. 16, 2006; 8 pages.
USPTO Non-Final Rejection for U.S. Appl. No. 11/709,866 dated Nov. 7, 2008; 14 pages.
USPTO Notice of Allowance for U.S. Appl. No. 11/709,866 dated Apr. 7, 2009; 8 pages.
USPTO Notice of Allowance for U.S. Appl. No. 11/088,028 dated Jan. 26, 2007; 6 pages.
Uspto Notice of Allowance for U.S. Appl. No. 11/088,028 dated Jul. 2, 2007; 6 pages.
USPTO U.S. Appl. No. 11/088,028: "Method and Circuit for Rapid Alignment of Signals," Moyal et al., filed on Nov. 13, 2007; 34 pages.
USPTO U.S. Appl. No. 10/024,093: "Configurable Memory for Programmable Logic Circuits," Lacey et al., filed on Dec. 18, 2001; 25 pages.
USPTO Notice of Allowance for U.S. Appl. No. 10/024,093 dated Sep. 10, 2002; 7 pages.
USPTO U.S. Appl. No. 11/166,622: "Touch wake for electronic devices," Beard et al., filed on Jun. 23, 2005; 22 pages.
International Written Opinion of the International Searching Authority for International Application No. PCT/US2006/09572 dated Jan. 10, 2008; 5 pages.
International Search Report for International Application No. PCT/US2006/09572 dated Jan. 10, 2008; 2 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967,240 dated Jun. 10, 2009; 7 pages.
USPTO Non-Final Rejection for U.S. Appl. No. 11/857,947 dated Mar. 30, 2009; 18 pages.
USPTO Non-Final Rejection for U.S. Appl. No. 12/104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for International Application No. PCT/US08/60695 dated Jul. 22, 2009; 3 pages.
Written Opinion of the International Searching Authority for International Application No. PCT/US08/60695 dated Jul. 22, 2009; 6 pages.
Azim et al., "A Custom DSP Chip to Implement a Robot Motion Controller Proceedings of the IEEE Custom Integrated Circuits Conference," May 1988, pp. 8.7.1-8.7.5; 6 pages.
Catthoor et al., "Architectural Strategies for an Application-Specific Synchronous Multiprocessor Environment," IEEE transactions on Acoustics, Speech, and Signal Processing; vol, 36, No. 2, Feb. 1988, pp. 265-284; 20 pages.
International Search Report of the International Searching Authority for International Application No. PCT/US08/60696 dated Sep. 22, 2008; 2 pages.
International Search Report of the International Searching Authority for International Application No. PCT/US08/60698 dated Sep. 5, 2008; 2 pages.
Shahbahrami et al., "Matrix Register File and Extended Subwords: Two Techniques for Embedded Media Processors," ACM, May 2005; 9 pages.
Jung et al., "A Register File with Transposed Access Mode," 2000, IEEE; 2 pages.
International Search Report of the International Searching Authority for International Application No. PCT/US08/60681 dated Sep. 12, 2008; 2 pages.
Written Opinion of the International Searching Authority for International Application No. PCT/US08/60681 dated Sep. 12, 2008; 4 pages.
USPTO Notice of Allowance for U.S. Appl. No. 11/965,677 dated Sep. 10, 2009; 6 pages.
USPTO Non-Final Rejection for U.S. Appl. No. 11/965,677 dated Mar. 10, 2009; 10 pages.
Written Opinion of the International Searching Authority for International Application No. PCT/US08/60696 dated Sep. 22, 2008; 4 pages.
USPTO Notice of Allowance for U.S. Appl. No. 10/238,966 dated Aug. 5, 2009; 5 pages.
USPTO Notice of Allowance for U.S. Appl. No. 10/033,027 dated Sep. 2, 2009; 4 pages.
USPTO Non-Final Rejection for U.S. Appl. No. 10/001,478 dated Aug. 4, 2009; 17 pages.
USPTO Advisory Action for U.S. Appl. No. 10/001,478 dated Jun. 30, 2009; 3 pages.
USPTO Notice of Allowance for U.S. Appl. No. 10/002,217 dated Sep. 17, 2009; 6 pages.
USPTO Notice of Allowance for U.S. Appl. No. 10/002,217 dated Jun. 8, 2009; 8 pages.
USPTO Notice of Allowance for U.S. Appl. No. 10/001,477 dated Dec. 4, 2009: 7 pages.

USPTO Notice of Allowance for U.S. Appl. No. 10/001,477 dated Aug. 26, 2009; 6 pages.
USPTO Ex Parte Quayle Action for U.S. Appl. No. 09/975,115 dated Aug. 20, 2009; 7 pages.
USPTO Non-Final Rejection for U.S. Appl. No. 09/994,601 dated Jul. 9, 2009; 11 pages.
USPTO Non-Final Rejection for U.S. Appl. No. 11/818,005 dated Nov. 23, 2009; 8 pages.
USPTO Advisory Action for U.S. Appl. No. 09/989,778 dated Jun. 17, 2009; 3 pages.
USPTO Final Rejection for U.S. Appl. No. 09/989,767 dated Dec. 7, 2009; 22 pages.
USPTO Final Rejection for U.S. Appl. No. 11/850,260 dated Aug. 21, 2009; 9 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.
USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771 dated Nov. 25, 2009; 12 pages.
USPTO Notice of Allowance for U.S. Appl. No. 09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Notice of Allowance for U.S. Appl. No. 11/986,338 dated Oct. 19, 2009; 4 pages.
USPTO Notice of Allowance for U.S. Appl. No. 09/989,777 dated Aug. 6, 2009; 8 pages.
USPTO Notice of Allowance for U.S. Appl. No. 10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Non-Final Rejection for U.S. Appl. No. 10/133,581 dated Feb. 24, 2006; 11 pages.
USPTO Notice of Allowance for U.S. Appl. No. 10/002,217 dated Jan. 11, 2010; 7 pages.
USPTO Notice of Allowance for U.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Notice of Allowance for U.S. Appl. No. 10/033,027 dated Feb. 18, 2010; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010; 7 pages.
USPTO Non-Final Rejection for U.S. Appl. No. 10/133,581 dated Aug. 12, 2005; 12 pages.
USPTO Notice of Allowance for U.S. Appl. No. 10/133,581 dated Mar. 5, 2010; 9 pages.
USPTO Non-Anal Rejection for U.S. Appl. No. 10/133,581 dated Sep. 1, 2009; 18 pages.
USPTO Final Rejection for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated Nov. 27, 2007; 15 pages.
USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.

* cited by examiner

```
<PSOC_DEVICE_DB>
<PSOC_CONFIG_LIST>
<PSOC_CONFIG NAME="patent8pin2" BASE_DEICE="CY8C25122-API" SOURCE_GEN_TIME="1004277340" CONFIG_SAVE_TIME="1047277340"
CONFIG_SAVE_DATE="FRI NOV 02 10:55:40 2001" VERSION="2.0">
<USER_MODULE_LIST>
    <USER_MODULE NAME="PWM16" INSTANCE_NAME="PulseGenerator" VERSION="">
        <SHAPE SHAPE_TYPE="BLOCKLIST" COLOR_INDEX="0">
            <BLOCK_LIST>
                <BLOCK NAME="PWM16_LSB" TYPE="DIGITAL" LOCATION="0">
                    <REGISTER_LIST>
                        <REGISTER NAME="CONTROL_0" ADDR="23" VALUE="0"/>
                        <REGISTER NAME="DATA_0" ADDR="20" VALUE="0"/>
                        <REGISTER NAME="DATA_1" ADDR="21" VALUE="86"/>
                        <REGISTER NAME="DATA_2" ADDR="22" VALUE="5c"/>
                        <REGISTER NAME="DIG_BasicFunction" ADDR="120" VALUE="1"/>
                        <REGISTER NAME="DIG_Input" ADDR="121" VALUE="e6"/>
                        <REGISTER NAME="DIG_Output" ADDR="23" VALUE="0"/>
                    </REGISTER_LIST>
                    <INPUT_LIST/>
                </BLOCK>
                <BLOCK NAME="PWM16_MSB" TYPE="DIGITAL" LOCATION="1">
                    <REGISTER_LIST>
                        <REGISTER NAME="CONTROL_0" ADDR="27" VALUE="0"/>
                        <REGISTER NAME="DATA_0" ADDR="24" VALUE="0"/>
                        <REGISTER NAME="DATA_1" ADDR="25" VALUE="0"/>
                        <REGISTER NAME="DIG_BasicFunction" ADDR="124" VALUE="21"/>
                        <REGISTER NAME="DIG_Input" ADDR="125" VALUE="36"/>
                        <REGISTER NAME="DIG_Output" ADDR="126" VALUE="5"/>
                    </REGISTER_LIST>
                    <INPUT_LIST/>
```

FIGURE 3A

```xml
        </BLOCK>
      </BLOCK_LIST/>
      <RESOURCE_LIST/>
    </SHAPE>
    <PARAMETER_LIST>
      <PARAMETER NAME="Clock" VALUE="24V2"/>
      <PARAMETER NAME="CompareType" VALUE="Compare Less Than Or Equal"/>
      <PARAMETER NAME="Enable" VALUE="Global_IN_2"/>
      <PARAMETER NAME="InterruptType" VALUE="Terminal Count"/>
      <PARAMETER NAME="Period" VALUE="Global_OUT_1"/>
      <PARAMETER NAME="Pulse Width" VALUE="92"/>
    </PARAMETER_LIST>
  </USER_MODULE>
</USER_MODULE_LIST>
</DEVICE_DATA>
<GLOBAL_RESOURCE_LIST>
  <RESOURCE NAME="24V1=24MHz/N" VALUE="5"/>
  <RESOURCE NAME="24V2=24V1/N" VALUE="1"/>
  <RESOURCE NAME="32K_Select" VALUE="Internal"/>
  <RESOURCE NAME="A_Buff_Power" VALUE="Low"/>
  <RESOURCE NAME="Analog Power" VALUE="SC On/Ref Low"/>
  <RESOURCE NAME="CPU_Clock" VALUE="12 MHz"/>
  <RESOURCE NAME="Op-amp Bias" VALUE="Low"/>
  <RESOURCE NAME="PLL_Mode" VALUE="Disable"/>
  <RESOURCE NAME="Ref Mux" VALUE="(Vcc/2+/-BandGap"/>
  <RESOURCE NAME="Sleep_Timer" VALUE="512_Hz"/>
  <RESOURCE NAME="SwitchModePump" VALUE="OFF"/>
  <RESOURCE NAME="VoltMonRange" VALUE="5.0V"/>
  <RESOURCE NAME="VoltMonThreshold" VALUE="voltMonThreshold"/>
</GLOBAL_RESOURCE_LIST>
<RESERVED_RESOURCE_LIST>
  <RESOURCE NAME="" VALUE="" TYPE=""/>
  <RESOURCE NAME="ASB11-ASA10" VALUE="" TYPE="DIRECT_INPUT"/>
  <RESOURCE NAME="ASB13-ASA12" VALUE="" TYPE="DIRECT_INPUT"/>
  <RESOURCE NAME="ASB20-ASA21" VALUE="" TYPE="DIRECT_INPUT"/>
  <RESOURCE NAME="ASB23-ASA23" VALUE="" TYPE="DIRECT_INPUT"/>
```

FIGURE 3B

```
<RESOURCE NAME="AnalogClock_0_Select" VALUE="" TYPE="ANALOG_CLOCK_SELECT"/>
<RESOURCE NAME="AnalogClock_1_Select" VALUE="" TYPE="ANALOG_CLOCK_SELECT"/>
<RESOURCE NAME="AnalogColumn_Clock_0" VALUE="24V1" TYPE="ANALOG_COLUMNCLOCK_MUX"/>
<RESOURCE NAME="AnalogColumn_Clock_1" VALUE="24V1" TYPE="ANALOG_COLUMNCLOCK_MUX"/>
<RESOURCE NAME="AnalogColumn_Clock_2" VALUE="24V1" TYPE="ANALOG_COLUMNCLOCK_MUX"/>
<RESOURCE NAME="AnalogColumn_Clock_3" VALUE="24V1" TYPE="ANALOG_COLUMNCLOCK_MUX"/>
<RESOURCE NAME="AnalogColumn_InputMUX0" VALUE="Port_0_1" TYPE="COLUMN_INPUT"/>
<RESOURCE NAME="AnalogColumn_InputMUX1" VALUE="Port_0_4" TYPE="COLUMN_INPUT"/>
<RESOURCE NAME="AnalogColumn_InputMUX2" VALUE="Port_0_5" TYPE="COLUMN_INPUT"/>
<RESOURCE NAME="AnalogColumn_InputMUX3" VALUE="Port_0_0" TYPE="COLUMN_INPUT"/>
<RESOURCE NAME="AnalogColumn_InputSelect_1" VALUE="AnalogColumn_InputMUX_1"
       TYPE="COLUMN_INPUT_SELECT"/>
<RESOURCE NAME="AnalogColumn_InputSelect_2" VALUE="AnalogColumn_InputMUX_2"
       TYPE="COLUMN_INPUT_SELECT"/>
<RESOURCE NAME="AnalogComparatorControl_0" VALUE="" TYPE="ANALOG_COMPARATOR_CONTROL"/>
<RESOURCE NAME="AnalogComparatorControl_1" VALUE="" TYPE="ANALOG_COMPARATOR_CONTROL"/>
<RESOURCE NAME="AnalogComparatorControl_2" VALUE="" TYPE="ANALOG_COMPARATOR_CONTROL"/>
<RESOURCE NAME="AnalogComparatorControl_3" VALUE="" TYPE="ANALOG_COMPARATOR_CONTROL"/>
<RESOURCE NAME="AnalogModulator_Col_0" VALUE="None" TYPE="ANALOG_MODULATOR"/>
<RESOURCE NAME="AnalogModulator_Col_0" VALUE="None" TYPE="ANALOG_MODULATOR"/>
<RESOURCE NAME="AnalogOutBuf_0" VALUE="OFF" TYPE="ANALOG_DRIVER"/>
<RESOURCE NAME="AnalogOutBuf_1" VALUE="OFF" TYPE="ANALOG_DRIVER"/>
<RESOURCE NAME="AnalogOutBuf_2" VALUE="OFF" TYPE="ANALOG_DRIVER"/>
<RESOURCE NAME="AnalogOutBuf_3" VALUE="OFF" TYPE="ANALOG_DRIVER"/>
<RESOURCE NAME="AnalogOutBus_0" VALUE="" TYPE="ANALOG_COLUMN_OUTPUT"/>
<RESOURCE NAME="AnalogOutBus_1" VALUE="" TYPE="ANALOG_COLUMN_OUTPUT"/>
<RESOURCE NAME="AnalogOutBus_2" VALUE="" TYPE="ANALOG_COLUMN_OUTPUT"/>
```

FIGURE 3C

```
<RESOURCE NAME="AnalogOutBus_3" VALUE="" TYPE="ANALOG_COLUMN_OUTPUT"/>
<RESOURCE NAME="ComparatorBus_0" VALUE="" TYPE="ANALOG_COMPARATOR_OUTPUT"/>
<RESOURCE NAME="ComparatorBus_1" VALUE="" TYPE="ANALOG_COMPARATOR_OUTPUT"/>
<RESOURCE NAME="ComparatorBus_2" VALUE="" TYPE="ANALOG_COMPARATOR_OUTPUT"/>
<RESOURCE NAME="ComparatorBus_3" VALUE="" TYPE="ANALOG_COMPARATOR_OUTPUT"/>
<RESOURCE NAME="ComparatorClock" VALUE="" TYPE="COMPARATOR_CLOCK"/>
<RESOURCE NAME="ComparatorGate_0" VALUE="" TYPE="COMPARATOR_ENABLE"/>
<RESOURCE NAME="ComparatorGate_1" VALUE="" TYPE="COMPARATOR_ENABLE"/>
<RESOURCE NAME="ComparatorGate_2" VALUE="" TYPE="COMPARATOR_ENABLE"/>
<RESOURCE NAME="ComparatorGate_3" VALUE="" TYPE="COMPARATOR_ENABLE"/>
<RESOURCE NAME="DBA00-DBA01" VALUE="" TYPE="DIRECT_INPUT"/>
<RESOURCE NAME="DBA01-DBA02" VALUE="" TYPE="DIRECT_INPUT"/>
<RESOURCE NAME="DBA02-DBA03" VALUE="" TYPE="DIRECT_INPUT"/>
<RESOURCE NAME="DBA03-DBA04" VALUE="" TYPE="DIRECT_INPUT"/>
<RESOURCE NAME="DBA04-DBA05" VALUE="" TYPE="DIRECT_INPUT"/>
<RESOURCE NAME="DBA05-DBA06" VALUE="" TYPE="DIRECT_INPUT"/>
<RESOURCE NAME="DBA06-DBA07" VALUE="" TYPE="DIRECT_INPUT"/>
<RESOURCE NAME="Decimator" VALUE="" TYPE="DECIMATOR"/>
<RESOURCE NAME="Global_IN_0" VALUE="" TYPE="GLOBAL_BUS"/>
<RESOURCE NAME="Global_IN_1" VALUE="" TYPE="GLOBAL_BUS"/>
<RESOURCE NAME="Global_IN_2" VALUE="" TYPE="GLOBAL_BUS"/>
<RESOURCE NAME="Global_IN_3" VALUE="" TYPE="GLOBAL_BUS"/>
<RESOURCE NAME="Global_IN_4" VALUE="" TYPE="GLOBAL_BUS"/>
<RESOURCE NAME="Global_IN_5" VALUE="" TYPE="GLOBAL_BUS"/>
<RESOURCE NAME="Global_IN_6" VALUE="" TYPE="GLOBAL_BUS"/>
```

FIGURE 3D

```
<RESOURCE NAME="Global_IN_7" VALUE="" TYPE="GLOBAL_BUS"/>
<RESOURCE NAME="Global_OUT_0" VALUE="" TYPE="GLOBAL_BUS"/>
<RESOURCE NAME="Global_OUT_1" VALUE="" TYPE="GLOBAL_BUS"/>
<RESOURCE NAME="Global_OUT_2" VALUE="" TYPE="GLOBAL_BUS"/>
<RESOURCE NAME="Global_OUT_3" VALUE="" TYPE="GLOBAL_BUS"/>
<RESOURCE NAME="Global_OUT_4" VALUE="" TYPE="GLOBAL_BUS"/>
<RESOURCE NAME="Global_OUT_5" VALUE="" TYPE="GLOBAL_BUS"/>
<RESOURCE NAME="Global_OUT_6" VALUE="" TYPE="GLOBAL_BUS"/>
<RESOURCE NAME="Global_OUT_7" VALUE="" TYPE="GLOBAL_BUS"/>
<RESOURCE NAME="Port_0_2_Drive" VALUE="Global_IN_2" TYPE="PIN"/>
<RESOURCE NAME="Port_0_3_Drive" VALUE="High_Z" TYPE="PIN"/>
<RESOURCE NAME="Port_0_4_Drive" VALUE="StdCPU" TYPE="PIN"/>
<RESOURCE NAME="Port_0_5_Drive" VALUE="Pull Down" TYPE="PIN"/>
<RESOURCE NAME="Port_0_6_Drive" VALUE="StdCPU" TYPE="PIN"/>
<RESOURCE NAME="Port_0_7_Drive" VALUE="Pull Down" TYPE="PIN"/>
<RESOURCE NAME="Port_1_0_Drive" VALUE="StdCPU" TYPE="PIN"/>
<RESOURCE NAME="Port_1_1_Drive" VALUE="Pull Down" TYPE="PIN"/>
<RESOURCE NAME="Port_1_2_Drive" VALUE="Global_OUT_1 (Strong)" TYPE="PIN"/>
<RESOURCE NAME="Port_1_3_Drive" VALUE="Strong" TYPE="PIN"/>
<RESOURCE NAME="V" VALUE="" TYPE="TEMPERATURE_VOLTAGE"/>
</RESERVED_RESOURCE_LIST>
<GLOBAL_REGISTER_LIST>
<REGISTER NAME="AnalogClockSelect" VALUE="0" ADDR="161"/>
<REGISTER NAME="AnalogColumnClockSelect" VALUE="0" ADDR="161"/>
```

FIGURE 3E

```
<REGISTER NAME="AnalogColumnInputSelect" VALUE="28" ADDR="60"/>
<REGISTER NAME="AnalogIOControl" VALUE="0" ADDR="162"/>
<REGISTER NAME="AnalogModulatorControl" VALUE="0" ADDR="163"/>
<REGISTER NAME="AnalogReferenceControl" VALUE="5" ADDR="63"/>
<REGISTER NAME="AnalogSyncControl" VALUE="0" ADDR="65"/>
<REGISTER NAME="DecimatorControl" VALUE="0" ADDR="e6"/>
<REGISTER NAME="OscillatorControl_1" VALUE="40" ADDR="161"/>
<REGISTER NAME="Port_0_Bypass" VALUE="4" ADDR="2"/>
<REGISTER NAME="Port_0_DriveMode_0" VALUE="0" ADDR="100"/>
<REGISTER NAME="Port_0_DriveMode_1" VALUE="4" ADDR="101"/>
<REGISTER NAME="Port_1_Bypass" VALUE="0" ADDR="6"/>
<REGISTER NAME="Port_1_DriveMode_0" VALUE="2" ADDR="104"/>
<REGISTER NAME="Port_1_DriveMode_1" VALUE="0" ADDR="105"/>
<REGISTER NAME="Port_2_Bypass" VALUE="0" ADDR="a"/>
<REGISTER NAME="Port_2_DriveMode_0" VALUE="0" ADDR="108"/>
<REGISTER NAME="Port_2_DriveMode_1" VALUE="0" ADDR="109"/>
<REGISTER NAME="Port_3_Bypass" VALUE="0" ADDR="e"/>
<REGISTER NAME="Port_3_DriveMode_0" VALUE="0" ADDR="10c"/>
<REGISTER NAME="Port_3_DriveMode_1" VALUE="0" ADDR="10d"/>
<REGISTER NAME="Port_4_Bypass" VALUE="0" ADDR="12"/>
<REGISTER NAME="Port_4_DriveMode_0" VALUE="0" ADDR="110"/>
<REGISTER NAME="Port_4_DriveMode_1" VALUE="0" ADDR="111"/>
<REGISTER NAME="Port_5_Bypass" VALUE="0" ADDR="16"/>
<REGISTER NAME="Port_5_DriveMode_0" VALUE="0" ADDR="114"/>
<REGISTER NAME="Port_5_DriveMode_1" VALUE="0" ADDR="115"/>
```

FIGURE 3F

```
<REGISTER NAME="VoltageMonitorControl" VALUE="84" ADDR="1e3"/>
</GLOBAL_REGISTER_LIST>
<PIN_DESC_LIST>
    <PIN_DESC PIN_NUMBER="1" PIN_LABEL="P0[7]" PIN_SELECT="StdCPU" PIN_DRIVE="Pull Down"/>
    <PIN_DESC PIN_NUMBER="2" PIN_LABEL="P0[5]" PIN_SELECT="StdCPU" PIN_DRIVE=" Pull Down"/>
    <PIN_DESC PIN_NUMBER="3" PIN_LABEL="P1[1]" PIN_SELECT="Global_OUT_1 (Strong)" PIN_DRIVE="Strong"/>
    <PIN_DESC PIN_NUMBER="4" PIN_LABEL="VSS" PIN_SELECT="" PIN_DRIVE=""/>
    <PIN_DESC PIN_NUMBER="5" PIN_LABEL="P1[0]" PIN_SELECT="StdCPU" PIN_DRIVE=" Pull Down"/>
    <PIN_DESC PIN_NUMBER="6" PIN_LABEL="P0[2]" PIN_SELECT="Global_IN_2" PIN_DRIVE="High Z"/>
    <PIN_DESC PIN_NUMBER="7" PIN_LABEL="P0[4]" PIN_SELECT="StdCPU" PIN_DRIVE=" Pull Down"/>
    <PIN_DESC PIN_NUMBER="8" PIN_LABEL="VCC" PIN_SELECT="" PIN_DRIVE=""/>
```

FIGURE 3G

```
<?xml version="1.0"?>
<xsl:stylesheet xmlns:xsl="http://www.w3.org/TR/WD-xsl">
<xsl:template match="/">
<HTML><HEAD>
    <STYLE>
        DIV.page { page-break-before: always }
    </STYLE>
</HEAD>
<BODY>
<TABLE BORDER="1" CELLSPACING="0" WIDTH="640">
<TR><TD>
        <DIV STYLE="media:print; font-family:Tahoma,Arial,sans-serif; font-size:12pt; color:blue; text-align:center; letter-spacing:6px; font-weight:bold">
            PSoC Designer Configuration Sheet
        </DIV>
</TD></TR>
<TR>
    <TD><IMG SRC="cyp.jpg" ALIGN="LEFT" WIDTH="250"/></TD>
</TR>
</TABLE>
</TD>
<TD><TABLE BORDER="0" CELLSPACING="0">
    <xsl:for-each select="//PSOC_CONFIG_LIST/PSOC_CONFIG">
    <TR><TD>
        <DIV STYLE="media:print; font-family:Tahoma,Arial,sans-serif; font-size:10pt; color:black; text-align:center; letter-spacing:6px; font-weight:bold">
            <xsl:apply-templates select="@NAME"/>
        </DIV>
    </TR></TD>
    <TR>
        <TD><xsl:apply-templates select="@BASE_DEVICE"/></TD>
        <DIV STYLE="media:print; font-family:Tahoma,Arial,sans-serif; font-size:10pt; color:black; text-align:center; letter-spacing:6px; font-weight:bold">
            <xsl:value-of select="@CONFIG_SAVE_DATE"/>
        </DIV>
    </TR>
```

FIGURE 4A

```
            </TD></TR>
          </xsl:for-each>
        </TABLE></TD>
      </TR>
    </TABLE>
    <TABLE BORDER="1" CELLSPACING="0" WIDTH="640">
      <TR ALIGN="CENTER">
        <xsl:for-each select="//USER_MODULES_LIST/USER_MODULE">
          <TD><IMG>
            <xsl:attribute name="src">
              <xsl:value-of select="@NAME" />_icon.gif
            </xsl:attribute>
          </IMG></TD>
        </xsl:for-each>
      </TR>
    </TABLE>
    <P></P>
    <TABLE BORDER="1" CELLSPACING="0" WIDTH="640">
      <DIV STYLE="media:print; font-family:Tahoma,Arial,sans-serif; font-size:10pt; color:blue; text-align:center; letter-spacing:6px; font-weight:bold">
        Signal Pin Table
      </DIV>
      <TR><TD WIDTH="320">
        <TABLE BORDER="1" CELLSPACING="0" ALIGN="CENTER">
          <TR ALIGN="CENTER">
            <TD>Pin#</TD>
            <TD>Label</TD>
            <TD>Select</TD>
            <TD>Drive</TD>
          </TR>
          <xsl:for-each select="PIN_DESC_LIST/PIN_DESC">
            <TR ALIGN="CENTER">
              <TD><xsl:apply-templates select="@PIN_NUMBER"/></TD>
              <TD><xsl:apply-templates select="@PIN_LABEL"/></TD>
              <TD><xsl:apply-templates select="@PIN_SELECT"/></TD>
              <TD><xsl:apply-templates select="@PIN_DRIVE"/></TD>
            </TR>
          </xsl:for-each>
        </TABLE>
      </TD>
      <TD>
        <TABLE BORDER="0" CELLSPACING="0">
          <TR>
            <TD><IMG SRC="part.jpg"/></TD>
          </TR>
```

```
          </TABLE>
        </TD></TR>
      </TABLE>
    </P></P>
    <P/>
    <TABLE BORDER="1" CELLSPACING="0" WIDTH="640">
      <DIV STYLE="media:print; font-family:Tahoma,Arial,sans-serif; font-size:10pt; color:blue; text-align:center; letter-spacing:6px; font-weight:bold">
        Selected Global Parameters
      </DIV>
      <TR>
        <TD>NAME</TD>
        <TD>Value</TD>
      </TR>
      <xsl:for-each select="/GLOBAL_RESOURCE_LIST/RESOURCE">
        <TR>
          <TD><xsl:apply-templates select="@NAME"/></TD>
          <TD><xsl:apply-templates select="@VALUE"/></TD>
        </TR>
      </xsl:for-each>
    </TABLE>
    <xsl:for-each select="//USER_MODULE_LIST/USER_MODULE">
      <DIV CLASS="page">
        <BR/><BR/><BR/>
      </DIV>
      <TABLE BORDER="1" CELLSPACING="0" WIDTH="640">
        <TR><TD>
          <TABLE BORDER="0" CELLSPACING="0" WIDTH="640">
            <TR><TD ALIGN="CENTER">
              <DIV STYLE="media:print; font-family:Tahoma,Arial,sans-serif; font-size:12pt; color:blue; text-align:center; letter-spacing:6px; font-weight:bold">
                Selected Global Parameters
                <xsl:value-of select="@NAME"/>
              </DIV>
            </TD></TR>
            <TR>
              <TD><IMG SRC="cyp.jpg" ALIGN="LEFT" WIDTH="350"/></TD>
              <TD><IMG>
                <xsl:attribute name="src">
                  <xsl:value-of select="@NAME"/>_icon.gif
                </xsl:attribute>
              </IMG>
            </TD>
          </TABLE>
        </TD>
```

```
            </IMG></TD></TR>
          </TABLE>
       <TABLE BORDER="1" CELLSPACING="0" WIDTH="640">
          <TR><TD><IMG>
             <xsl:attribute name="src">
                <xsl:value-of select="@NAME" />_block.gif
             </xsl:attribute>
          </IMG></TD></TR>
       </TABLE>
    </P>
    <TABLE BORDER="1" CELLSPACING="0" WIDTH="640">
       <DIV STYLE="media=print; font-family:Tahoma,Arial,sans-serif; font-size:12pt; color:blue; text-
          align:center; letter-spacing:6px; font-weight:bold">
          Parameters
       </DIV>
       <TR STYLE="media=print; font-family:Tahoma,Arial,sans-serif; font-size:10pt; color:red; text-align:center;
          letter-spacing:6px; font-weight:bold">
          <TD>Parameters</TD>
          <TD>Value</TD>
       </TR>
       <xsl:for-each select="PARAMETER_LIST/PARAMETER">
          <TR>
             <TD><xsl:apply-templates select="@NAME"/></TD>
             <TD><xsl:apply-templates select="@VALUE"/></TD>
          </TR>
       </xsl:for-each>
    </TABLE>
    <BR/>
    <TABLE BORDER="1" CELLSPACING="0" WIDTH="640">
       <DIV STYLE="media=print; font-family:Tahoma,Arial,sans-serif; font-size:12pt; color:blue; text-
          align:center; letter-spacing:6px; font-weight:bold">
          Blocks
       </DIV>
       <xsl:for-each select="SHAPE">
          <xsl:for-each select="BLOCK_LIST/BLOCK">
             <TR/><TR/>
             <TR STYLE="media=print; font-family:Tahoma,Arial,sans-serif; font-size:10pt; color:red; text-
                align:center; letter-spacing:8px; font-weight:bold">
                <TD>
```

FIGURE 4D

```
          <DIV STYLE="media=print; font-family:Tahoma,Arial,sans-serif; font-size:12pt;
            color:blue; text-align:center; letter-spacing:6px; font-weight:bold">
            Block
          </DIV>
          <TD>Type</TD>
          <TD>Location</TD>
        </TR>
        <TR>
          <TD><xsl:apply-templates select="@NAME"/></TD>
          <TD><xsl:apply-templates select="@ADDR"/></TD>
          <TD><xsl:apply-templates select="@VALUE"/></TD>
        </TR>
        <TR STYLE="media=print; font-family:Tahoma,Arial,sans-serif; font-size:10pt; color:red; text-
          align:center; letter-spacing:8px; font-weight:bold">
          <TD>Registers</TD>
          <TD>Address</TD>
          <TD>Value</TD>
        </TR>
        <xsl:for-each select="REGISTER_LIST/REGISTER">
          <TR>
            <TD><xsl:apply-templates select="@NAME"/></TD>
            <TD><xsl:apply-templates select="@ADDR"/></TD>
            <TD><xsl:apply-templates select="@VALUE"/></TD>
          </TR>
        </xsl:for-each>
        <TR HEIGHT="10"/>
      </xsl:for-each>
    </TABLE>
    <DIV CLASS="page">
      <BR/><BR/><BR/>
    </DIV>
    <TABLE BORDER="1" CELLSPACING="0" WIDTH="640">
      <TR><TD>
        <TABLE BORDER="0" CELLSPACING="0">
          <TR><TD><IMG SRC="cyr.jpg" ALIGN="LEFT" WIDTH="350"/></TD></TR>
        </TABLE>
      </TD>
      <TD>
        <TABLE BORDER="0" CELLSPACING="0" ALIGN="CENTER">
          <TR><TD>
            <DIV STYLE="media=print; font-family:Tahoma,Arial,sans-serif;
```

FIGURE 4E

```
                                   font-size:16pt; color:blue; text-align:center; letter-spacing:6px; font-weight:bold">
                              Appendix
              </DIV>
         </TD></TR>
      </TABLE>
</TABLE>
<P></P>
<TABLE BORDER="1" CELLSPACING="0" WIDTH="640">
      <DIV STYLE="media=print;font-family:Tahoma,Arial,sans-serif; font-size:12pt; color:blue; text-align:center;
                  letter-spacing:6px; font-weight:bold">
          Pin
      </DIV>
      <TR>
          <TD>Name</TD>
          <TD>Value</TD>
      </TR>
      <xsl:for-each select="//RESERVED_RESOURCE_LIST/RESOURCE">
          <xsl:if match="RESOURCE[@TYPE='PIN']">
              <TR>
                  <TD><xsl:apply-templates select="@NAME"/></TD>
                  <TD><xsl:apply-templates select="@VALUE"/></TD>
              </TR>
          </xsl:if>
      </xsl:for-each>
</TABLE>
<P></P>
<TABLE BORDER="1" CELLSPACING="0" WIDTH="640">
      <DIV STYLE="media=print;font-family:Tahoma,Arial,sans-serif; font-size:12pt; color:blue; text-align:center;
                  letter-spacing:6px; font-weight:bold">
          Analog Clocks
      </DIV>
      <TR><TD>Name</TD>
          <TD>Value</TD>
      </TR>
      <xsl:for-each select="//RESERVED_RESOURCE_LIST/RESOURCE">
          <xsl:if match="RESOURCE[@TYPE='ANALOG_CLOCK_SELECT']">
              <TR>
                  <TD><xsl:apply-templates select="@NAME"/></TD>
                  <TD><xsl:apply-templates select="@VALUE"/></TD>
              </TR>
          </xsl:if>
      </xsl:for-each>
      <xsl:for-each select="//RESERVED_RESOURCE_LIST/RESOURCE">
          <xsl:if match="RESOURCE[@TYPE='ANALOG_COLUMN_CLOCK_MUX']">
```

FIGURE 4F

```
                    <TR>
                        <TD><xsl:apply-templates select="@NAME"/></TD>
                        <TD><xsl:apply-templates select="@VALUE"/></TD>
                </xsl:if>
        </xsl:for-each>
</TABLE>
<P></P>
<TABLE BORDER="1" CELLSPACING="0" WIDTH="640">
        <DIV STYLE="media=print;font-family:Tahoma,Arial,sans-serif; font-size:12pt; color:blue; text-align:center;
            letter-spacing:6px; font-weight:bold">
            Analog Buffer Output
        </DIV>
        <TR>
                <TD>Name</TD>
                <TD>Value</TD>
        </TR>
        <xsl:for-each select="//RESERVED_RESOURCE_LIST/RESOURCE">
            <xsl:if match="RESOURCE[@TYPE='ANALOG_DRIVER']">
                    <TR>
                        <TD><xsl:apply-templates select="@NAME"/></TD>
                        <TD><xsl:apply-templates select="@VALUE"/></TD>
                    </TR>
            </xsl:if>
        </xsl:for-each>
</TABLE>
<P></P>
<TABLE BORDER="1" CELLSPACING="0" WIDTH="640">
```

FIGURE 4G

```
<DIV STYLE="media=print;font-family:Tahoma,Arial,sans-serif; font-size:12pt; color:blue; text-align:center;
     letter-spacing:6px; font-weight:bold">
  Global Register Values
</DIV>
<TR>
  <TD>Name</TD>
  <TD>Address</TD>
  <TD>Value</TD>
</TR>
<xsl:for-each select="//RESERVED_RESOURCE_LIST/RESOURCE">
  <TR>
    <TD><xsl:apply-templates select="@NAME"/></TD>
    <TD><xsl:apply-templates select="@ADDR"/></TD>
    <TD><xsl:apply-templates select="@VALUE"/></TD>
  </TR>
</xsl:for-each>
</TABLE>
</BODY>
</HTML>
<xsl:template match="@NAME">
  <B><xsl:value-of/></B>
</xsl:template>

<xsl:template match="@VALUE">
  <xsl:value-of/>
</xsl:template>

<xsl:template match="@SOURCE_GEN_TIME">
  <xsl:value-of/>
</xsl:template>

<xsl:template match="@BASE_DEVICE">
  <DIV STYLE="media=print;font-family:Tahoma,Arial,sans-serif; font-size:12pt; color:blue; text-align:center;
       letter-spacing:6px; font-weight:bold"><xsl:value-of/>
  </DIV>
</xsl:template>

<xsl:template match="@TYPE">
  <xsl:value-of/>
</xsl:template>
```

```
<xsl:template match="@LOCATION">
    <xsl:value-of/>
</xsl:template>

<xsl:template match="@REGISTER_NAME">
    <B><xsl:value-of/></B>
</xsl:template>

<xsl:template match="@REGISTER_VALUE">
    <xsl:value-of/>
</xsl:template>

<xsl:template match="@ADDR">
    <xsl:value-of/>
</xsl:template>

<xsl:template match="@PIN_NUMBER">
    <xsl:value-of/>
</xsl:template>

<xsl:template match="@PIN_LABEL">
    <xsl:value-of/>
</xsl:template>

<xsl:template match="@PIN_SELECT">
    <xsl:value-of/>
</xsl:template>

<xsl:template match="@PIN_DRIVE">
    <xsl:value-of/>
</xsl:template>

</xsl:stylesheet>
```

Blocks 508

| Block | Type | Location |
|---|---|---|
| PWM16_LSB | Digital | 0 |
| Registers | Address | Value |
| CONTROL_0 | 23 | 0 |
| DATA_0 | 20 | 0 |
| DATA_1 | 21 | 86 |
| DATA_2 | 22 | 5c |
| DIG_BasicFunction | 120 | 1 |
| DIG_Input | 121 | E6 |
| DIG_Output | 122 | 0 |
| Block | Type | Location |
| PWM16_MSB | Digital | 1 |
| Registers | Address | Value |
| CONTROL_0 | 27 | 0 |
| DATA_0 | 24 | 0 |
| DATA_1 | 25 | 0 |
| DATA_2 | 26 | 0 |
| DIG_BasicFunction | 124 | 21 |
| DIG_Input | 125 | 36 |
| DIG_Output | 126 | 5 |

FIGURE 5C

|  | Appendix |
|---|---|

Pin 509

| Name | Value |
|---|---|
| Port_0_2 | Global_IN_2 |
| Port_0_2_Drive | High Z |
| Port_0_4 | StdCPU |
| Port_0_4_Drive | Pull Down |
| Port_0_5 | StdCPU |
| Port_0_5_Drive | Pull Down |
| Port_0_7 | StdCPU |
| Port_0_7_Drive | Pull Down |
| Port_1_0 | StdCPU |
| Port_1_0_Drive | Pull Down |
| Port_1_1 | Global_OUT_1 (Strong) |
| Port_1_1_Drive | Strong |

Analog Clocks 510

| Name | Value |
|---|---|
| AnalogClock_0_Select |  |
| AnalogClock_1_Select |  |
| AnalogColumn_Clock_0 | 24VI |
| AnalogColumn_Clock_1 | 24VI |
| AnalogColumn_Clock_2 | 24VI |
| AnalogColumn_Clock_3 | 24VI |

Analog Input MUX 511

| Name | Value |
|---|---|
| AnalogColumn_InputMUX_0 | Port_0_1 |
| AnalogColumn_InputMUX_1 | Port_0_4 |
| AnalogColumn_InputMUX_2 | Port_0_5 |
| AnalogColumn_InputMUX_3 | Port_0_0 |

FIGURE 5D

Analog Buffer Output 512

| Name | Value |
|---|---|
| AnalogOutBuf_0 | OFF |
| AnalogOutBuf_1 | OFF |
| AnalogOutBuf_2 | OFF |
| AnalogOutBuf_3 | OFF |

Global Register Values 514

| Name | Address | Value |
|---|---|---|
| AnalogClockSelect | 161 | 0 |
| AnalgoColumnClockSelect | 160 | 0 |
| AnalogColumnInputSelect | 60 | 28 |
| AnalogIOControl | 162 | 0 |
| AnalogModulatorControl | 163 | 0 |
| AnalogReferenceControl | 63 | 5 |
| AnalogSyncControl | 65 | 0 |
| DecimatorControl | 36 | 0 |
| OscillatorControl_1 | 1e1 | 40 |
| Port_0_Bypass | 2 | 4 |
| Port_0_DriveMode_0 | 100 | 0 |
| Port_0_DriveMode_1 | 101 | 4 |
| Port_1_Bypass | 6 | 2 |
| Port_1_DriveMode_0 | 104 | 2 |
| Port_1_DriveMode_1 | 105 | 0 |
| Port_2_Bypass | A | 0 |
| Port_2_DriveMode_0 | 108 | 0 |
| Port_2_DriveMode_1 | 109 | 0 |
| Port_3_Bypass | E | 0 |
| Port_3_DriveMode_0 | 10c | 0 |
| Port_3_DriveMode_1 | 10d | 0 |
| Port_4_Bypass | 12 | 0 |
| Port_4_DriveMode_0 | 110 | 0 |
| Port_4_DriveMode_1 | 111 | 0 |
| Port_5_Bypass | 16 | 0 |
| Port_5_DriveMode_0 | 114 | 0 |
| Port_5_DriveMode_1 | 115 | 0 |
| VoltageMonitorControl | 1e3 | 84 |

FIGURE 5E

SYSTEM AND METHOD FOR DYNAMICALLY GENERATING A CONFIGURATION DATASHEET

FIELD OF THE INVENTION

Embodiments of the present invention relate to the field of programming environments for configurable integrated circuits. More particularly, embodiments of the present invention relate to a method for generating configuration datasheets for the integrated circuit being configured.

BACKGROUND ART

Traditionally, integrated circuit design and fabrication have involved the efforts of a team of people in producing a finished part. Design, prototyping, testing and final productization have usually required more than one iteration, and the design task has been largely separated functionally and temporally, from the process of final documentation. Device data would typically be collected from various sources and transferred to an individual such as a technical writer, who would prepare a device datasheet. Among the sources of the data would be a designer, manually compiling a list of data.

The advent of programmable integrated circuits and computer-aided design (CAD) tools has reduced the number of individuals required to carry a concept from design to productization. The development of the integrated design environment (IDE) has made it possible for individual engineers to configure a programmable integrated circuit.

The IDE has made it feasible for a single designer to configure sophisticated integrated circuits with dozens of pins and many possible inputs and outputs. An example of such integrated circuits is the programmable microcontroller. A programmable microcontroller may include a microprocessor, memory, and digital and other programmable hardware resources. The number of pins and possible signals significantly increase the amount of information required to document the final product. Manual compilation of data by a designer is tedious and prone to error.

Although many tasks have been efficiently combined into current integrated design environments, the task of final documentation has not. Final layout and generation of a product datasheet still requires the transfer of data to an external capability, and manual compilation and editing, e.g., using a word processor and/or other document editor. This required data transfer increases the chance for error and the time required to produce a datasheet.

SUMMARY OF INVENTION

Accordingly, embodiments of the present invention provide a method and system for generating a datasheet from within a computer aided integrated circuit design environment. Embodiments of the present invention further include a database structure optimized for the production of graphics and textual output such as a datasheet.

A system and method for dynamically generating a project configuration datasheet are disclosed. In one embodiment, Module and device descriptions are stored in extensible markup language (XML) format. The IDE includes an XSL (extensible stylesheet language) stylesheet in one example. The module and device descriptions are combined with parameterization information as prescribed by the XSL stylesheet to automatically produce a project configuration report by computer processes. The project configuration report may be formatted in hypertext markup language (HTML) and may be rendered as a visual datasheet by a browser.

In an embodiment of the present invention, an integrated design environment for a programmable integrated circuit stores the descriptions of the modules and devices available for configuration by the designer in a database that is formatted with extensible markup language (XML). The parameterization information is combined with the module and device descriptions to automatically produce a project configuration report. This combination is performed using an extensible stylesheet language (XSL) stylesheet. XSL may be used to transform the XML data into an HTML (hypertext markup language) file that is then rendered by a browser.

Another embodiment of the present invention includes a computer system with a printer or a visual display or other document rendering mechanism that includes an integrated design environment (IDE) software application. Information concerning the modules and devices available to the designer is stored in an XML formatted database. In the course of developing a design, the design parameters are generated and linked to the devices and modules. The computer system also includes a stored XSL stylesheet that governs the transformation and formatting of the XML data. The computer system also includes a browser for rendering HTML as visual output, either to a display device or to a printer.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

FIGS. 3A, 3B, 3C, 3D, 3E, 3F and 3G show an example of portions of a database formatted in XML in accordance with an embodiment of the present claimed invention.

FIGS. 4A, 4B, 4C, 4D, 4E, 4F, 4G, 4H, and 4I illustrate an XSL stylesheet in accordance with an embodiment of the present claimed invention.

FIGS. 5A, 5B, 5C, 5D and 5E show a visual output datasheet in accordance with an embodiment of the present invention as rendered by a browser.

DESCRIPTION OF THE PREFERRED EMBODIMENTS

In the following detailed description of the present invention, a system and method for dynamically generated configuration datasheet; numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

NOTATION AND NOMENCLATURE

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the disclosure of the present invention, terms such as "processing" or "computing" or "calculating" or "computing" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system's registers or memories or other such information storage, transmission or display devices.

Figure 1A:
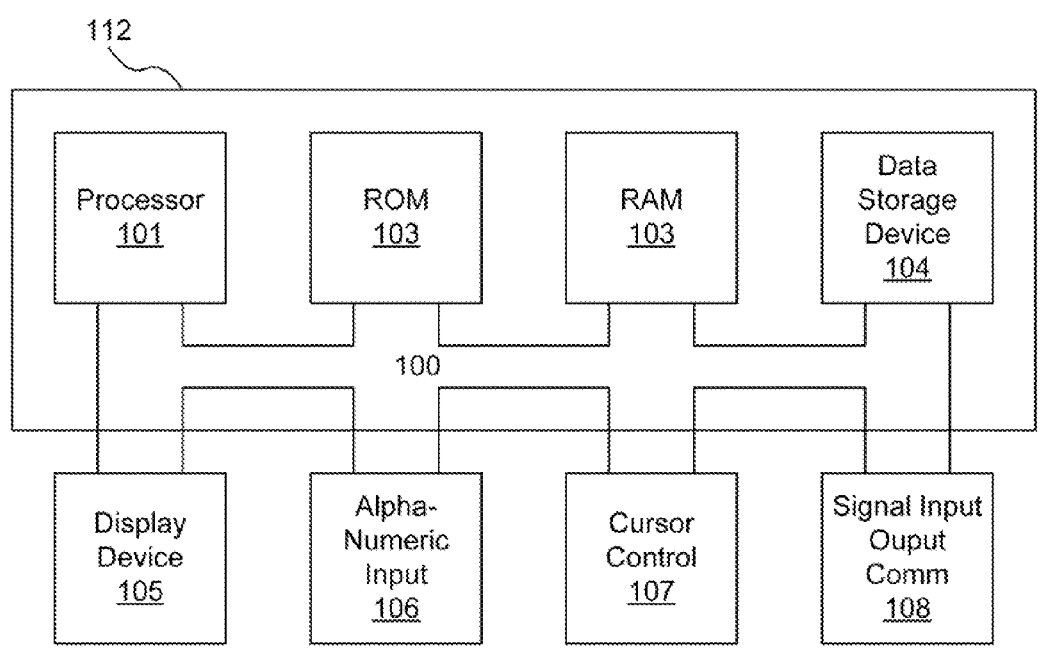
FIG. 1A is a diagram of a computer system portion of an environment in which embodiments of the present claimed invention may be practiced.

Refer to FIG. 1A which illustrates a computer system 112. In general, computer systems 112 used by the preferred embodiment of the present invention comprise a bus 100 for communicating information, a central processor 101 coupled with the bus for processing information and instructions, a random access memory 102 coupled with the bus 100 for storing information and instructions for the central processor 101, a read only memory 103 coupled with the bus 100 for storing static information and instructions for the processor 101, a data storage device 104 such as a magnetic or optical disk and disk drive coupled with the bus 100 for storing information and instructions, a display device 105 coupled to the bus 100 for displaying information to the computer user, an alphanumeric input device 106 including alphanumeric and function keys coupled to the bus 100 for communicating user input information and command selections to the central processor 101, cursor control device 107 coupled to the bus for communicating user input information and command selections to the central processor 101, and a communications port 108 coupled to the bus 100 communication with the system 112. The port 108 may be coupled to printer.

The display device 105 of FIG. 1A utilized with the computer system of the present invention may be a liquid crystal device, cathode ray tube or other display device suitable for creating graphic images and alphanumeric characters recognizable to the user. The cursor control device 107 allows the computer user to dynamically signal the two dimensional movement of a visible symbol (pointer) on a display screen of the display device 105. Many implementations of the cursor control device are known in the art including a trackball, mouse, joystick or special keys on the alphanumeric input device 105 capable of signaling movement of a given direction or manner of displacement. It is to be appreciated that the cursor means 107 also may be directed and/or activated via input from the keyboard using special keys and key sequence commands. Alternatively, the cursor may be directed and/or activated via input from a number of specially adapted cursor directing devices.

The computer system 112 of FIG. 1A may be used with an integrated design environment (IDE). An example of an IDE is PSOC DESIGNER software, available from Cypress MicroSystems, Inc., Bothell Washington. The PSOC DESIGNER integrated design environment contains three subsystems; a DEVICE EDITOR subsystem for configuring a target device, an APPLICATION EDITOR subsystem, and a DEBUGGER subsystem. The interface is split into several active windows that differ depending on which subsystem you are in.

Figure 1B:
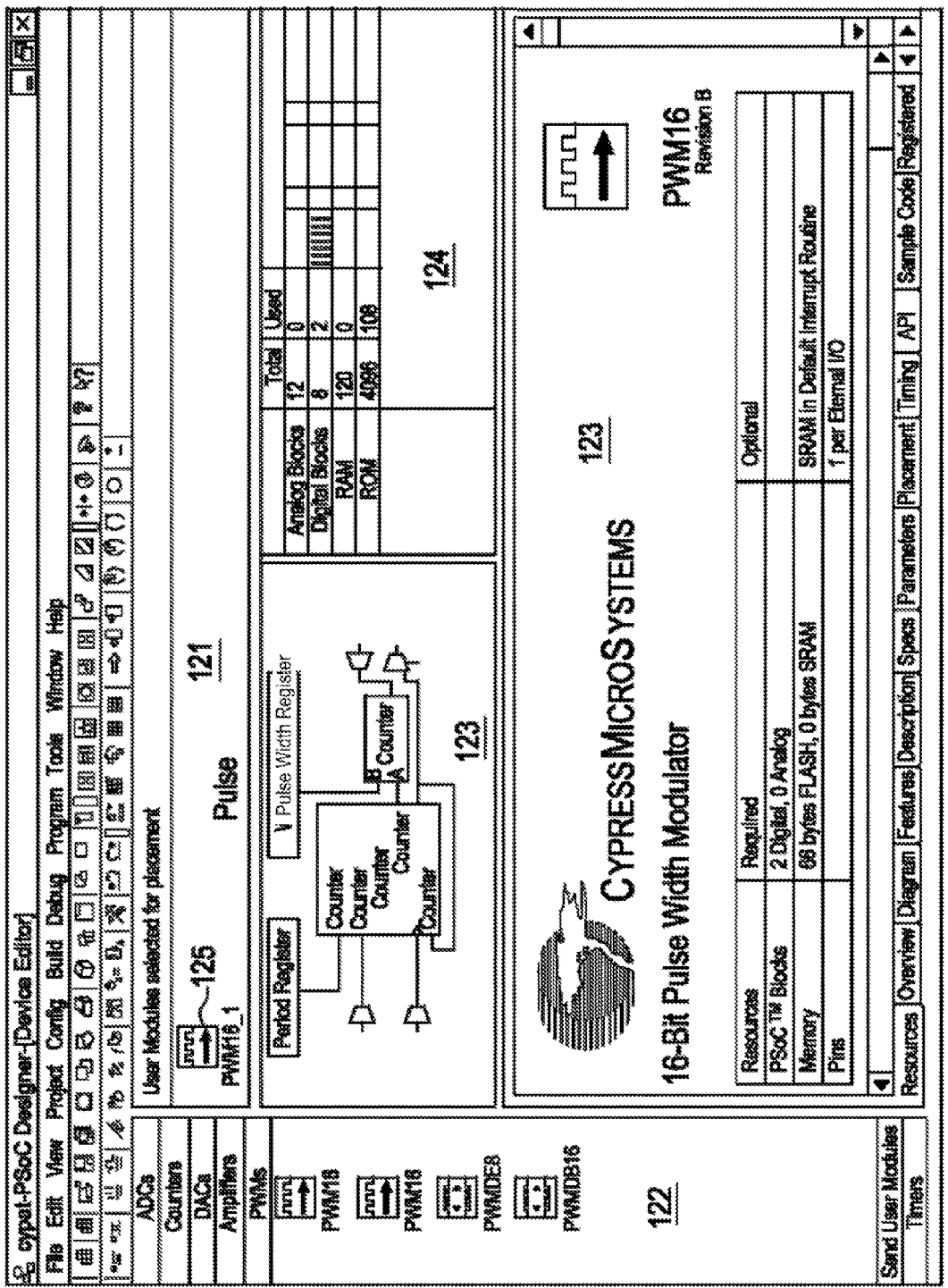
FIG. 1B shows a window of an integrated design environment used for user module selection in accordance with an embodiment of the present claimed invention.

The configuration subsystem of FIG. 1B is used for selection, placement and configuration of User Modules. FIG. 1B shows a configuration interface 120 in selection mode. The configuration subsystem is the subsystem in which the bulk of datasheet information is generated. Shown in FIG. 1B are a User Module Selection Window 121, User Module Window 122, User Information Windows 123, and a Resource Manager Window 124.

In an embodiment of the invention a project begins with the selection of a target device such as the Cypress MicroSystems CY8C25122A microcontroller. The CY8C25122A is a member of the CY8C25xxx/26xxx family of PROGRAMMABLE SYSTEM ON A CHIP or PSOC microcontrollers that replaces many MCU-based system components with one single-chip, programmable device. A single PSOC microcontroller offers a fast core, Flash program memory, and SRAM data memory with configurable analog and digital peripheral blocks in a range of convenient pin-outs and memory sizes. The driving force behind this innovative product comes from user configurability of analog and digital arrays of configurable blocks. These blocks are analog and digital peripheral blocks that are customized by the placement and configuration of User Modules.

The configuration subsystem interface 120 is used to configure the target device. User Modules (represented by icons) may be selected from the User Module Window 122, which causes an icon to appear in the User Module Selection window 121. In this example a pulse width modulator PWM16_1 125 is shown as selected. Information regarding the PWM16_1 125 is shown in the User Information Windows 123. The Resource Manager Window shows the target device resources that are used by the PWM16_1.

Figure 1C:
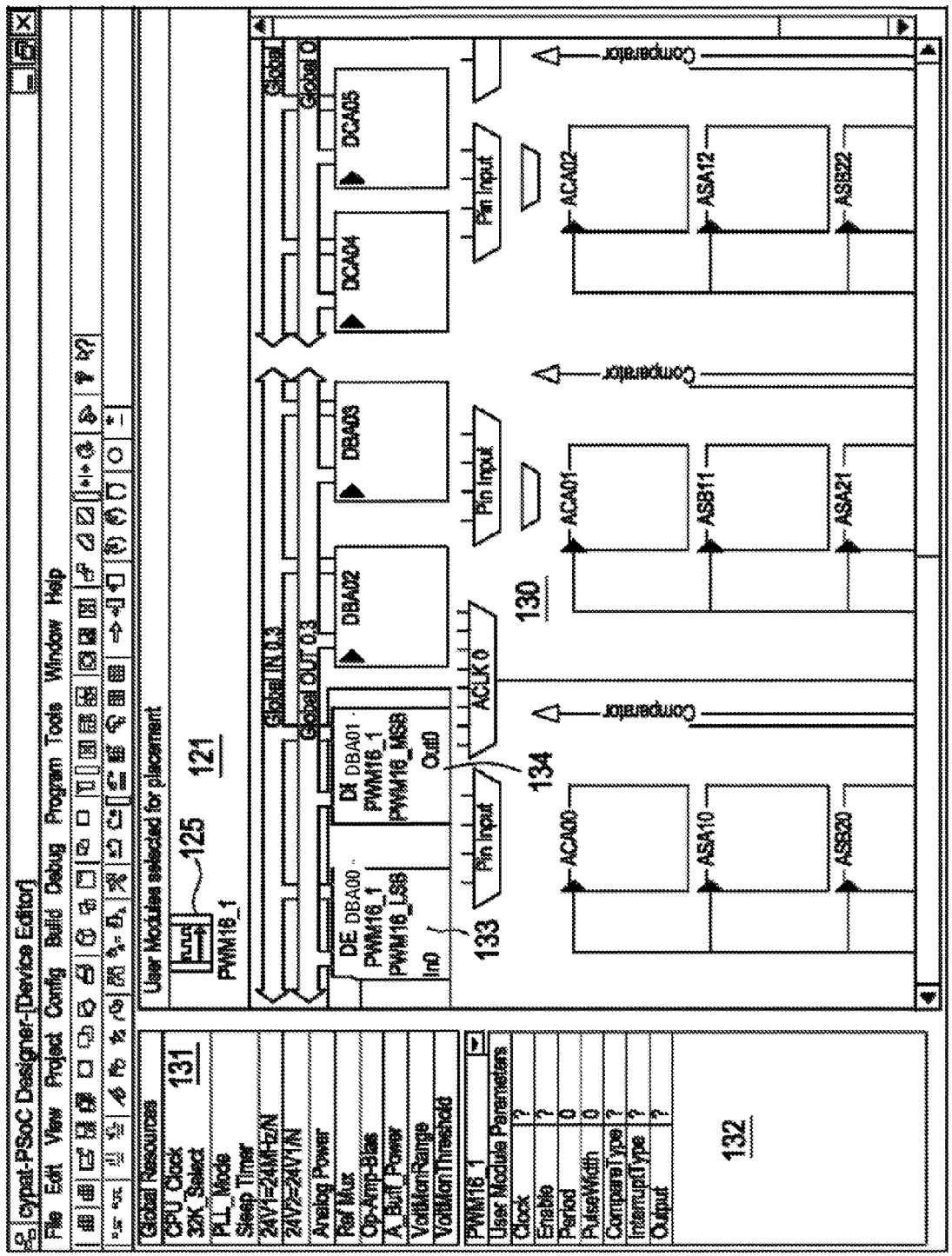
FIG. 1C shows a window of an integrated design environment used for user module placement in accordance with an embodiment of the present claimed invention.

FIG. 1C shows the configuration interface 120 in placement mode, with a Placement Window 130, a Global Resources Window 131, and a User Module Parameters Window 132. User Modules shown in the User Module Selection window 121 are placed in the Placement Window 130. The placement of the PWM16_1 125 is indicated by the two digital blocks 133 and 134 shown in the Placement Window 130. Parameters and resources shown in the Global Resources Window 131 and User Module Parameters Window 132 are available for configuration by the designer.

Figure 1D:
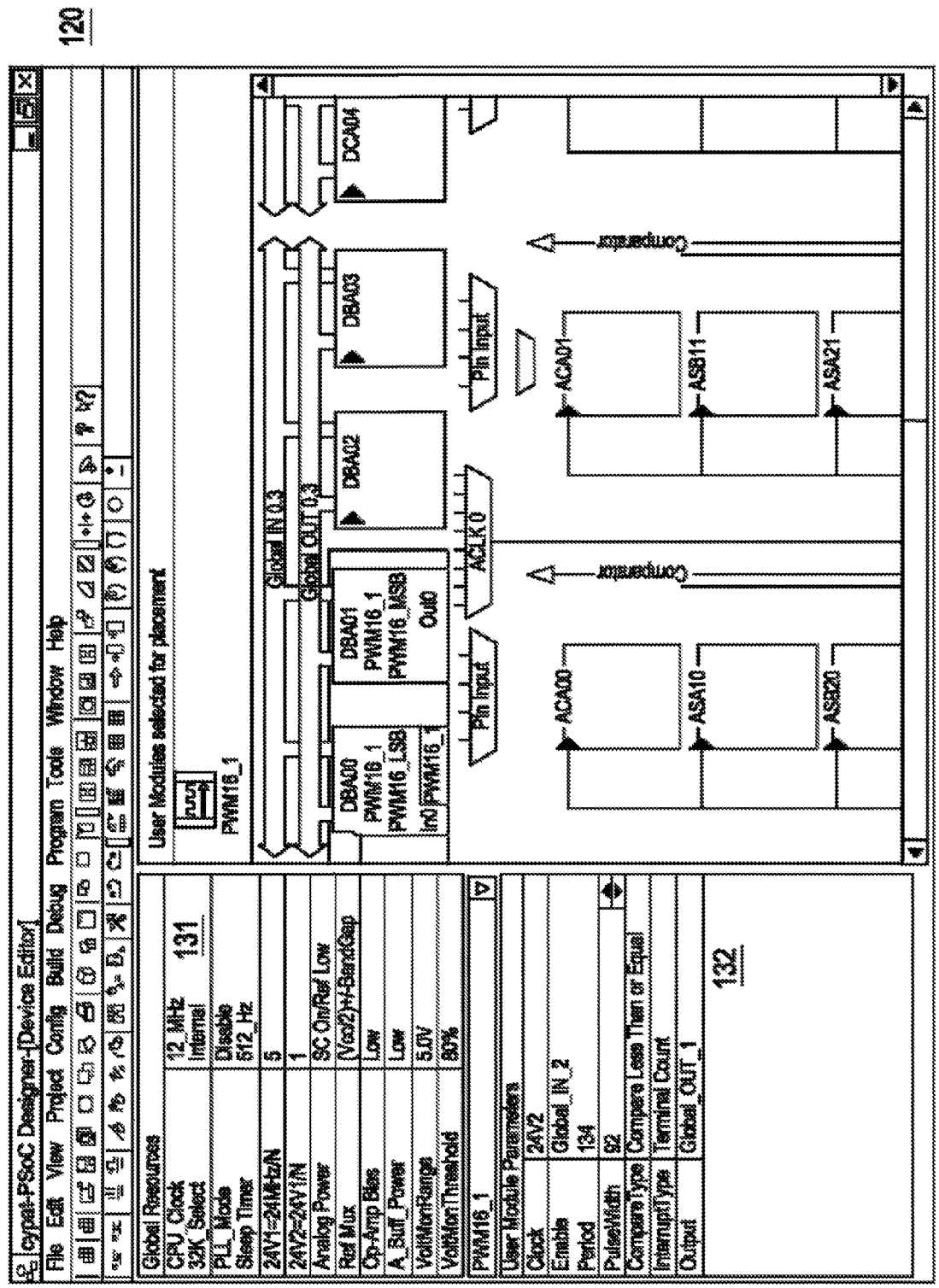
FIG. 1D shows integrated design environment window used for specification of module parameters and global resources in accordance with an embodiment of the present claimed invention.

FIG. 1D shows the configuration interface 120 with expanded Global Resources Window 131 and User Module Parameter Window in which resources and parameters have been set. For example, in the Global Resources Window 131, the CPU_Clock has been set with a frequency of 12 MHz and the Sleep Timer has been set with a frequency of 512 Hz. In the User Module Parameters Window the period has been set at 134 and the Pulse Width has been set at 92. The values entered by the designer, in addition to default values, are stored in an XML formatted database.

Figure 1E:
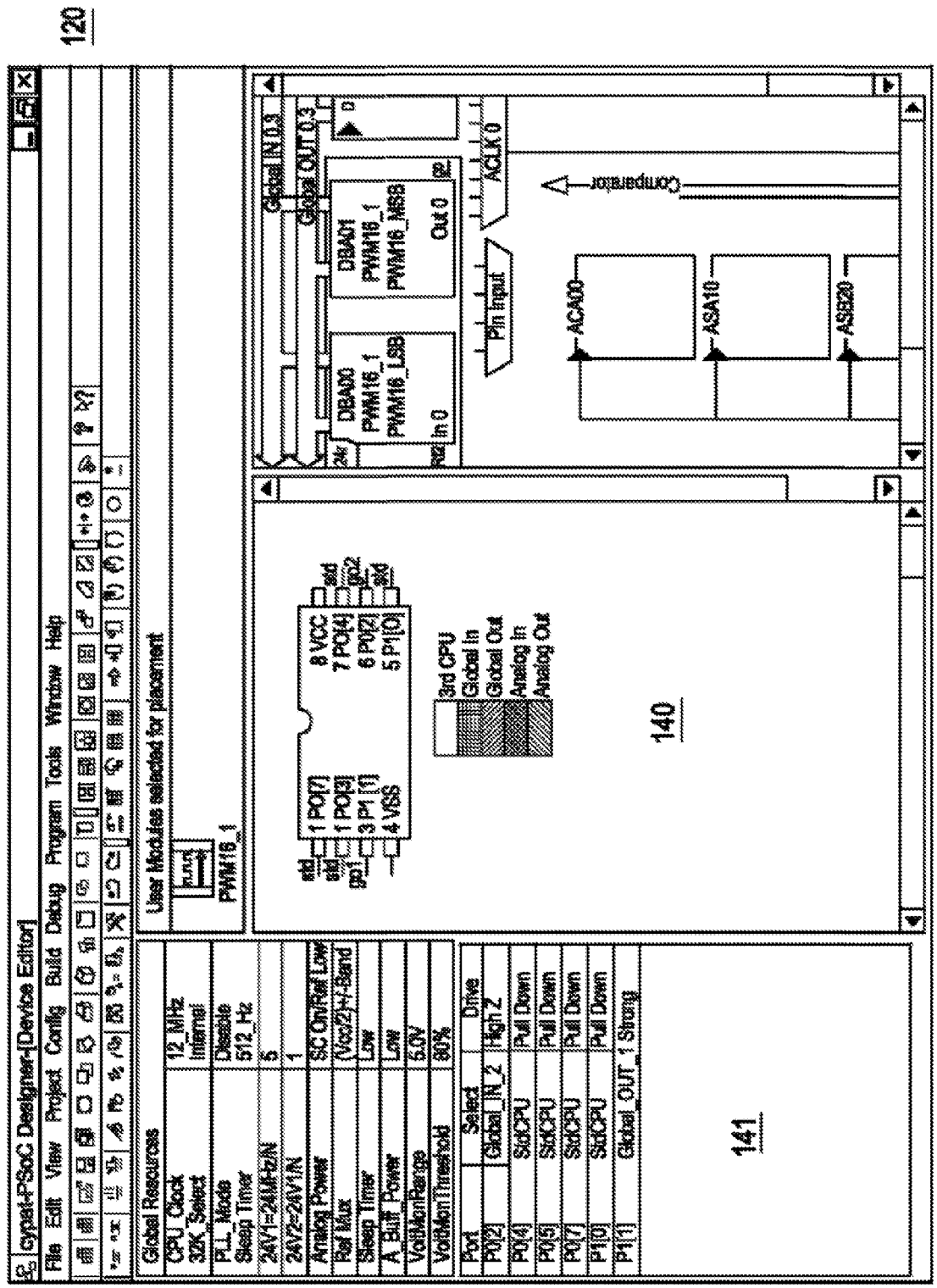
FIG. 1E shows a window of an integrated design environment used for specifying device pinout in accordance with an embodiment of the present claimed invention.

FIG. 1E shows a configuration interface of an integrated design environment used for deploying module connections. Interconnections can be specified on the device in the placement mode of the configuration subsystem. User Module interconnections consist of connections to surrounding configurable blocks, output bus, input bus, internal system clocks and references, external pins, and analog output buffers. Multiplexers may also be configured to route signals throughout the block architecture.

Referring again to FIG. 1E, a Pinout Window 140 and a Pinout Parameters Window 141 are shown. The Pinout window includes a diagram of the pin layout of the target device (e.g., the Cypress MicroSystems CY8C25122A). The Pinout Window accepts input specifying the connections for the configurable blocks to the pins. In this example, there is only one User Module present, and thus there are no interconnections specified between multiple User Modules. Typically, there may be multiple User Modules with designer specified interconnects which would be stored in the project database. Some interconnects are designer specified, whereas others are generated automatically (e.g., the interconnection of configurable blocks of a selected User Module.)

Figure 2A:
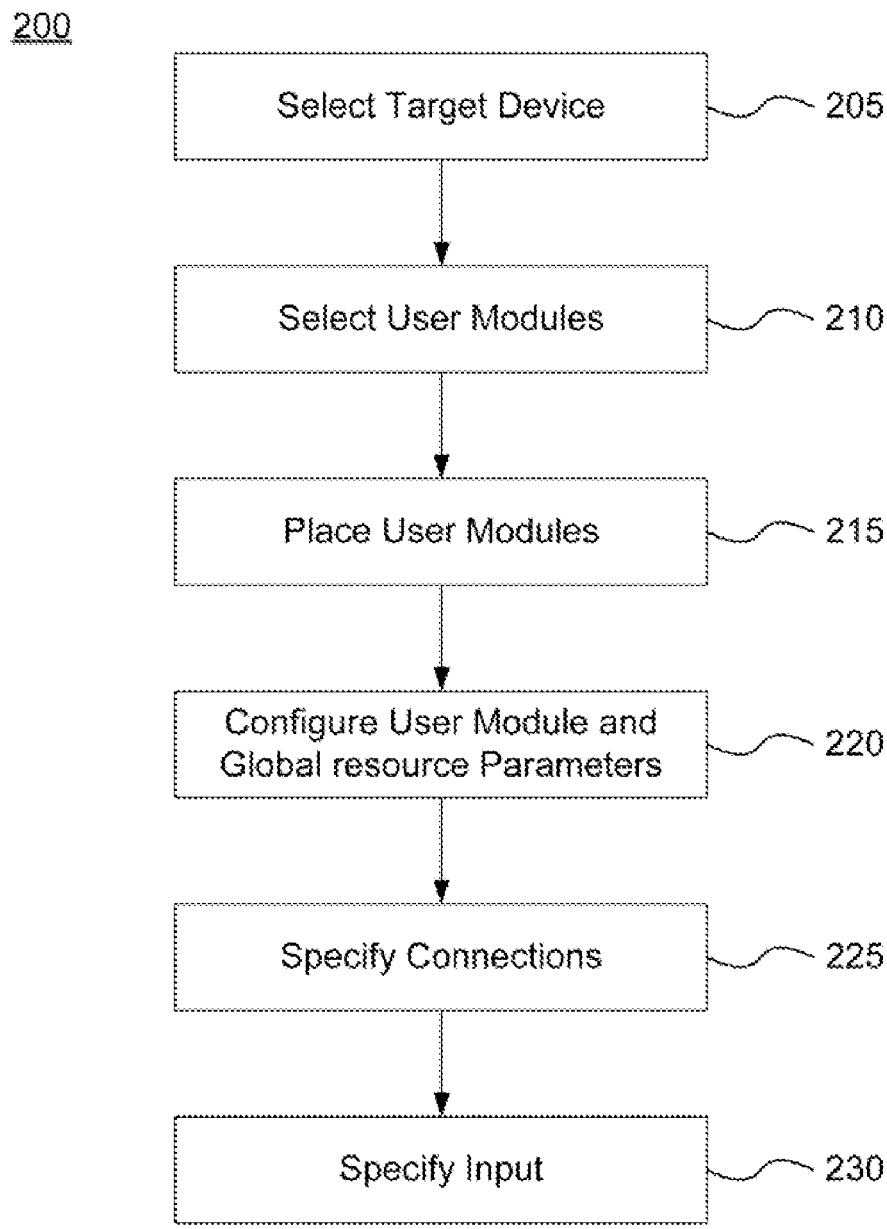
FIG. 2A shows a flow chart for the generation of project configuration data in accordance with an embodiment of the present claimed invention.

FIG. 2A shows a flow chart 200 for the generation of data for a project configuration datasheet in accordance with an embodiment of the present claimed invention. This generation of data may be performed with system similar to that referred to in FIGS. 1A through 1E.

In step 205, a target device is selected. An integrated design environment may be dedicated to a single device, in which case the selection is automatic. Otherwise, the selection is made by a user.

In step 210, User Modules representing circuit designs are selected. The circuit designs represented by the User Modules correspond to combinations of analog and digital blocks available on the target device. The blocks are part of a plurality of programmable hardware resources.

In step 215, the User Modules are placed. The placement of the User Modules is done in accordance with the allowable combinations available for the blocks. Since redundant blocks may be available, more than one possible combination may be allowed.

In step 220, the User Module and Global Resource parameters are selected. Parameters are typically selected by the designer from allowable values and may or may not have defaults established by the design environment.

In step 225, connections between User Modules is specified. If more than one User Module is present, the designer may specify interconnections between the modules.

In step 230, the pinout connections are specified. In this step, the connections between the circuit blocks on the target device and the physical pins of the package are established.

Figure 2B:
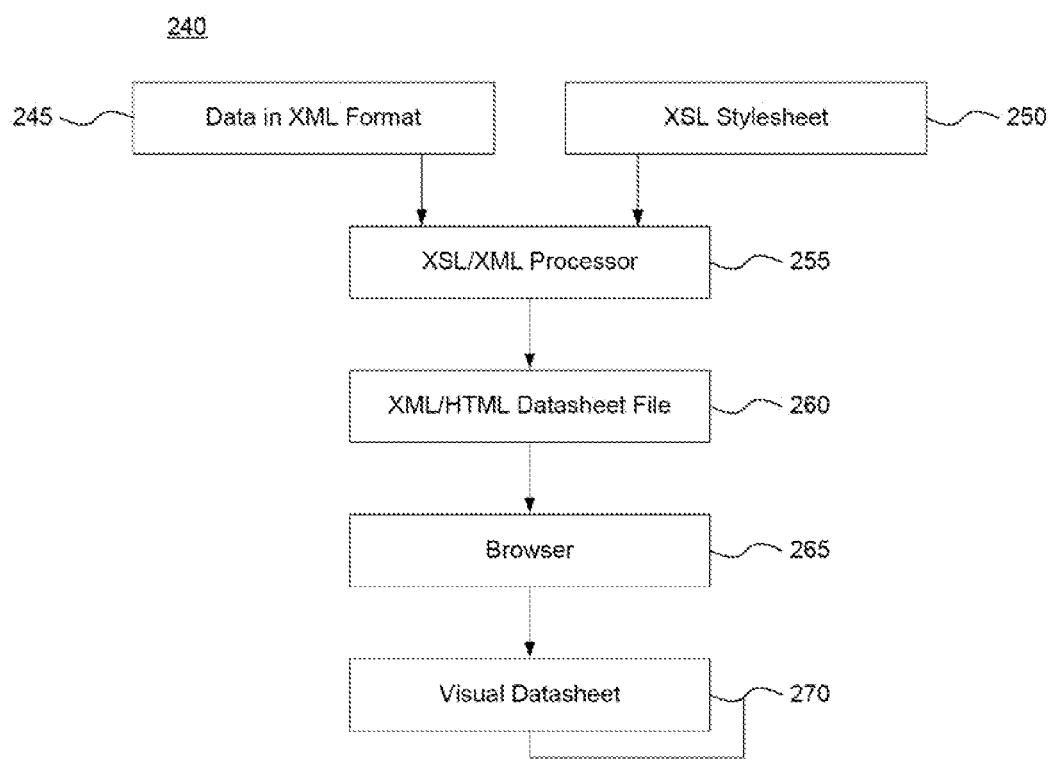
FIG. 2B shows a data flow diagram for the generation of a datasheet in accordance with an embodiment of the present claimed invention.

FIG. 2B shows a flow chart 240 for the automatic generation of a project configuration datasheet in accordance with an embodiment of the present claimed invention.

Project data 245 is obtained from a database that is formatted in an extensible markup language (XML). In conventional design environments, information is typically stored in structures that emphasize accessibility and compact storage. In the present invention, XML is used to facilitate the visual rendering of information. The XML formatted database is adapted to accept the parameter values as determined by the designer, and thus a complete descriptive file of parameter names and values is available in XML format.

Generally, Extensible Markup Language (XML) can be used as a human-readable, machine-understandable, general syntax for describing hierarchical data. XML documents are made up of storage units called entities, which contain either parsed or unparsed data. Parsed data is made up of characters, some of which form the character data in the document, and some of which form markup. Markup encodes a description of the document's storage layout and logical structure. XML provides a mechanism to impose constraints on the storage layout and logical structure. A software module called an XML processor is used to read XML documents and provide access to their content and structure.

The XML formatted database can accommodate in its tree structure any project information generated by the activities of the designer.

In the data flow diagram 240 of FIG. 2B, An XSL stylesheet 250 is selected as input to an XSL/XML processor 255, along with project configuration data in XML format 245. The project configuration data in XML format 245 may be data generated by the process shown in FIG. 2A. Generally, a stylesheet describes rules for presenting a class of XML source documents and is expressed in extensible stylesheet language (XSL). XSL is composed of a language for transforming XML documents and an XML vocabulary for specifying formatting semantics. An XSL stylesheet specifies the presentation of a class of XML documents (e.g., user module data) by describing how an instance of the class is transformed into an XML document that uses the formatting vocabulary.

The XSL stylesheet 250 and XML formatted data 245 are processed by an XSL/XML processor 255 to produce a project datasheet file 260. The XSL/XML processor applies the instructions of the stylesheet 250 to the XML formatted data 245. The combination of a XSL stylesheet and the XML data is called a project datasheet file (or configuration report). The project datasheet file 260 contains all of the information necessary for visual presentation of the XML data as well as elements provided by the XSL stylesheet (e.g., graphics images.) There are two aspects of the presentation process. First, a result tree is constructed from the XML source tree, that is, a tree transformation is carried out. Tree transformation allows the structure of the result tree to be significantly different from the source tree.

A browser 265 may be used to render the project datasheet file 260 as a visible datasheet 270. An example of visual rendering is the use of a browser to display the project datasheet 260 on a display device or have it printed on a printer. XSL is capable of transforming XML to HTML. A browser such as NETSCAPE NAVIGATOR or MICROSOFT INTERNET EXPLORER may be used to render a visual datasheet 270 from the datasheet file 260. It should be noted that the datasheet file (or configuration report) 260 is an electronic embodiment of the present invention, and that the rendered output 270 is a visual embodiment.

FIGS. 3A through 3G show an example of a portion of a database formatted in XML in accordance with an embodiment of the present claimed invention. The XML formatted data can be associated with a device such as the Cypress MicroSystems CY8C25122A PSOC microcontroller and a computer aided design system, e.g., Cypress MicroSystems PSOC DESIGNER integrated design environment. The part includes a microprocessor, memory, digital blocks, analog blocks, and 8 pins (6 I/O pins). Examples of the data that may be included in the database are pin-out information, schematics, connectivity, parameters, block information, and signal information. Hardware suitable for use with the present invention is described in a U.S. patent application titled "Programmable Microcontroller Architecture," by W. Snyder, filed on Oct. 22, 2001; the whole of which is incorporated herein by reference. Additionally, an environment in which the present invention may be practiced is described in U.S. patent application Ser. Nos. 09/972,003 (filed Oct. 5, 2001), No. 09/972,133 (filed Oct. 5, 2001), and No. 09/972,319; which are incorporated herein by reference.

The hierarchical nature of the PSOC microcontroller architecture is well suited to representation in an XML formatted database, and the XML formatted data is readily available as a direct result of the design activity. The data that serves as the basis for the automatic generation of a datasheet does not require an exceptional overhead or a specialized processor.

In the example of FIGS. 3A through 3G, the description and parameters associated with a design project having a single user module, a PWM16, is shown.

FIG. 3A shows the User Module List 31 in which the registers associated with the PWM16 are specified. FIGS. 3B through 3E show parameter and resource values (e.g., the selectable values for the Global Resources shown in the Global Resources Window 131 of FIG. 1D corresponding to FIG. 3B.) Some Global Resource values, such as the Reserved Resource list of FIGS. 3B through 3F may not be user selectable. FIG. 3G shows the pinout data 32 associated with the user selections made through the Design Editor interface of FIG. 1E.

FIGS. 4A through 4I illustrate an XSL stylesheet in accordance with an embodiment of the present claimed invention. Unlike HTML, element names in XML have no intrinsic presentation semantics. Without a stylesheet, a processor could not intelligibly present the XML data of FIGS. 3A through 3G. However, the use of XSL allows a single stylesheet to handle many different permutations of the XML data generated by a designer. Thus, it is possible to use a single stylesheet to handle all of the possible project datasheets, and just a few stylesheets are capable of providing considerable flexibility in the final output in terms of style and composition (e.g. substitution of color images for black and white in embedded images).

FIG. 4A shows the XSL used for formatting the appearance and alignment (font, size, weight, etc.) of the data associated with the Base Device (CY8C25122-24PI) specified in the XML data of FIG. 3A. Similarly, FIGS. 4B through 4I contain the instructions for transforming the remainder of the XML formatted data. In addition to the transformation of the data shown in FIGS. 3A through 3G, the stylesheet may add other elements to the output datasheet file. For example, the icon- .gif 41 and part.jpg 42 graphics files specified in FIG. 4B. A single stylesheet may be used to produce a wide array of output datasheet files by operating on different sets of XML formatted data.

FIGS. 5A through 5E show a visual output datasheet as rendered by a browser. From within an IDE, the visual output may be obtained by simply clicking on an icon (invoking a browser for the datasheet of the current project) or clicking on a datasheet file in a directory (associating the datasheet file type with the browser application). Either of these methods is referred to as a "single action datasheet display."

Since the project configuration data is stored in an XML formatted database, the overhead involved in creating a datasheet file using an XSL stylesheet is minimal. A datasheet file may be updated continuously and automatically with each configuration action performed by a designer.

Figure 5A:
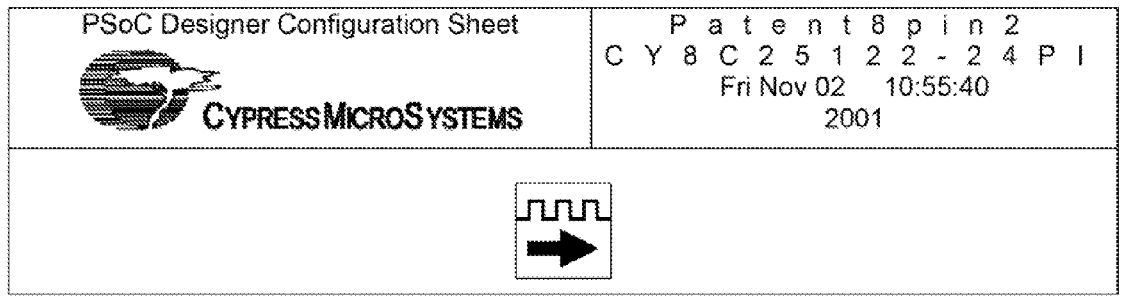

FIG. 5A shows a portion of the data provided by interaction with the configuration interface shown in FIGS. 1B through 1E. The Signal Pin Table 503 of FIG. 5A is produced from input to the Pinout Window 140 and the Pinout Parameters Window 141 of FIG. 1E. Similarly, the Selected Global Parameters table 505 of FIG. 5A originate from input provided using Global Resource Window 131 shown in FIG. 1D. Other user selected input appears in the Parameters table 507 of FIG. 5B and the Pin table 509 of FIG. 5D.

Figure 5B:
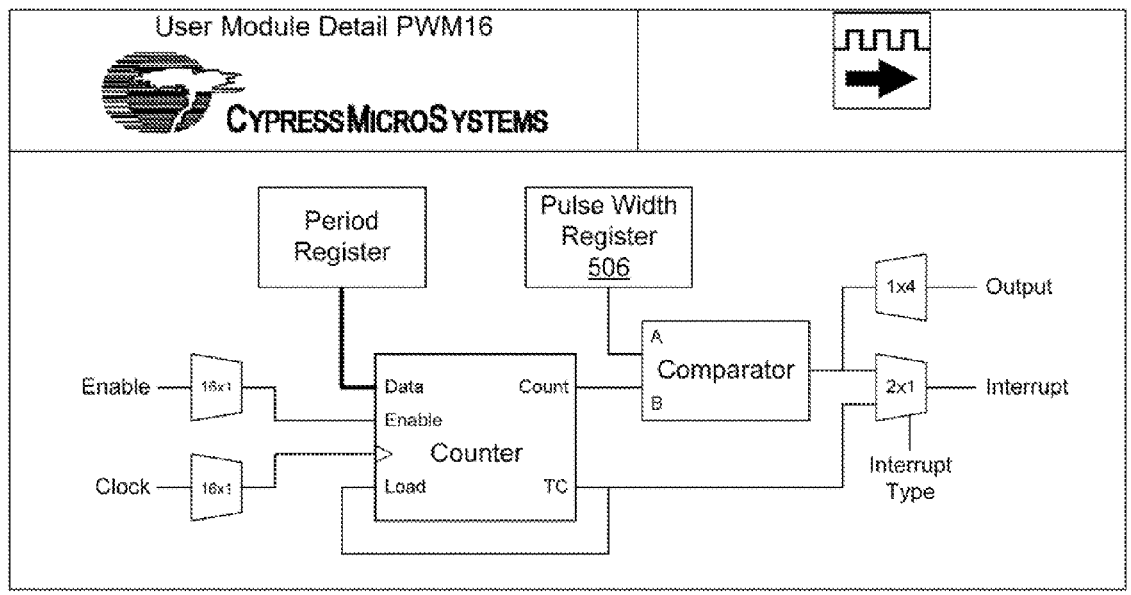

In addition to the user selected input, the visual output datasheet also includes graphics elements such as the PWM schematic 506 shown in FIG. 5B and the 25122PDIP outline 504 in the Signal Pin Table 503 of FIG. 5A. Other graphics elements are the logo 500 and icon 502 shown in FIG. 5A. Graphics elements may be retrieved on the basis of information referenced in the database, but are not necessarily a part of the database itself. A graphics image such as the "Cypress MicroSystems" logo 500 at the top of FIGS. 5A, 5B and 5D may be inserted by the stylesheet without reference to the XML formatted data.

The visual output datasheet also displays information not explicitly input using the configuration interface, such as the Blocks Table 508 of FIG. 5C and the Global Register Values table 513 in FIG. 5E. Other data tables that may be included are the Analog Clocks table 510 and Analog Input MUX table 511 of FIG. 5D, and the Analog Buffer Output table 512 of FIG. 5E. Also shown in FIG. 5A is a file information block 501, containing information regarding the generation of the datasheet file.

The XML formatted database and application of XSL stylesheets of the present invention are a further step in the integration of the overall product design effort. The task of producing visually descriptive information about a project or a product is automated by the application of XML to the fundamental data structures used in the design environment, and by the use of XSL to provide for the transformation of fundamental design data from the electronic state to a visually coherent presentation.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

The invention claimed is:

1. A method of generating a project datasheet file, said method comprising:
accessing data associated with a configuration of a manufactured programmable system on a chip;
accessing a stylesheet associated with project datasheets; and processing said data according to said stylesheet to automatically generate a project datasheet file, wherein said project datasheet file comprises pinout assignment data for said manufactured programmable system on a chip, and wherein said project datasheet file further comprises configuration information for at least one user module implemented in response to a user input and implemented using a block of said manufactured programmable system on a chip.

2. The method of claim 1, wherein said data is formatted in XML, wherein said stylesheet comprises an XSL stylesheet, and wherein said method further comprises:
formatting said project datasheet file in HTML; and
rendering said project datasheet file for display using a browser.

3. The method of claim 1, wherein said block is selected from a group consisting of an analog block and a digital block.

4. The method of claim 1, wherein said data is selected from a group consisting of pinout information, schematics, connectivity information, parameters, block information, and signal information.

5. The method of claim 1 further comprising:
displaying said project datasheet file, wherein said displaying comprises a single action display.

6. The method of claim 1, wherein said accessing said data comprises accessing said data from an XML database.

7. The method of claim 1, wherein said configuration information comprises information selected from a group consisting of user module parameters, block types, block locations, and global register values.

8. The method of claim 1 further comprising:
in response to a user-initiated change to said configuration of said manufactured programmable system on a chip, accessing updated data associated with said configuration of said manufactured programmable system on a chip; and
processing said updated data according to said stylesheet to automatically generate an updated project datasheet file.

9. The method of claim 8 further comprising:
in response to said processing, automatically displaying said updated project datasheet.

10. A computer system comprising a processor and a memory, wherein said memory comprises instructions that when executed on said processor implement a method of generating a project datasheet file, said method comprising:
accessing data associated with a configuration of a manufactured programmable system on a chip, wherein said data is formatted in XML;
accessing a stylesheet associated with project datasheets; and
processing said data according to said stylesheet to automatically generate a project datasheet file, wherein said project datasheet file comprises pinout assignment data for said manufactured programmable system on a chip, and wherein said project datasheet file further comprises configuration information for at least one user module implemented in response to a user input and implemented using a block of said programmable system on a chip.

11. The computer system of claim 10, wherein said data is formatted in XML, wherein said stylesheet comprises an XSL stylesheet, and wherein said method further comprises:
formatting said project datasheet file in HTML; and
rendering said project datasheet file for display using a browser.

12. The computer system of claim 10, wherein said block is selected from a group consisting of an analog block and a digital block.

13. The computer system of claim 10, wherein said data is selected from a group consisting of pinout information, schematics, connectivity information, parameters, block information, and signal information.

14. The computer system of claim 10, wherein said method further comprises:
displaying said project datasheet file, wherein said displaying comprises a single action display.

15. The computer system of claim 10, wherein said configuration information comprises information selected from a group consisting of user module parameters, block types, block locations, and global register values.

16. The computer system of claim 10, wherein said method further comprises:
in response to a user-initiated change to said configuration of said manufactured programmable system on a chip, accessing updated data associated with said configuration of said manufactured programmable system on a chip;
processing said updated data according to said stylesheet to automatically generate an updated project datasheet file; and
in response to said processing, automatically displaying said updated project datasheet.

17. A computer readable medium comprising executable instructions which, when executed in a processing system, causes the system to perform a method of generating a project datasheet file, said method comprising:
accessing data associated with a configuration of a manufactured programmable system on a chip,
accessing a stylesheet associated with project datasheets;
processing said data according to said stylesheet to automatically generate a project datasheet file, wherein said project datasheet file comprises pinout assignment data for said manufactured programmable system on a chip, and wherein said project datasheet file further comprises configuration information for at least one user module implemented in response to a user input and implemented using a block of said manufactured programmable system on a chip.

18. The computer readable medium of claim 17, wherein said block is selected from a group consisting of an analog block and a digital block.

19. The computer readable medium of claim 17, wherein said data is selected from a group consisting of pinout information, schematics, connectivity information, parameters, block information, and signal information.

20. The computer readable medium of claim 17, wherein said method further comprises:
displaying said project datasheet file, wherein said displaying comprises a single action display.

21. The computer readable medium of claim 17, wherein said configuration information comprises information selected from a group consisting of user module parameters, block types, block locations, and global register values.

22. The computer readable medium of claim 17, wherein said method further comprises:

in response to a user-initiated change to said configuration of said manufactured programmable system on a chip, accessing updated data associated with said configuration of said manufactured programmable system on a chip;

processing said updated data according to said stylesheet to automatically generate an updated project datasheet file; and in response to said processing, automatically displaying said updated project datasheet.

* * * * *